(12) United States Patent
Donofrio et al.

(10) Patent No.: US 11,024,501 B2
(45) Date of Patent: Jun. 1, 2021

(54) CARRIER-ASSISTED METHOD FOR PARTING CRYSTALLINE MATERIAL ALONG LASER DAMAGE REGION

(71) Applicant: Cree, Inc., Durham, NC (US)

(72) Inventors: Matthew Donofrio, Raleigh, NC (US); John Edmond, Durham, NC (US); Hua-Shuang Kong, Cary, NC (US); Elif Balkas, Cary, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 16/274,045

(22) Filed: Feb. 12, 2019

(65) Prior Publication Data

US 2020/0211850 A1 Jul. 2, 2020

Related U.S. Application Data

(60) Provisional application No. 62/786,335, filed on Dec. 29, 2018, provisional application No. 62/803,333, filed on Feb. 8, 2019.

(51) Int. Cl.
*C30B 33/02* (2006.01)
*H01L 21/18* (2006.01)
(Continued)

(52) U.S. Cl.
CPC ........ *H01L 21/187* (2013.01); *B23K 26/0006* (2013.01); *H01L 21/0242* (2013.01); *H01L 21/2007* (2013.01); *C30B 33/02* (2013.01)

(58) Field of Classification Search
CPC ......... C30B 25/00; C30B 25/02; C30B 25/10; C30B 25/105; C30B 25/18; C30B 29/00;
(Continued)

(56) References Cited

U.S. PATENT DOCUMENTS 3,105,623 A 10/1963 Hobbs
3,112,850 A 12/1963 Garibotti
(Continued)

FOREIGN PATENT DOCUMENTS

CN 101400475 A 4/2009
CN 107170668 A 9/2017
(Continued)

OTHER PUBLICATIONS

Brewer Science product literature for BrewerBOND 220 wafer bonding material dated Aug. 27, 2014. (Year: 2014).*
(Continued)

*Primary Examiner* — Kenneth A Bratland, Jr.
(74) *Attorney, Agent, or Firm* — Withrow & Terranova, P.L.L.C.; Vincent K. Gustafson

(57) ABSTRACT

A method for removing a portion of a crystalline material (e.g., SiC) substrate includes joining a surface of the substrate to a rigid carrier (e.g., >800 μm thick), with a subsurface laser damage region provided within the substrate at a depth relative to the surface. Adhesive material having a glass transition temperature above 25° C. may bond the substrate to the carrier. The crystalline material is fractured along the subsurface laser damage region to produce a bonded assembly including the carrier and a portion of the crystalline material. Fracturing of the crystalline material may be promoted by (i) application of a mechanical force proximate to at least one carrier edge to impart a bending moment in the carrier; (ii) cooling the carrier when the carrier has a greater coefficient of thermal expansion than the crystalline material; and/or (iii) applying ultrasonic energy to the crystalline material.

30 Claims, 18 Drawing Sheets

(51) Int. Cl.
*H01L 21/20* (2006.01)
*B23K 26/00* (2014.01)
*H01L 21/02* (2006.01)

(58) Field of Classification Search
CPC ......... C30B 29/02; C30B 29/04; C30B 29/06;
C30B 29/08; C30B 29/10; C30B 29/36;
C30B 29/38; C30B 29/40; C30B 29/64;
C30B 29/403; C30B 29/406; C30B 30/00;
C30B 30/06; C30B 33/00; C30B 33/02;
C30B 33/04; B81C 1/0088; B81C
1/00888; B81C 1/865; B32B 38/004;
B32B 37/12
USPC ... 117/84, 88–90, 92, 94, 97, 101, 103, 106,
117/108, 928, 930, 936–937, 939,
117/951–952
See application file for complete search history.

(56) References Cited

U.S. PATENT DOCUMENTS

| | | | |
|---|---|---|---|
| 3,970,819 A | 7/1976 | Gates et al. | |
| 4,224,101 A | 9/1980 | Tijburg et al. | |
| 5,597,767 A | 1/1997 | Mignardi et al. | |
| 5,761,111 A | 6/1998 | Glezer | |
| 5,786,560 A | 7/1998 | Tatah et al. | |
| 5,912,477 A | 6/1999 | Negley | |
| 5,916,460 A | 6/1999 | Imoto et al. | |
| 5,922,224 A | 7/1999 | Broekroelofs | |
| 5,968,382 A | 10/1999 | Matsumoto et al. | |
| 6,087,617 A | 7/2000 | Troitski et al. | |
| 6,555,781 B2 | 4/2003 | Ngoi et al. | |
| 6,958,093 B2 | 10/2005 | Vaudo et al. | |
| 6,992,026 B2 | 1/2006 | Fukuyo et al. | |
| 7,547,578 B2 | 6/2009 | Agarwal et al. | |
| 7,566,635 B2 | 7/2009 | Fujii et al. | |
| 7,592,237 B2 | 9/2009 | Sakamoto et al. | |
| 7,605,344 B2 | 10/2009 | Fukumitsu | |
| 7,608,214 B2 | 10/2009 | Kuno et al. | |
| 7,709,767 B2 | 5/2010 | Sakamoto | |
| 7,718,510 B2 | 5/2010 | Sakamoto et al. | |
| 7,749,867 B2 | 7/2010 | Fukuyo et al. | |
| 7,754,583 B2 | 7/2010 | Sakamoto | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 8,026,154 B2 | 9/2011 | Sakamoto | |
| 8,058,103 B2 | 11/2011 | Fukumitsu et al. | |
| 8,084,333 B2 | 12/2011 | Sakamoto | |
| 8,110,422 B2 | 2/2012 | Kumagai et al. | |
| 8,134,099 B2 | 3/2012 | Nakano et al. | |
| 8,138,450 B2 | 3/2012 | Sakamoto et al. | |
| 8,188,404 B2 | 5/2012 | Sakamoto | |
| 8,247,311 B2 | 8/2012 | Sakamoto et al. | |
| 8,247,734 B2 | 8/2012 | Fukuyo et al. | |
| 8,263,479 B2 | 9/2012 | Fukuyo et al. | |
| 8,278,592 B2 | 10/2012 | Sakamoto | |
| 8,389,384 B2 | 3/2013 | Sakamoto et al. | |
| 8,436,273 B2 | 5/2013 | Sakamoto | |
| 8,513,567 B2 | 8/2013 | Osajima et al. | |
| 8,523,636 B2 | 9/2013 | Uchiyama | |
| 8,541,251 B2 | 9/2013 | Uchiyama | |
| 8,603,351 B2 | 12/2013 | Sakamoto et al. | |
| 8,604,383 B2 | 12/2013 | Kuno et al. | |
| 8,624,153 B2 | 1/2014 | Atsumi et al. | |
| 8,685,838 B2 | 4/2014 | Fukuyo et al. | |
| 8,722,516 B2 | 5/2014 | Yamada et al. | |
| 8,728,914 B2 | 5/2014 | Sakamoto et al. | |
| 8,735,770 B2 | 5/2014 | Kuno et al. | |
| 8,735,771 B2 | 5/2014 | Kuno et al. | |
| 8,755,107 B2 | 6/2014 | Sakamoto et al. | |
| 8,790,997 B2 | 7/2014 | Nakagawa et al. | |
| 8,816,245 B2 | 8/2014 | Iwaki et al. | |
| 8,828,306 B2 | 9/2014 | Uchiyama | |
| 8,828,891 B2 | 9/2014 | Sakamoto | |
| 8,890,026 B2 | 11/2014 | Uchiyama et al. | |
| 8,933,368 B2 | 1/2015 | Atsumi et al. | |
| 8,946,055 B2 | 2/2015 | Sakamoto et al. | |
| 8,950,217 B2 | 2/2015 | Iwaki et al. | |
| RE45,403 E | 3/2015 | Kumagai | |
| 8,969,752 B2 | 3/2015 | Fukumitsu et al. | |
| 8,980,445 B2 | 3/2015 | Leonard et al. | |
| 8,993,922 B2 | 3/2015 | Atsumi et al. | |
| 9,012,805 B2 | 4/2015 | Atsumi et al. | |
| 9,035,216 B2 | 5/2015 | Sugiura | |
| 9,076,855 B2 | 7/2015 | Sugiura | |
| 9,102,005 B2 | 8/2015 | Muramatsu et al. | |
| 9,200,381 B2 | 12/2015 | Leonard et al. | |
| 9,295,969 B2 | 3/2016 | Okuma et al. | |
| 9,302,410 B2 | 4/2016 | Shimoi et al. | |
| 9,481,051 B2 | 11/2016 | Hirata et al. | |
| 9,517,530 B2 | 12/2016 | Hirata et al. | |
| 9,764,420 B2 | 9/2017 | Hirata et al. | |
| 9,764,428 B2 | 9/2017 | Hirata et al. | |
| 9,789,565 B2 | 10/2017 | Hirata et al. | |
| 9,790,619 B2 | 10/2017 | Leonard et al. | |
| 9,868,177 B2 | 1/2018 | Hirata | |
| 9,878,397 B2 | 1/2018 | Hirata et al. | |
| 9,925,619 B2 | 3/2018 | Hirata et al. | |
| 10,155,323 B2 | 12/2018 | Hirata | |
| 10,201,907 B2 | 2/2019 | Hirata | |
| 10,357,851 B2 | 7/2019 | Nishino et al. | |
| 10,406,635 B2 | 9/2019 | Hirata | |
| 10,562,130 B1 | 2/2020 | Donofrio et al. | |
| 10,576,585 B1 | 3/2020 | Donofrio et al. | |
| 2001/0054606 A1 | 12/2001 | Weishauss et al. | |
| 2005/0048738 A1 | 3/2005 | Shaheen et al. | |
| 2010/0289189 A1 | 11/2010 | Lichtensteiger et al. | |
| 2011/0266261 A1 | 11/2011 | Nakano et al. | |
| 2011/0312115 A1 | 12/2011 | Kato | |
| 2012/0000415 A1* | 1/2012 | D'Evelyn | C30B 25/02 117/94 |
| 2012/0061356 A1 | 3/2012 | Fukumitsu | |
| 2012/0234808 A1 | 9/2012 | Nakano | |
| 2012/0234887 A1 | 9/2012 | Henley et al. | |
| 2014/0038392 A1 | 2/2014 | Yonehara et al. | |
| 2014/0087504 A1* | 3/2014 | Li | H01L 27/3251 438/34 |
| 2014/0197419 A1* | 7/2014 | Henley | C30B 29/406 257/76 |
| 2014/0251963 A1 | 9/2014 | Kawaguchi | |
| 2014/0360988 A1 | 12/2014 | Sato | |
| 2015/0075221 A1 | 3/2015 | Kawaguchi et al. | |
| 2015/0171045 A1* | 6/2015 | Berger | H01L 21/02002 257/744 |
| 2015/0174698 A1 | 6/2015 | Tajikara et al. | |
| 2015/0217399 A1 | 8/2015 | Tajikara et al. | |
| 2015/0217400 A1 | 8/2015 | Yamada | |
| 2015/0221816 A1 | 8/2015 | Tajikara et al. | |
| 2015/0298252 A1 | 10/2015 | Kawaguchi | |
| 2016/0016257 A1 | 1/2016 | Hosseini | |
| 2016/0039044 A1 | 2/2016 | Kawaguchi | |
| 2016/0045979 A1 | 2/2016 | Kawaguchi et al. | |
| 2016/0052083 A1 | 2/2016 | Kawaguchi et al. | |
| 2016/0052084 A1 | 2/2016 | Kawaguchi et al. | |
| 2016/0052085 A1 | 2/2016 | Kawaguchi et al. | |
| 2016/0052088 A1 | 2/2016 | Kawaguchi et al. | |
| 2016/0052090 A1 | 2/2016 | Tanigawa | |
| 2016/0074960 A1 | 3/2016 | Hirata et al. | |
| 2016/0158881 A1 | 6/2016 | Hirata et al. | |
| 2016/0158882 A1 | 6/2016 | Hirata et al. | |
| 2016/0158892 A1 | 6/2016 | Hirata et al. | |
| 2016/0189954 A1 | 6/2016 | Kong et al. | |
| 2016/0193690 A1 | 7/2016 | Hirata et al. | |
| 2016/0193691 A1* | 7/2016 | Hirata | B23K 26/53 225/2 |
| 2016/0197698 A1 | 7/2016 | Oxenlowe et al. | |
| 2016/0228983 A1 | 8/2016 | Hirata et al. | |
| 2016/0228984 A1 | 8/2016 | Hirata et al. | |
| 2016/0228985 A1 | 8/2016 | Hirata et al. | |
| 2016/0288250 A1 | 10/2016 | Hirata et al. | |
| 2016/0288251 A1 | 10/2016 | Hirata et al. | |
| 2016/0293397 A1 | 10/2016 | Hirata et al. | |

(56) References Cited

U.S. PATENT DOCUMENTS

| | | |
|---|---|---|
| 2016/0305042 A1 | 10/2016 | Hirata |
| 2016/0307763 A1 | 10/2016 | Hirata |
| 2016/0354862 A1 | 12/2016 | Hirata |
| 2016/0354863 A1 | 12/2016 | Hirata |
| 2017/0014944 A1 | 1/2017 | Hirata et al. |
| 2017/0015017 A1 | 1/2017 | Hirata |
| 2017/0025275 A1 | 1/2017 | Hirata et al. |
| 2017/0025276 A1 | 1/2017 | Hirata |
| 2017/0053829 A1 | 2/2017 | Hirata et al. |
| 2017/0053831 A1 | 2/2017 | Hirata et al. |
| 2017/0106476 A1 | 4/2017 | Sakamoto et al. |
| 2017/0113301 A1 | 4/2017 | Sakamoto et al. |
| 2017/0136572 A1 | 5/2017 | Hirata |
| 2017/0151627 A1 | 6/2017 | Hirata |
| 2017/0198411 A1 | 7/2017 | Hirata |
| 2017/0216973 A1 | 8/2017 | Sakamoto et al. |
| 2017/0291255 A1 | 10/2017 | Hirata |
| 2017/0301540 A1 | 10/2017 | Hashimoto et al. |
| 2017/0330800 A1 | 11/2017 | Beyer et al. |
| 2018/0043468 A1 | 2/2018 | Hirata |
| 2018/0056440 A1 | 3/2018 | Yamamoto et al. |
| 2018/0085851 A1 | 3/2018 | Hirata |
| 2018/0108568 A1 | 4/2018 | Wang et al. |
| 2018/0126484 A1 | 5/2018 | Richter et al. |
| 2018/0133834 A1 | 5/2018 | Beyer |
| 2018/0154543 A1 | 6/2018 | Hirata |
| 2018/0187332 A1 | 7/2018 | Powell et al. |
| 2018/0214976 A1 | 8/2018 | Iizuka et al. |
| 2018/0218896 A1 | 8/2018 | Hirata |
| 2018/0229331 A1 | 8/2018 | Hirata et al. |
| 2018/0243944 A1* | 8/2018 | Schilling ............... B28D 1/221 |
| 2018/0254223 A1 | 9/2018 | Hirata et al. |
| 2018/0290232 A1 | 10/2018 | Richter et al. |
| 2018/0308679 A1 | 10/2018 | Hirata |
| 2018/0354067 A1 | 12/2018 | Iizuka et al. |
| 2019/0001433 A1 | 1/2019 | Yamamoto |
| 2019/0006212 A1 | 1/2019 | Iizuka et al. |
| 2019/0019729 A1 | 1/2019 | Lichtensteiger et al. |
| 2019/0096746 A1 | 3/2019 | Drescher et al. |
| 2019/0148164 A1 | 5/2019 | Hirata et al. |
| 2019/0152019 A1 | 5/2019 | Hirata et al. |
| 2019/0160708 A1 | 5/2019 | Hinohara et al. |
| 2019/0160804 A1 | 5/2019 | Hinohara et al. |
| 2019/0181024 A1 | 6/2019 | Iizuka et al. |
| 2019/0221436 A1 | 7/2019 | Hirata |
| 2019/0304769 A1 | 10/2019 | Hirata et al. |
| 2019/0304800 A1 | 10/2019 | Yamamoto |

FOREIGN PATENT DOCUMENTS

| | | |
|---|---|---|
| EP | 1609558 A1 | 12/2005 |
| EP | 1707298 A1 | 10/2006 |
| EP | 2578349 A1 | 4/2013 |
| EP | 2230040 B1 | 5/2015 |
| EP | 2223770 B1 | 6/2015 |
| JP | H02179708 A | 7/1990 |
| JP | H04116848 A | 4/1992 |
| JP | 3408805 B2 | 5/2003 |
| JP | 3624909 B2 | 3/2005 |
| JP | 3626442 B2 | 3/2005 |
| JP | 3670267 B2 | 7/2005 |
| JP | 3751970 B2 | 3/2006 |
| JP | 3761565 B2 | 3/2006 |
| JP | 3761566 B2 | 3/2006 |
| JP | 3761567 B2 | 3/2006 |
| JP | 3822626 B2 | 9/2006 |
| JP | 3867003 B2 | 1/2007 |
| JP | 3867100 B2 | 1/2007 |
| JP | 3867101 B2 | 1/2007 |
| JP | 3867102 B2 | 1/2007 |
| JP | 3867103 B2 | 1/2007 |
| JP | 3867104 B2 | 1/2007 |
| JP | 3867105 B2 | 1/2007 |
| JP | 3867107 B2 | 1/2007 |
| JP | 3867108 B2 | 1/2007 |
| JP | 3867109 B2 | 1/2007 |
| JP | 3867110 B2 | 1/2007 |
| JP | 3869850 B2 | 1/2007 |
| JP | 3935186 B2 | 6/2007 |
| JP | 3935187 B2 | 6/2007 |
| JP | 3935188 B2 | 6/2007 |
| JP | 3935189 B2 | 6/2007 |
| JP | 3990710 B2 | 10/2007 |
| JP | 3990711 B2 | 10/2007 |
| JP | 4050534 B2 | 2/2008 |
| JP | 4095092 B2 | 6/2008 |
| JP | 4128204 B2 | 7/2008 |
| JP | 4142694 B2 | 9/2008 |
| JP | 4146863 B2 | 9/2008 |
| JP | 4167094 B2 | 10/2008 |
| JP | 4358502 B2 | 11/2009 |
| JP | 4409840 B2 | 2/2010 |
| JP | 4440582 B2 | 3/2010 |
| JP | 4463796 B2 | 5/2010 |
| JP | 4509573 B2 | 7/2010 |
| JP | 4509719 B2 | 7/2010 |
| JP | 4509720 B2 | 7/2010 |
| JP | 4527098 B2 | 8/2010 |
| JP | 4584607 B2 | 11/2010 |
| JP | 4659301 B2 | 3/2011 |
| JP | 4663952 B2 | 4/2011 |
| JP | 4664140 B2 | 4/2011 |
| JP | 4703983 B2 | 6/2011 |
| JP | 4732063 B2 | 7/2011 |
| JP | 4762458 B2 | 8/2011 |
| JP | 4837320 B2 | 12/2011 |
| JP | 4851060 B2 | 1/2012 |
| JP | 4964376 B2 | 6/2012 |
| JP | 5025876 B2 | 9/2012 |
| JP | 5037082 B2 | 9/2012 |
| JP | 5094337 B2 | 12/2012 |
| JP | 5094994 B2 | 12/2012 |
| JP | 5117806 B2 | 1/2013 |
| JP | 5122161 B2 | 1/2013 |
| JP | 5148575 B2 | 2/2013 |
| JP | 5177992 B2 | 4/2013 |
| JP | 2013126682 A | 6/2013 |
| JP | 5255109 B2 | 8/2013 |
| JP | 5269356 B2 | 8/2013 |
| JP | 2013154604 A | 8/2013 |
| JP | 2013157450 A | 8/2013 |
| JP | 2013157451 A | 8/2013 |
| JP | 2013157454 A | 8/2013 |
| JP | 2013157545 A | 8/2013 |
| JP | 5312761 B2 | 10/2013 |
| JP | 5322418 B2 | 10/2013 |
| JP | 5451238 B2 | 3/2014 |
| JP | 5468627 B2 | 4/2014 |
| JP | 2014156687 A | 8/2014 |
| JP | 2014156688 A | 8/2014 |
| JP | 2014156689 A | 8/2014 |
| JP | 2014156690 A | 8/2014 |
| JP | 2014156692 A | 8/2014 |
| JP | 5597051 B2 | 10/2014 |
| JP | 5597052 B2 | 10/2014 |
| JP | 5620553 B2 | 11/2014 |
| JP | 5670764 B2 | 2/2015 |
| JP | 5670765 B2 | 2/2015 |
| JP | 2015020187 A | 2/2015 |
| JP | 5771391 B2 | 8/2015 |
| JP | 5775312 B2 | 9/2015 |
| JP | 2015199071 A | 11/2015 |
| JP | 5844089 B2 | 1/2016 |
| JP | 5863891 B2 | 1/2016 |
| JP | 5864988 B2 | 2/2016 |
| JP | 5894754 B2 | 3/2016 |
| JP | 2016032828 A | 3/2016 |
| JP | 5905274 B2 | 4/2016 |
| JP | 5917862 B2 | 5/2016 |
| JP | 2017057103 A | 3/2017 |
| JP | 2017220631 A | 12/2017 |
| JP | 6355540 B2 | 7/2018 |
| JP | 2018-133484 A | 8/2018 |
| JP | 6366485 B2 | 8/2018 |

(56) References Cited

FOREIGN PATENT DOCUMENTS

| | | |
|---|---|---|
| JP | 6366486 B2 | 8/2018 |
| JP | 6418927 B2 | 11/2018 |
| JP | 6444207 B2 | 12/2018 |
| JP | 6494457 B2 | 4/2019 |
| JP | 2019102676 A | 6/2019 |
| JP | 2019161037 A | 9/2019 |
| JP | 2020021878 A | 2/2020 |
| JP | 2020027895 A | 2/2020 |
| JP | 2020031134 A | 2/2020 |
| JP | 2020035821 A | 3/2020 |
| JP | 2020035873 A | 3/2020 |
| JP | 2020047619 A | 3/2020 |
| JP | 2020072098 A | 5/2020 |
| JP | 2020088097 A | 6/2020 |
| JP | 2020092212 A | 6/2020 |
| KR | 100766727 B1 | 10/2007 |
| KR | 101073183 B1 | 10/2011 |
| KR | 101212875 B1 | 12/2012 |
| KR | 101282459 B1 | 7/2013 |
| KR | 101341675 B1 | 12/2013 |
| KR | 101408491 B1 | 6/2014 |
| KR | 20150021507 | 3/2015 |
| TW | 201243926 A | 11/2012 |
| TW | 201334902 A | 9/2013 |
| WO | 0032348 A1 | 6/2000 |
| WO | 0032349 A1 | 6/2000 |
| WO | 2018192689 A1 | 10/2018 |

OTHER PUBLICATIONS

Author Unknown, "Application Bulletin: Low-Temperature Performance of Silicone Elastomers," Electronics Solutions, 2003, Dow Corning Corporation, 8 pages.
Author Unknown, "Ceramics for Temperature," San Jose Delta, Inc. 2017, 3 pages.
Author Unknown, "Chapter 2: Thermal Expansion," ASM Ready Reference: Thermal Properties of Metals, 2002, ASM International, pp. 9-16.
Author Unknown, "Disco develops laser ingot slicing method to speed SiC wafer production and cut material loss," Semiconductor Today, Aug. 11, 2016, Juno Publishing and Media Solutions Ltd., 3 pages.
Author Unknown, "Disco's KABRA!zen fully automates KABRA laser slicing technology," Semiconductor Today, Dec. 11, 2017, Juno Publishing and Media Solutions Ltd., 3 pages.
Author Unknown, "Formation of Silicon and Gallium Arsenide Wafers," OpenStax CNX, accessed Dec. 17, 2018, Rice University, 15 pages.
Author Unknown, "IFTLE 171 Semicon Taiwan Part 3: Disco, Namics, Amkor," Insights from the Leading Edge Blog, Semiconductor Manufacturing & Design Community, accessed Dec. 17, 2018, 16 pages.
Author Unknown, "Supplementary Material (ESI) for Lab on a Chip," The Royal Society of Chemistry, 2007, 9 pages.
Author Unknown, "Technical Information: Stealth Dicing Technology and Applications," Hamamatsu, Mar. 2005, Hamamatsu Photonics K.K., 8 pages.
Author Uknown, "Tg—Glass Transition Temperature for Epoxies," Tech Tip 23, 2012, Epoxy Technology Inc., 2 pages.
Bedell, S.W. et al., "Fast Track Communication: Layer transfer by controlled spalling," Journal of Physics D: Applied Physics, vol. 46, Mar. 21, 2013, IOP Publishing Ltd., 7 pages.
Cree, "Cree Silicon Carbide Substrates and Epitaxy," Materials Catalogue, 1998-2013, Cree, Inc., 17 pages.
De Guire, M., "Introduction to Crystallography," Introduction to Materials Science & Engineering, 2006, pp. 4.1-4.15.
Friedmann, T. et al., "Laser Wafering for Silicon Solar," Sandia Report SAND2011-2057, Jan. 2011, Sandia National Laboratories, 23 pages.
Happich, J., "Twinning rather than thinning: yields 100µm-thin wafers in minutes: p. 2 of 2," eeNews Europe, Feb. 27, 2018, European Business Press SA, 1 page.
Kim, M. et al., "4H-SiC wafer slicing by using femtosecond laser double-pulses," Optical Materials Express, vol. 7, No. 7, Jul. 1, 2017, Optical Society of America, 11 pages.
Kim, M. et al., "Enhancement of the thermo-mechanical properties of PDMS molds for the hot embossing of PMMA microfluidic devices," Journal of Micromechanics and Microengineering, vol. 23, Aug. 28, 2013, IOP Publishing Ltd, 12 pages.
Nezu, T., "Laster Facilitates Production of SiC Wafers," XTECH, Aug. 18, 2016, Nikkei Business Publications, Inc., 4 pages.
Richter, J. et al., "COLD SPLIT Provides Significant Cost Advantages for SiC Substrates and Devices," Bodo's Power Systems: SiC Power Modules For a wide range of applications, Sep. 2017, 3 pages.
Wijesundara, M. et al., "Chapter 2: SiC Materials and Processing Technology," Silicon Carbide Microsystems for Harsh Environments, 2011, Springer, 64 pages.
Cao, B. et al., "In-Situ Real-Time Focus Detection during Laster Processing Using Double-Hole Masks and Advanced Image Sensor Software," Sensors, vol. 17, No. 7, Jul. 2017, MDPI, 13 pages.
Dunn, T. et al., "Metrology for Characterization of Wafer Thickness Uniformity During 3D-IC Processing," Corning Incorporated, retrieved May 9, 2019 from https://www.corning.com/media/worldwide/global/documents/semi%20Metrology%20for%20Characterization%20of%20Wafer%20Thickness%20Uniformity%20During%203D-IC%20Processing.pdf, 6 pages.
Author Unknown, "What is KABRA®?" DISCO Corporation, accessed Sep. 23, 2019 from http://www.discousa.com/kabra/index_eg.html#kabra_process, 7 pages.
Notice of Allowance for U.S. Appl. No. 16/274,064, dated Jul. 25, 2019, 14 pages.
Notice of Allowance for U.S. Appl. No. 16/410,487, dated Oct. 3, 2019, 9 pages.
Notice of Allowance for U.S. Appl. No. 16/274,064, dated Jun. 6, 2019, 12 pages.
International Search Report and Written Opinion for International Patent Application No. PCT/IB/2019/061409, dated Apr. 20, 2020, 17 pages.
Corrected Notice of Allowability for U.S. Appl. No. 16/415,721, dated Mar. 4, 2020, 4 pages.
International Search Report and Written Opinion for International Patent Application No. PCT/IB2019/061410, dated Oct. 5, 2020, 24 pages.
Invitation to Pay Additional Fees and Partial Search for International Patent Application No. PCT/IB2019/061410, dated Jun. 9, 2020, 11 pages.
Invitation to Pay Additional Fees and Partial Search for International Patent Application No. PCT/IB2019/061412, dated Jun. 17, 2020, 11 pages.
International Search Report and Written Opinion for International Patent Application No. PCT/IB2019/061412, dated Aug. 7, 2020, 21 pages.
International Search Report and Written Opinion for International Patent Application No. PCT/US2020/022626, dated Jul. 8, 2020, 17 pages.
Non-Final Office Action for U.S. Appl. No. 16/784,311, dated Aug. 20, 2020, 5 pages.
Notice of Allowance for U.S. Appl. No. 16/784,311, dated Oct. 21, 2020, 8 pages.
Notice of Allowance for U.S. Appl. No. 16/784,311, dated Feb. 18, 2021, 8 pages.
Non-Final Office Action for U.S. Appl. No. 16/792,261, dated Apr. 15, 2021, 7 pages.

* cited by examiner

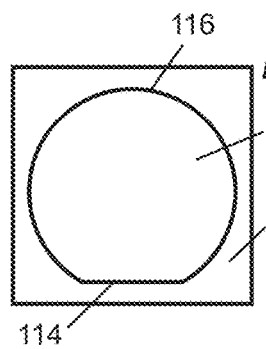
*FIG. 13A*
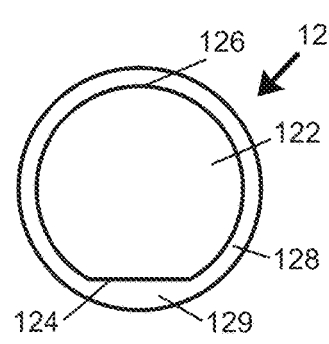
*FIG. 13B*
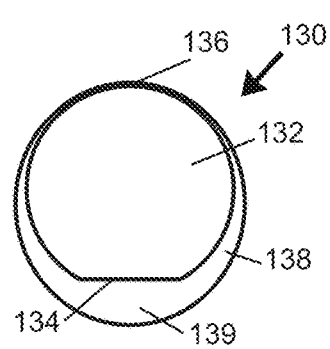
*FIG. 13C*
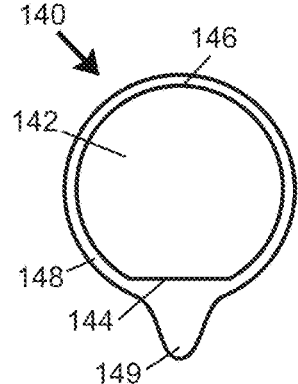
*FIG. 13D*
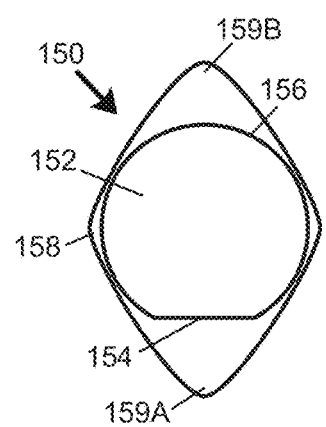
*FIG. 13E*
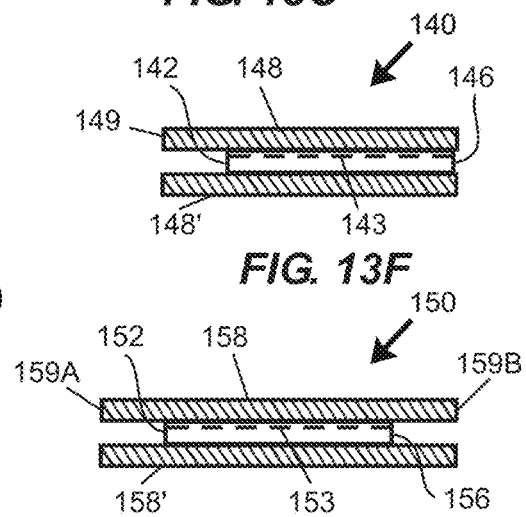
*FIG. 13F*
*FIG. 13G*
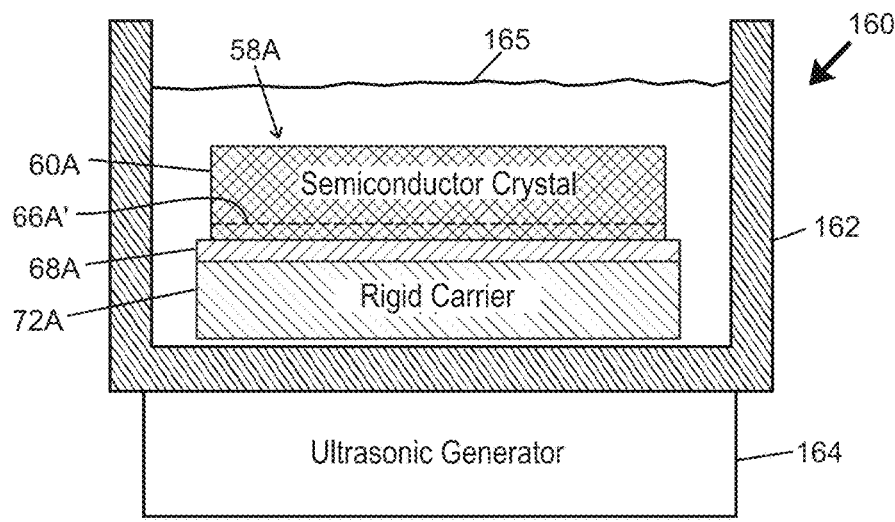
*FIG. 14*

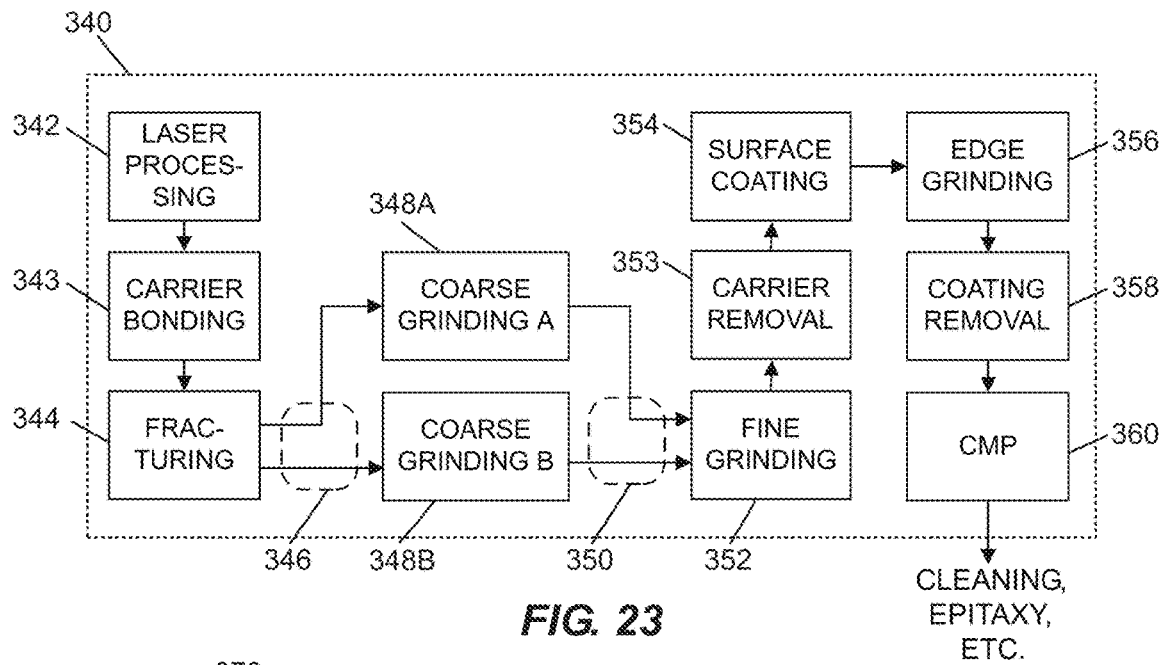
*FIG. 23*
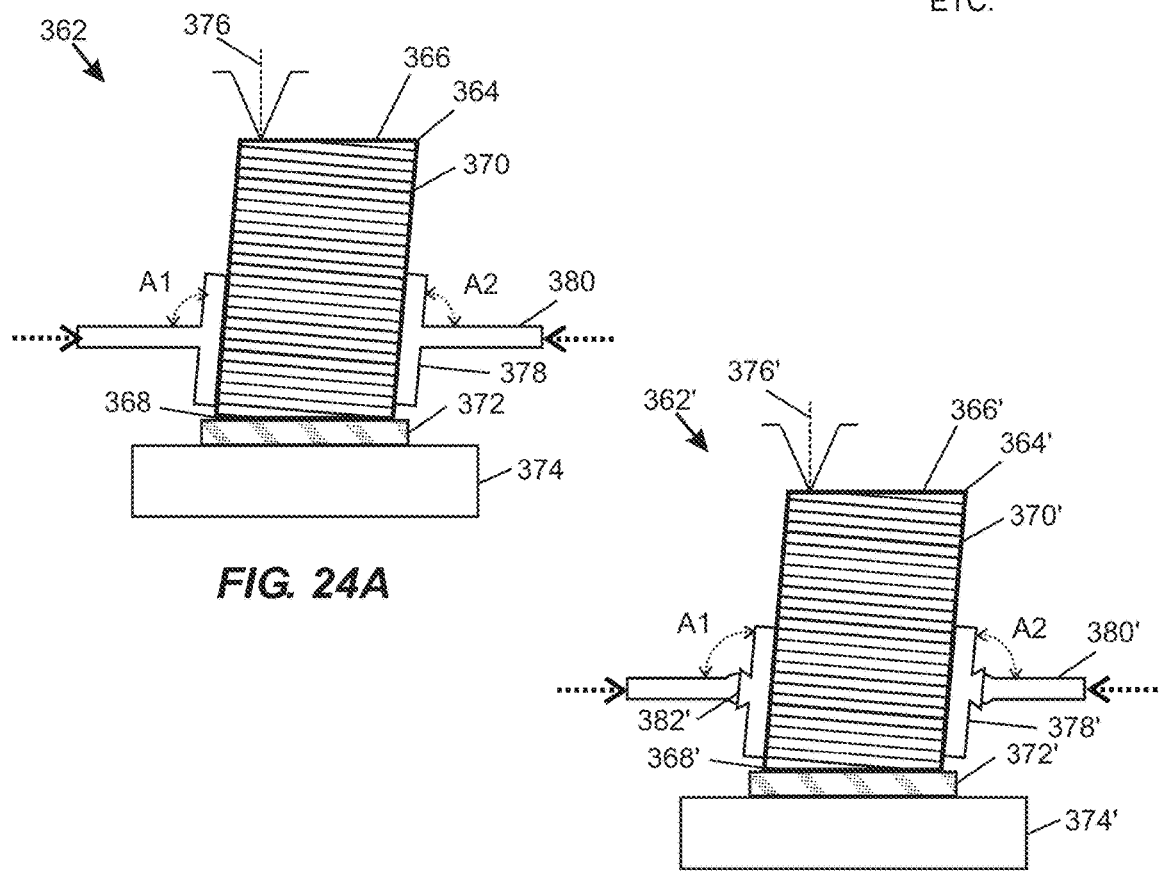
*FIG. 24A*
*FIG. 24B*

CARRIER-ASSISTED METHOD FOR PARTING CRYSTALLINE MATERIAL ALONG LASER DAMAGE REGION

STATEMENT OF RELATED APPLICATIONS

This application claims priority to U.S. Provisional Patent Application No. 62/786,335 filed on Dec. 29, 2018 and to U.S. Provisional Patent Application No. 62/803,333 filed on Feb. 8, 2019, wherein the entire disclosures of the foregoing applications are hereby incorporated by reference herein.

TECHNICAL FIELD

The present disclosure relates to methods for processing crystalline materials, and more specifically to carrier-assisted methods for parting or removing relatively thin layers of crystalline material from a substrate, such as a boule or a wafer, having a subsurface laser damage region therein.

BACKGROUND

Various microelectronic, optoelectronic, and microfabrication applications require thin layers of crystalline materials as a starting structure for fabricating various useful systems. Traditional methods for cutting thin layers (e.g., wafers) from large diameter crystalline ingots of crystalline materials have involved use of wire saws. Wire sawing technology has been applied to various crystalline materials, such as silicon, sapphire, and silicon carbide. A wire saw tool includes an ultra-fine steel wire (typically having a diameter of 0.2 mm or less) that is passed through grooves of one or many guide rollers. Two slicing methods exist, namely, loose abrasive slicing and fixed abrasive slicing. Loose abrasive slicing involves application of a slurry (typically a suspension of abrasives in oil) to a steel wire running at high speed, whereby the rolling motion of abrasives between the wire and the workpiece results in cutting of an ingot. Unfortunately, the environmental impact of slurry is considerable. To reduce such impact, a wire fixed with diamond abrasives may be used in a fixed abrasive slicing method that requires only a water-soluble coolant liquid (not a slurry). High-efficiency parallel slicing permits a large number of wafers to be produced in a single slicing procedure. FIG. 1 illustrates a conventional wire saw tool 1 including parallel wire sections 3 extending between rollers 4A-4C and arranged to simultaneously saw an ingot 2 into multiple thin sections (e.g., wafers 8A-8G) each having a face generally parallel to an end face 6 of the ingot 2. During the sawing process, the wire sections 3 supported by the rollers 4A-4C may be pressed in a downward direction 5 toward a holder 7 underlying the ingot 2. If the end face 6 is parallel to a crystallographic c-plane of the ingot 2, and the wire sections 3 saw through the ingot 2 parallel to the end face 6, then each resulting wafer 8A-8G will have an "on-axis" end face 6' that is parallel to the crystallographic c-plane.

It is also possible to produce vicinal (also known as offcut or "off-axis") wafers having end faces that are not parallel to the crystallographic c-plane. Vicinal wafers (e.g., of SiC) having a 4 degree offcut are frequently employed as growth substrates for high-quality epitaxial growth of other materials (e.g., AlN and other Group III nitrides). Vicinal wafers may be produced either by growing an ingot in a direction away from the c-axis (e.g., growing over a vicinal seed material) and sawing the ingot perpendicular to the ingot sidewalls), or by growing an ingot starting with an on-axis seed material and sawing the ingot at an angle to that departs from perpendicular to the ingot sidewalls.

Wire sawing of crystalline materials involves various limitations. Kerf losses based on the width of material removed per cut are inherent to saw cutting, and represent a significant loss of crystalline material. Wire saw cutting applies moderately high stress to wafers, resulting in non-zero bow and warp characteristics. Processing times for a single boule (or ingot) are very long, and events like wire breaks can increase processing times and lead to undesirable loss of material. Wafer strength may be reduced by chipping and cracking on the cut surface of a wafer. At the end of a wire sawing process, the resulting wafers must be cleaned of debris.

In the case of silicon carbide (SiC) having high wear resistance (and a hardness comparable to diamond and boron nitride), wire sawing may require significant time and resources, thereby entailing significant production costs. SiC substrates enable fabrication of desirable power electronic, radio frequency, and optoelectronic devices. SiC occurs in many different crystal structures called polytypes, with certain polytypes (e.g., 4H—SiC and 6H—SiC) having a hexagonal crystal structure.

FIG. 2 is a first perspective view crystal plane diagram showing the coordinate system for a hexagonal crystal such as 4H—SiC, in which the c-plane ((0001) plane, corresponding to a [0001] (vertical) direction of epitaxial crystal growth) is perpendicular to both the m-plane ((1$\bar{1}$00) plane) and the a-plane ((11$\bar{2}$0) plane), with the (1$\bar{1}$00) plane being perpendicular to the [1$\bar{1}$00] direction, and the (11$\bar{2}$0) plane being perpendicular to the [11$\bar{2}$0] direction. FIG. 3 is a second perspective view crystal plane diagram for a hexagonal crystal, illustrating a vicinal plane 9 that is non-parallel to the c-plane, wherein a vector 10 (which is normal to the vicinal plane 9) is tilted away from the [0001] direction by a tilt angle $\beta$, with the tilt angle $\beta$ being inclined (slightly) toward the [11$\bar{2}$0] direction. FIG. 4A is a perspective view wafer orientation diagram showing orientation of a vicinal wafer 11A relative to the c-plane ((0001) plane), in which a vector 10A (which is normal to the wafer face 9A) is tilted away from the [0001] direction by a tilt angle $\beta$. This tilt angle $\beta$ is equal to an orthogonal tilt (or misorientation angle)$\beta$ that spans between the (0001) plane and a projection 12A of the wafer face 9A. FIG. 4B is a simplified cross-sectional view of the vicinal wafer 11A superimposed over a portion of an ingot 14A (e.g., an on-axis ingot having an end face 6A parallel to the (0001) plane) from which the vicinal wafer 11A was defined. FIG. 4B shows that the wafer face 9A of the vicinal wafer 11A is misaligned relative to the (0001) plane by a tilt angle $\beta$.

FIG. 5 is a top plan view of an exemplary SiC wafer 25 including an upper face 26 (e.g., that is parallel to the (0001) plane (c-plane), and perpendicular to the [0001] direction) and laterally bounded by a generally round edge 27 (having a diameter D) including a primary flat 28 (having a length $L_F$) that is perpendicular to the (11$\bar{2}$0) plane, and parallel to the [11$\bar{2}$0] direction.

Due to difficulties associated with making and processing SiC, SiC device wafers have a high cost relative to wafers of various other crystalline materials. Typical kerf losses obtained from wire sawing SiC may be approximately 250 microns or more per wafer, which is quite significant considering that the wafers resulting from a wire sawing process may be roughly 350 microns thick and subsequently thinned (by grinding) to a final thickness of approximately 100 to 180 microns depending on the end use. It has been impractical to slice wafers thinner than about 350 microns considering wire sawing and device fabrication issues.

To seek to address limitations associated with wire sawing, alternative techniques for removing thin layers of crystalline material from bulk crystals have been developed. One technique called controlled spalling technology works by depositing a tensile stressor layer (e.g., nickel) on the surface of a substrate (e.g., Ge (0 0 1)), introducing a crack near the edge of the substrate, and mechanically guiding the crack (e.g., using a flexible handle layer, such as tape) as a single fracture front along the surface (see Bedell et al., J. Phys. D: Appl. Phys. 46 (2013)). However, such technique may result in application of very high stresses and excessive bowing of the removed layer. Another technique involving removal of a layer of silicon carbide from a larger crystal is described in Kim et al., "4H—SiC wafer slicing by using femtosecond laser double pulses," Optical Materials Express 2450, vol. 7, no. 7 (2017). Such technique involves formation of laser-written tracks by impingement of laser pulses on silicon carbide to induce subsurface damage, followed by adhesion of the crystal to a locking jig and application of tensile force to effectuate fracture along a subsurface damage zone. Use of the laser to weaken specific areas in the material followed by fracture between those areas reduces the laser scanning time. However, it is doubtful that the preceding fracture technique may be applied to reliably remove thin wafers from an ingot without breakage and/or may be scaled up to commercial volumes. Another technique known in the art for effectuating fracture along a laser-induced subsurface damage zone of a crystalline material involves application of ultrasonic energy to the crystalline material, but the reliability of such method for obtaining thin wafers (e.g., 350 microns or less) has been questioned, since ultrasonic fracturing requires a higher degree of laser damage and may result in higher wafer breakage rates when applied to thin wafers.

Another technique disclosed in U.S. Patent Application Publication No. 2010/0289189A1 includes applying a polymer layer (e.g., poly (dimethylsiloxane) (PDMS)) over a solid state material, and exposing the solid state material and polymer layer (initially at a temp no greater than 300° C.) to a temperature below room temperature (or a temperature below about −20° C.). Such cooling causes the polymer layer to contract, thereby inducing mechanical stress in the solid state material that cause the material to fracture along a plane at a depth in the material. PDMS is a crosslinked polymer, and its stiffness can be controlled by varying the crosslinking density (e.g., by altering weight ratio of curing agent to prepolymer, and by altering curing conditions). Even when efforts are undertaken to enhance its mechanical properties, Young's modulus values for PDMS have been reported in a range of less than about 4 MPa. See, e.g., Kim, et al., J. Micromech. Microeng. 23 (2013) 095024.

A further technique for removing thin layers of crystalline materials from bulk crystals is disclosed in U.S. Patent Application Publication No. 2018/0126484A1. Laser radiation is impinged on a solid state material to create a detachment zone or multiple partial detachment zones, followed by formation of a polymer receiving layer (e.g., PDMS) and cooling (optionally combined with high-speed rotation) to induce mechanical stresses that cause a thin layer of the solid state material to separate from a remainder of the material along the detachment zone(s).

One disadvantage of the techniques relying on polymer layer interfacial fracturing is that the resulting wafers may exhibit undesirably high levels of bowing. Another disadvantage of techniques relying on polymer layer interfacial fracturing is that it can require significant time (e.g., 30 minutes or more) to apply and cure the polymer layer on the solid state material, and additional time to remove the polymer material from the resulting wafer. Another limitation of techniques requiring polymer layers is that such polymer layers may not be suitable for withstanding subsequent wafer processing steps that may require precise dimensioning.

Yet another technique for removing thin layers of crystalline materials from bulk crystals is disclosed in U.S. Patent Application Publication No. 2018/0243944A1. Laser radiation is impinged on a donor substrate in order to specify a crack course, a carrier substrate (i.e., having a thickness of less than 800 microns) is bonded to the donor substrate via a bonding layer, a stress-producing layer (e.g., PDMS layer) is provided on the carrier substrate, and the stress-producing layer is thermally loaded (i.e., cooled with a coolant, particularly liquid nitrogen) to transmit stress through the carrier substrate and bonding layer to produce stresses in the donor substrate to trigger a crack that is propagated on the crack course to remove the solid layer (and carrier substrate bonded thereto) from the donor substrate. The donor substrate and the carrier substrate preferably consist of the same material, but may consist of different materials. The limited maximum thickness of the carrier substrate appears to be necessary to enable propagation of stress from the stress-producing layer to the donor substrate. One limitation of the foregoing technique is that it requires at least three layers to be provided over the donor substrate. Another limitation is that the technique appears to be limited to thermal-induced cooling at very low (e.g., liquid nitrogen) temperatures. Still another limitation is that the maximum thickness of the carrier substrate cannot exceed 800 microns, thereby potentially limiting the rigidity of a bonded assembly following separation from the donor substrate. Yet another limitation is that re-use of the carrier substrate would require removal of residual materials of different compositions (i.e., bonding layer material and stress-producing layer material) from opposing faces thereof.

Accordingly, the art continues to seek improved methods for parting or removing relatively thin layers of crystalline material from a substrate that address issues associated with conventional methods.

SUMMARY

The present disclosure relates in various aspects to crystalline material processing methods involving the joining of a carrier (e.g., a rigid carrier) to a surface of a crystalline material having subsurface laser damage at a non-zero depth relative to the surface, followed by fracturing the crystalline material along the subsurface laser damage region. Such fracturing yields a bonded assembly including the carrier and a portion of the crystalline material removed from the substrate. The fracturing is performed without need for a separate stress-producing layer arranged over the carrier. The foregoing steps may be repeated for sequential removal of thin layers of crystalline material from an ingot to form wafers. In certain embodiments, the carrier may be crystalline in character. In certain embodiments, the rigid carrier may be joined to a surface of the crystalline material by adhesive bonding, the rigid carrier may have a thickness of greater than 800 microns, and the rigid carrier may have a modulus of elasticity of at least 20 GPa (or another threshold disclosed herein). In certain embodiments, the adhesive material has a glass transition temperature $T_g$ of greater than 25° C. (or another threshold specified herein). The portion of the crystalline material removed from the substrate, which may embody a wafer, is available to be subjected to further processing steps while the portion remains part of the bonded assembly. In certain embodiments, first and second rigid carriers may be bonded to opposing faces of a substrate prior to fracturing. In certain implementations, fracturing of the crystalline material may be promoted by (i) application of a mechanical force (e.g., optionally localized at one or more points) proximate to at least one edge of the carrier, to impart a bending moment in at least a portion of the carrier; (ii) cooling the carrier in instances in which the carrier has a greater coefficient of thermal expansion than the crystalline material; and/or (iii) application of ultrasonic energy to the crystalline material.

In one aspect, the disclosure relates to a crystalline material processing method comprising temporarily bonding a rigid carrier to a surface of crystalline material with an intervening adhesive material, wherein the crystalline material comprises a substrate having a subsurface laser damage region at a depth relative to a first surface of the substrate, and wherein the adhesive material has a glass transition temperature $T_g$ of greater than 25° C. (or another threshold specified herein). The method further comprises fracturing the crystalline material along or proximate to the subsurface laser damage region to yield a bonded assembly comprising the rigid carrier, the adhesive material, and a portion of the crystalline material removed from the substrate.

In certain embodiments, the adhesive material comprises a thermoplastic material. In certain embodiments, the adhesive material has a glass transition temperature $T_g$ of at least 35° C., at least 50° C., at least 60° C., or another threshold specified herein.

In certain embodiments, the adhesive material has a Shore D durometer value of at least about 70 when the adhesive material is at 25° C. In certain embodiments, the adhesive material has a modulus of elasticity of at least about 7 MPa when the adhesive material is at 25° C.

In certain embodiments, the rigid carrier has a thickness of greater than 800 microns. In certain embodiments, the rigid carrier has a modulus of elasticity of at least 20 GPa, at least 100 GPa, or another threshold specified herein. In certain embodiments, the rigid carrier comprises a crystalline material.

In certain embodiments, the rigid carrier comprises a first face and a second face that opposes the first face; the adhesive material is arranged in contact with the first face; and the second face is devoid of any adhesive material and devoid of any stress-producing material.

In certain embodiments, a coefficient of thermal expansion (CTE) of the rigid carrier is greater than a CTE of the substrate at 25° C. In certain embodiments, the fracturing comprises cooling at least the rigid carrier to promote fracture of the crystalline material along or proximate to the subsurface laser damage region.

In certain embodiments, the fracturing comprises application of ultrasonic energy to at least one of the rigid carrier or the substrate.

In certain embodiments, at least one of a maximum length or maximum width of at least a portion of the rigid carrier exceeds a corresponding maximum length or maximum width of the substrate. In certain embodiments, the substrate comprises a notch or flat along at least one edge of the substrate, and at least a portion of the at least one edge of the rigid carrier extends laterally beyond the notch or flat. In certain embodiments, the fracturing comprises applying a mechanical force proximate to at least one edge of the rigid carrier, and wherein the mechanical force is configured to impart a bending moment in at least a portion of the rigid carrier.

In certain embodiments, the crystalline material comprises a hexagonal crystal structure; and the bending moment is oriented within ±5 degrees of perpendicular to a <11$\bar{2}$0> direction of the hexagonal crystal structure.

In certain embodiments, the method further comprises performing at least one additional processing step on the portion of the crystalline material while the portion of the crystalline material remains part of the bonded assembly.

In certain embodiments, the method further comprises bonding an additional rigid carrier to a second surface of the crystalline material that opposes the first surface, prior to said fracturing.

In certain embodiments, the subsurface laser damage region comprises a plurality of substantially parallel subsurface laser damage lines.

In certain embodiments, the method further comprises removing the portion of the crystalline material from the bonded assembly.

In certain embodiments, the crystalline material comprises SiC.

In certain embodiments, the method further comprises roughening, texturing, and/or etching at least one of (i) the first surface of the crystalline material or (ii) an adjacent surface of the rigid carrier prior to the temporarily bonding of the rigid carrier to the first surface of a crystalline material with the adhesive material.

In certain embodiments, the crystalline material comprises a thickness of at least 500 microns prior to fracturing the crystalline material along or proximate to the subsurface laser damage region.

In certain embodiments, the portion of the crystalline material removed from the substrate comprises a freestanding wafer configured for growth of at least one epitaxial layer thereon. In certain embodiments, the portion of the crystalline material removed from the substrate comprises a device wafer including at least one epitaxial layer grown thereon.

In another aspect, the disclosure relates to a crystalline material processing method comprising: bonding a first crystalline carrier to a first surface of a crystalline material, wherein the crystalline material comprises a substrate having a subsurface laser damage region at a depth relative to a first surface of the substrate; bonding a second crystalline carrier to a second surface of the crystalline material; and following the bonding steps, fracturing the crystalline material along or proximate to the subsurface laser damage region to yield a bonded assembly comprising the first crystalline carrier and a portion of the crystalline material removed from the substrate.

In certain embodiments, at least one of the first crystalline carrier or the second crystalline carrier comprises a modulus of elasticity of at least 100 GPa. In certain embodiments, at least one of the first crystalline carrier or the second crystalline carrier comprises a thickness of greater than 800 microns.

In certain embodiments, a coefficient of thermal expansion (CTE) of the first crystalline carrier is greater than a CTE of the substrate at 25° C.; and the fracturing comprises cooling at least the first crystalline material carrier to promote fracture of the crystalline material along or proximate to the subsurface laser damage region.

In certain embodiments, the fracturing of the crystalline material along or proximate to the subsurface laser damage region comprises application of ultrasonic energy to at least one of the first crystalline carrier or the substrate.

In certain embodiments, at least one of a maximum length or maximum width of at least a portion of the first crystalline carrier exceeds a corresponding maximum length or maximum width of the substrate.

In certain embodiments, the substrate comprises a notch or flat along at least one edge of the substrate, and at least a portion of at least one edge of the first crystalline carrier extends laterally beyond the notch or flat.

In certain embodiments, the fracturing of the crystalline material along or proximate to the subsurface laser damage region comprises applying a mechanical force proximate to at least one edge of the first crystalline carrier, and the mechanical force is configured to impart a bending moment in at least a portion of the first crystalline carrier. In certain embodiments, the crystalline material comprises a hexagonal crystal structure; and the bending moment is oriented within ±5 degrees of perpendicular to a <11$\bar{2}$0> direction of the hexagonal crystal structure that is parallel to a surface of the substrate.

In certain embodiments, at least one of the bonding of the first crystalline carrier to the first surface of the crystalline material or the bonding of the second crystalline carrier to the second surface of the crystalline material comprises anodic bonding.

In certain embodiments, at least one of the bonding of the first crystalline carrier to the first surface of the crystalline material or the bonding of the second crystalline carrier to the second surface of the crystalline carrier comprises adhesive bonding utilizing an adhesive material.

In certain embodiments, the adhesive material has a glass transition temperature $T_g$ of greater than 25° C.

In certain embodiments, the first crystalline carrier comprises a first face and a second face that opposes the first face; the adhesive material is arranged in contact with the first face; and the second face is devoid of any adhesive material and devoid of any stress-producing material.

In certain embodiments, the adhesive material comprises a thermoplastic material.

In certain embodiments, the adhesive material has a Shore D durometer value of at least about 70 when the adhesive material is at 25° C.

In certain embodiments, the adhesive material has a modulus of elasticity of at least about 7 MPa when the adhesive material is at 25° C.

In certain embodiments, the method further comprises performing at least one additional processing step on the portion of the crystalline material while the portion of the crystalline material remains part of the bonded assembly.

In certain embodiments, the subsurface laser damage region comprises a plurality of substantially parallel subsurface laser damage lines.

In certain embodiments, the method further comprises removing the portion of the crystalline material from the bonded assembly.

In certain embodiments, the crystalline material comprises SiC.

In certain embodiments, the portion of the crystalline material removed from the substrate comprises a free-standing wafer configured for growth of at least one epitaxial layer thereon. In certain embodiments, the portion of the crystalline material removed from the substrate comprises a device wafer including at least one epitaxial layer grown thereon.

In another aspect, the disclosure relates to a crystalline material processing method comprising bonding a rigid carrier to a first surface of a crystalline material, wherein the crystalline material comprises a substrate having a subsurface laser damage region at a depth relative to the first surface, and at least a portion of at least one edge of the rigid carrier extends laterally beyond a corresponding at least one edge of the substrate. The method further comprises applying a mechanical force proximate to the at least one edge of the rigid carrier to impart a bending moment in at least a portion of the rigid carrier and fracture the crystalline material along or proximate to the subsurface laser damage region to yield a bonded assembly comprising the rigid carrier and a portion of the crystalline material removed from the substrate.

In certain embodiments, the applying of a mechanical force proximate to the at least one edge of the rigid carrier consists of localized application of mechanical force at a single location proximate to the at least one edge of the rigid carrier.

In certain embodiments, the applying of a mechanical force proximate to the at least one edge of the rigid carrier comprises localized application of mechanical force at multiple spatially segregated locations proximate to the at least one edge of the rigid carrier, and exerting an opposing mechanical force at a central location of the rigid carrier.

In certain embodiments, the at least a portion of the at least one edge of the rigid carrier extends laterally at least about 100 microns, or at least about 500 microns (or another distance threshold disclosed herein), beyond the corresponding at least one edge of the substrate.

In certain embodiments, the substrate comprises a notch or flat along the at least one edge of the substrate, and the at least a portion of the at least one edge of the rigid carrier extends laterally beyond the notch or flat.

In certain embodiments, the crystalline material comprises a hexagonal crystal structure; and the bending moment is oriented within ±5 degrees of perpendicular to a <11$\bar{2}$0> direction of the hexagonal crystal structure that is parallel to a surface of the substrate.

In certain embodiments, the bonding of the rigid carrier to the surface of the crystalline material comprises adhesive bonding utilizing an adhesive material arranged between the rigid carrier and the surface of the crystalline material.

In certain embodiments, the method further comprises bonding an additional rigid carrier to a second surface of the crystalline material that opposes the first surface, prior to the applying of mechanical force. In certain embodiments, the applying of mechanical force comprises exerting a localized prying force between the first rigid carrier and the additional rigid carrier to increase separation between the first rigid carrier and the additional rigid carrier.

In certain embodiments, the portion of the crystalline material removed from the substrate comprises a free-standing wafer configured for growth of at least one epitaxial layer thereon. In certain embodiments, the portion of the crystalline material removed from the substrate comprises a device wafer including at least one epitaxial layer grown thereon.

In another aspect, the disclosure relates to a crystalline material processing method comprising: bonding a rigid carrier to a first surface of a crystalline material, wherein the crystalline material comprises a substrate having a subsurface laser damage region at a depth relative to the first surface, the rigid carrier comprises a thickness of greater than 850 microns, and the rigid carrier comprises at least one of the following features (i) or (ii): the carrier comprises a crystalline carrier, or (ii) the carrier has a modulus of elasticity of at least 20 GPa; and fracturing the crystalline material along or proximate to the subsurface laser damage region to yield a bonded assembly comprising the rigid carrier and a portion of the crystalline material removed from the substrate.

In certain embodiments, the rigid carrier comprises a crystalline carrier. In certain embodiments, the carrier has a modulus of elasticity of at least 20 GPa, at least 100 GPa, or another threshold specified herein. In certain embodiments, the bonding of the rigid carrier to the crystalline material comprises adhesive bonding utilizing an adhesive material arranged between the rigid carrier and the crystalline material.

In certain embodiments, the adhesive material has a glass transition temperature $T_g$ of greater than 25° C. In certain embodiments, the adhesive material has a Shore D durometer value of at least about 70 when the adhesive material is at 25° C. In certain embodiments, the adhesive material has a modulus of elasticity of at least about 7 MPa when the adhesive material is at 25° C.

In certain embodiments, the rigid carrier comprises a first face and a second face that opposes the first face; the adhesive material is arranged in contact with the first face; and the second face is devoid of any adhesive material and devoid of any stress-producing material.

In certain embodiments, a coefficient of thermal expansion (CTE) of the rigid carrier is greater than a CTE of the substrate at 25° C.

In certain embodiments, the fracturing comprises cooling at least the rigid carrier to promote fracture of the crystalline material along or proximate to the subsurface laser damage region.

In certain embodiments, wherein the fracturing comprises application of ultrasonic energy to at least one of the rigid carrier or the substrate.

In certain embodiments, at least one of a maximum length or maximum width of at least a portion of the rigid carrier exceeds a corresponding maximum length or maximum width of the substrate. In certain embodiments, the substrate comprises a notch or flat along at least one edge of the substrate, and at least a portion of the at least one edge of the rigid carrier extends laterally beyond the notch or flat.

In certain embodiments, the fracturing comprises applying a mechanical force proximate to at least one edge of the rigid carrier, and wherein the mechanical force is configured to impart a bending moment in at least a portion of the rigid carrier.

In certain embodiments, the crystalline material comprises a hexagonal crystal structure; and the bending moment is oriented within ±5 degrees of perpendicular to a <11$\bar{2}$0> direction of the hexagonal crystal structure.

In certain embodiments, the method further comprises performing at least one additional processing step on the portion of the crystalline material while the portion of the crystalline material remains part of the bonded assembly.

In certain embodiments, the method further comprises bonding an additional rigid carrier to a second surface of the crystalline material that opposes the first surface, prior to said fracturing. In certain embodiments, the method further comprising removing the portion of the crystalline material from the bonded assembly.

In certain embodiments, the crystalline material comprises SiC.

In certain embodiments, the portion of the crystalline material removed from the substrate comprises a freestanding wafer configured for growth of at least one epitaxial layer thereon.

In certain embodiments, the portion of the crystalline material removed from the substrate comprises a device wafer including at least one epitaxial layer grown thereon.

In another aspect, the disclosure relates to a method comprising: grinding an edge of a thick wafer of crystalline material to eliminate a non-perpendicular edge profile and form a perpendicular edge profile, wherein the thick wafer comprises a first surface, a second surface opposing the first surface, and at least one epitaxial layer deposited on or over the first surface, and wherein a rigid first carrier is temporarily bonded over the at least one epitaxial layer with an adhesive material arranged between the rigid first carrier and the at least one epitaxial layer; and following formation of the perpendicular edge profile, impinging laser emissions through the second surface of the thick wafer to form a subsurface laser damage region within the thick wafer.

In certain embodiments, the method further comprises bonding a rigid second carrier to the second surface of the thick wafer; and fracturing the thick wafer along or proximate to the subsurface laser damage region to yield (i) a first bonded assembly comprising the rigid first carrier, the adhesive material, the at least one epitaxial layer, and a first thin wafer divided from the thick wafer, and (ii) a second bonded assembly comprising the rigid second carrier and a second thin wafer divided from the thick wafer.

In certain embodiments, the method further comprises: bonding the rigid first carrier to a primary surface of the crystalline material, wherein the crystalline material comprises a substrate having an initial subsurface laser damage region at a depth relative to the primary surface; fracturing the crystalline material along or proximate to the initial subsurface laser damage region to yield an initial bonded assembly comprising the rigid first carrier and a portion of the crystalline material removed from the substrate; and removing the portion of the crystalline material from the first bonded assembly to produce the thick wafer, wherein the thick wafer comprises the portion of the crystalline material.

In certain embodiments, the method further comprises: forming the non-perpendicular wafer edge of the thick wafer; and epitaxially growing the at least one epitaxial layer on or over the first surface of the thick wafer following production of the non-perpendicular wafer edge.

In certain embodiments, at least one of the first thin wafer or the second thin wafer comprises a thickness of less than 250 microns. In certain embodiments, the crystalline material comprises SiC.

In another aspect, the disclosure relates to a method for processing a crystalline material wafer comprising a first surface having surface damage thereon, the first surface being bounded by an edge, the method comprising: grinding the first surface with at least one first grinding apparatus to remove a first part of the surface damage; following the grinding of the first surface with the at least one first grinding apparatus, edge grinding the edge to form a beveled or rounded edge profile; and following the edge grinding, grinding the first surface with at least one second grinding apparatus to remove a second part of the surface damage sufficient to render the first surface suitable for further processing by chemical mechanical planarization.

In certain embodiments, the method further comprises processing the first surface by chemical mechanical planarization following the grinding of the first surface with the at least one second grinding apparatus to render the first surface for epitaxial growth of one or more layers of semiconductor material thereon.

In certain embodiments, the at least one first grinding apparatus comprises at least one grinding wheel having a grinding surface of less than 5000 grit (e.g., 1000 grit, 1400 grit, 2000 grit, 3000 grit, 4000 grit, or the like), and the at least one second grinding apparatus comprises at least one grinding wheel having a grinding surface of at least 5000 grit (e.g., 5000 grit, 7000 grit, 8000 grit, 10,000 grit, 15,000 grit, 20,000 grit, 25,000 grit, 30,000 grit, or the like).

In certain embodiments, the grinding of the first surface with the at least one first grinding apparatus comprises removal of a thickness of 20 microns to 100 microns (e.g., 20 microns to 80 microns, 40 microns to 80 microns, 40 to 60 microns, or the like) of the crystalline material, and the grinding of the second surface with the at least one second grinding apparatus comprises removal of a thickness of 3 to 15 microns (e.g., 5 to 10 microns) of the crystalline material.

In certain embodiments, the surface damage comprises laser damage and fracture damage.

In certain embodiments, the crystalline material comprises silicon carbide material, and the first surface comprises a Si-terminated face of the silicon carbide material.

In another aspect, the disclosure relates to a method for processing a crystalline material wafer comprising a first surface having surface damage thereon, the first surface being bounded by an edge, the method comprising: grinding the first surface with at least one first grinding apparatus to remove a first part of the surface damage; following the grinding of the first surface with the at least one first grinding apparatus, grinding the first surface with at least one second grinding apparatus to remove a second part of the surface damage sufficient to render the first surface suitable for further processing by chemical mechanical planarization; following the grinding of the first surface with the at least one second grinding apparatus, forming a protective coating on the first surface; following the deposition of the sacrificial material on the first surface, edge grinding the edge to form a beveled or rounded edge profile; and following the edge grinding, removing the protective coating from the first surface.

In certain embodiments, the method further comprises processing the first surface by chemical mechanical planarization following the removal of the sacrificial material from the first surface, to render the first surface for epitaxial growth of one or more layers of semiconductor material thereon.

In certain embodiments, the at least one first grinding apparatus comprises at least one grinding wheel having a grinding surface of less than 5000 grit, and the at least one second grinding apparatus comprises at least one grinding wheel having a grinding surface of at least 5000 grit.

In certain embodiments, the grinding of the first surface with the at least one first grinding apparatus comprises removal of a thickness of 20 microns to 100 microns of the crystalline material, and the grinding of the second surface with the at least one second grinding apparatus comprises removal of a thickness of 3 to 15 microns of the crystalline material.

In certain embodiments, the protective coating comprises photoresist.

In certain embodiments, the surface damage comprises laser damage and fracture damage.

In certain embodiments, the crystalline material comprises silicon carbide material, and the first surface comprises a Si-terminated face of the silicon carbide material.

In another aspect, the disclosure relates to a material processing apparatus comprising: a laser processing station configured to form subsurface laser damage regions in crystalline material substrates supplied to the laser processing station; a fracturing station arranged to receive crystalline material substrates processed by the laser processing station and configured to fracture the crystalline material substrates along the subsurface laser damage regions to form crystalline material portions removed from the crystalline material substrates, wherein each crystalline material portion comprises surface damage; a plurality of coarse grinding stations arranged in parallel downstream of the fracturing station and configured to remove first parts of the surface damage from the crystalline material portions, wherein at least first and second coarse grinding stations of the plurality of coarse grinding stations are configured to be operated simultaneously to remove first parts of surface damage of different crystalline material portions; and at least one fine grinding station arranged downstream of the plurality of coarse grinding stations and configured to remove second parts of the surface damage from the crystalline material portions, sufficient to render at least one surface of each crystalline material portion suitable for further processing by chemical mechanical planarization.

In certain embodiments, the apparatus further comprises at least one chemical mechanical planarization station arranged downstream of the at least one fine grinding station and configured to render at least one surface of each crystalline material portion suitable for further processing by chemical mechanical planarization.

In certain embodiments, the apparatus further comprises at least one edge grinding station configured to grind an edge of each crystalline material portion to form a beveled or rounded edge profile.

In certain embodiments, each coarse grinding station comprises at least one grinding wheel having a grinding surface of less than 5000 grit, and the at least one fine grinding station comprises at least one grinding wheel having a grinding surface of at least 5000 grit.

In certain embodiments, each coarse grinding station is configured to remove a thickness of 20 microns to 100 microns of crystalline material from each crystalline material portion, and each fine grinding station is configured to remove a thickness of 3 to 15 microns of crystalline material from each crystalline material portion.

In certain embodiments, the laser processing station is configured to simultaneously form subsurface laser damage regions in multiple crystalline material substrates.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF DRAWINGS

The accompanying drawings incorporated in and forming a part of this specification illustrate several aspects of the disclosure, and together with the description serve to explain the principles of the disclosure.

FIGS. 8A-8D provide exemplary laser tool travel paths relative to a crystalline material for formation of subsurface damage within the crystalline material, with FIG. 8D including a superimposed arrow showing orientation of subsurface damage lines relative to a $[11\bar{2}0]$ direction of a hexagonal crystal structure of the crystalline material, with the lines also being parallel to a surface of the crystalline material.

FIGS. 13A-13E are top views of bonded assemblies including carriers of different shapes each joined to a substrate of crystalline material.

FIGS. 13F and 13G provide side cross-sectional schematic views of the bonded assemblies of FIGS. 13D and 13E, respectively.

FIG. 14 is a cross-sectional schematic view of a crystalline material having subsurface laser damage and bonded to a rigid carrier, with the crystalline material and carrier arranged in a liquid bath of an ultrasonic generator.

FIG. 23 is a schematic illustration of a material processing apparatus according to one embodiment, including a laser processing station, a material fracturing station, multiple coarse grinding stations arranged in parallel, a fine grinding station, a surface coating station, an edge grinding station, a coating removal station, and a CMP station.

FIG. 24A is a schematic side cross-sectional view of a first apparatus for holding an ingot having end faces that are non-perpendicular to a sidewall thereof, according to one embodiment.

FIG. 24B is a schematic side cross-sectional view of a second apparatus for holding an ingot having end faces that are non-perpendicular to a sidewall thereof, according to one embodiment.

DETAILED DESCRIPTION

Figure 1:
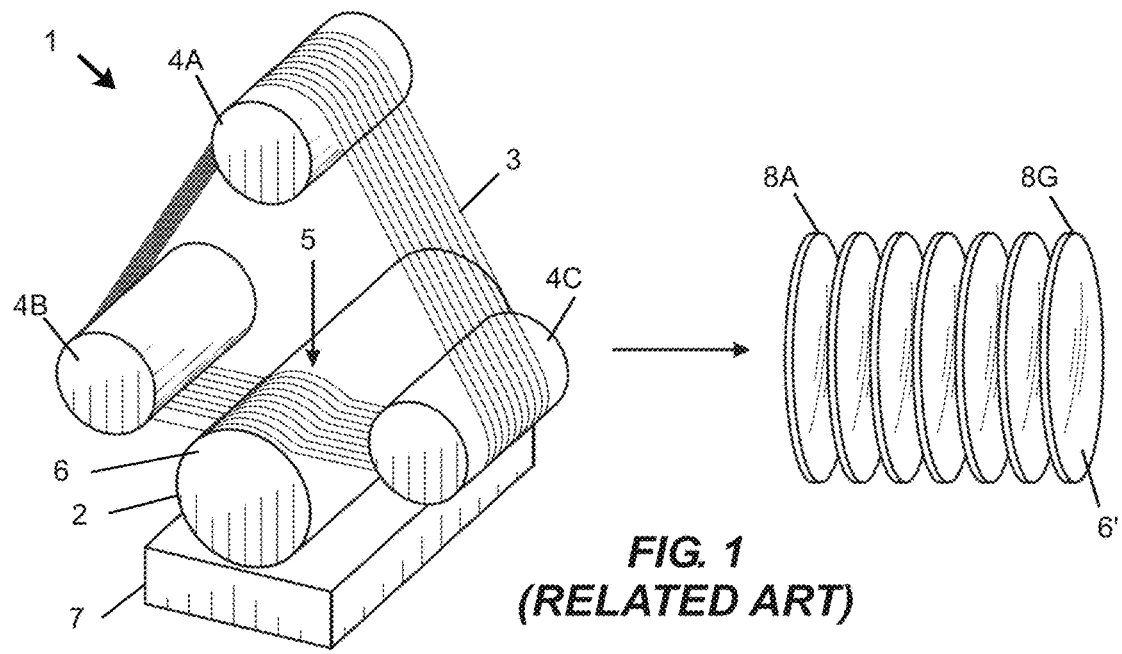
FIG. 1 includes a first frame providing a perspective view of an ingot received by a conventional wire saw tool and being subjected to a wire sawing process, and a second frame providing a perspective view of multiple wafers obtained by the wire sawing process.
Figure 2:
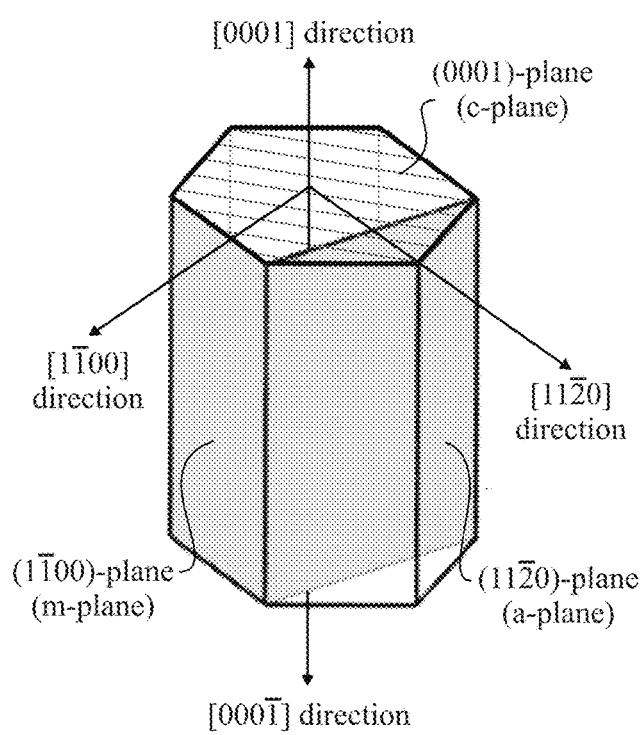
FIG. 2 is a first perspective view crystal plane diagram showing the coordinate system for a hexagonal crystal such as 4H—SiC.
Figure 3:
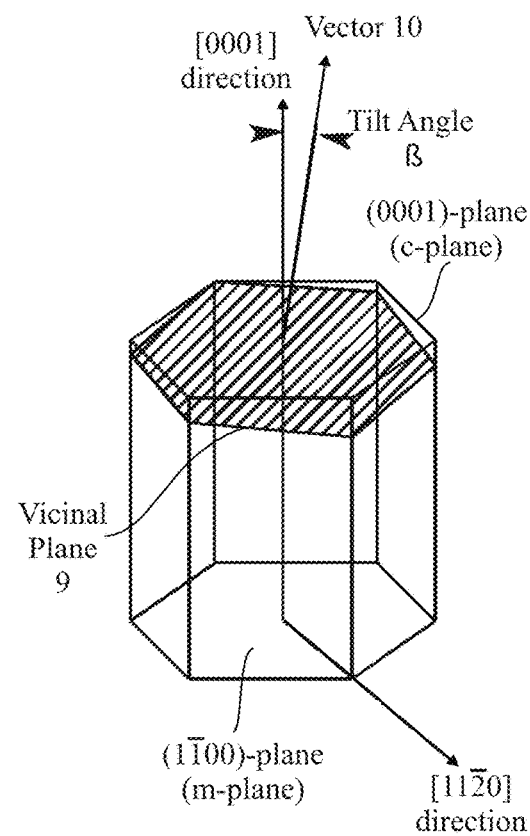
FIG. 3 is a second perspective view crystal plane diagram for a hexagonal crystal, illustrating a vicinal plane that is non-parallel to the c-plane.
Figure 4A:
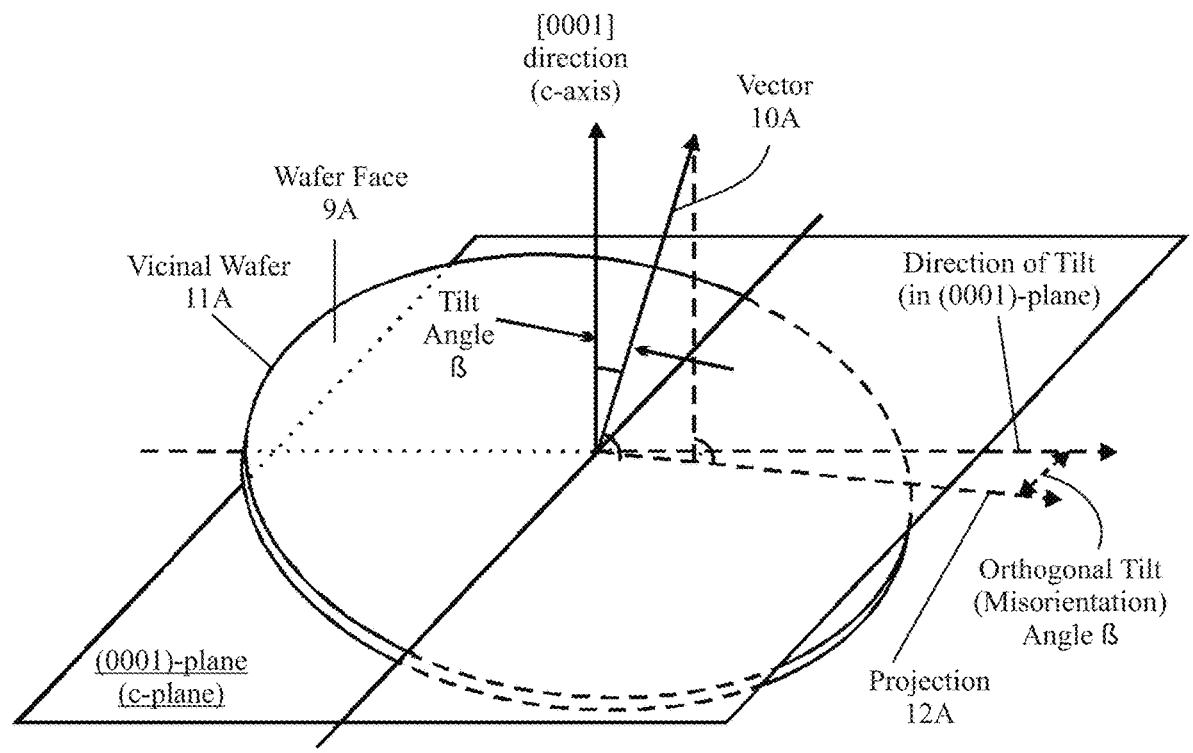
FIG. 4A is a perspective view wafer orientation diagram showing orientation of a vicinal wafer relative to the c-plane.
Figure 4B:
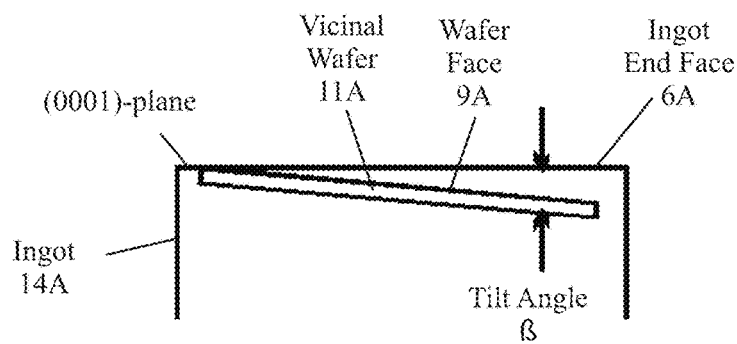
FIG. 4B is a simplified cross-sectional view of the vicinal wafer of FIG. 4A superimposed over a portion of an ingot.
Figure 5:
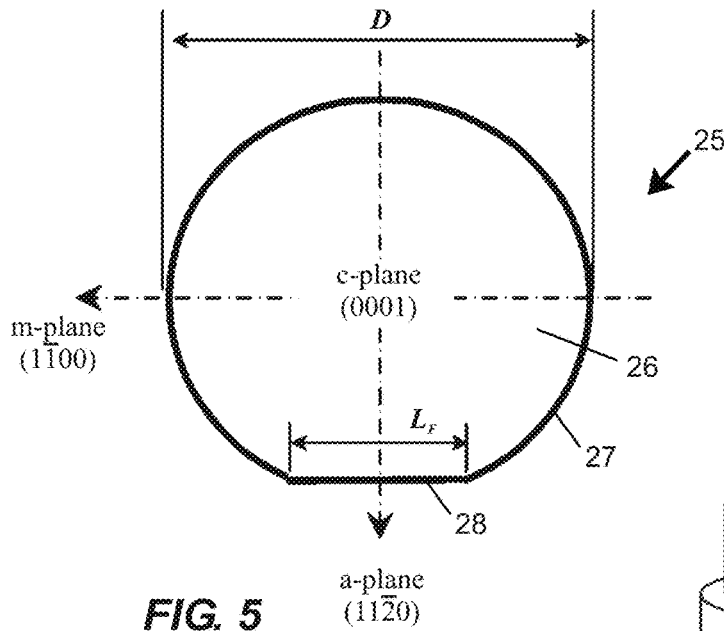
FIG. 5 is a top plan view of an exemplary SiC wafer, with superimposed arrows showing crystallographic orientation directions.

Aspects of the present disclosure provide crystalline material processing methods in which a carrier (e.g., a rigid carrier) is joined to a surface of a crystalline material having subsurface laser damage at a depth, and the crystalline material is fractured along the subsurface laser damage region, providing a bonded assembly that includes the carrier and a portion of the crystalline material removed from the substrate. The fracturing is performed without need for a separate stress-producing layer arranged over the carrier. The foregoing steps may be repeated for sequential removal of thin layers of crystalline material from an ingot to form wafers. In certain embodiments, the carrier comprises a crystalline material. In certain embodiments, the rigid carrier may be joined to a surface of the crystalline material by adhesive bonding, and the rigid carrier may have a modulus of elasticity of at least 20 GPa. The adhesive material may have a glass transition temperature $T_g$ of greater than 25° C. (or another threshold specified herein). The portion of the crystalline material removed from the substrate, which may embody a wafer, is available to be subjected to further processing steps while the portion remains part of the bonded assembly. In certain implementations, fracturing of the crystalline material may be promoted by (i) application of a mechanical force (e.g., optionally localized at one or more points) proximate to at least one edge of the carrier, to impart a bending moment in at least a portion of the carrier; (ii) cooling the carrier in instances in which the carrier has a greater coefficient of thermal expansion than the crystalline material; and/or (iii) application of ultrasonic energy to at least a portion of the bonded assembly.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "substrate" refers to a crystalline material, such as an ingot or a wafer, that is divisible into at least two thinner portions having substantially the same lateral dimensions (e.g., diameter, or length and width) as the substrate, and having sufficient thickness (i) to be surface processed (e.g., lapped and polished) to support epitaxial deposition of one or more crystalline material layers, and optionally (ii) to be free-standing if and when separated from a rigid carrier. In certain embodiments, a substrate may have a generally cylindrical shape, and/or may have a thickness of at least about one or more of the following thicknesses: 300 µm, 350 µm, 500 µm, 750 µm, 1 mm, 2 mm, 3 mm, 5 mm, 1 cm, 2 cm, 5 cm, 10 cm, 20 cm, 30 cm, or more. In certain embodiments, a substrate may include a thicker wafer that is divisible into two thinner wafers. In certain embodiments, a substrate may be part of a thicker wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed. In certain embodiment, a substrate may comprise a diameter of 150 mm or greater, or 200 mm or greater.

Methods disclosed herein may be applies to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Exemplary materials include, but are not limited to, Si, GaAs, and diamond. In certain embodiments, such methods may utilize single crystal semiconductor materials having hexagonal crystal structure, such as 4H—SiC, 6H—SIC, or Group III nitride materials (e.g., GaN, AlN, InN, InGaN, AlGaN, or AlInGaN). Various illustrative embodiments described hereinafter mention SiC generally or 4H—SiC specifically, but it is to be appreciated that any suitable crystalline material may be used. Among the various SiC polytypes, the 4H—SiC polytype is particularly attractive for power electronic devices due to its high thermal conductivity, wide bandgap, and isotropic electron mobility. Bulk SiC may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof, such as of 2 to 6 degrees), as may be suitable for forming N-doped or highly conductive material). Embodiments disclosed herein may apply to on-axis and off-axis crystalline materials, as well as doped and unintentionally doped crystalline materials. Certain embodiments disclosed herein may utilize on-axis 4H—SiC or vicinal (off-axis) 4H—SiC having an offcut in a range of from 1 to 10 degrees, or from 2 to 6 degrees, or about 4 degrees.

Figure 6A:
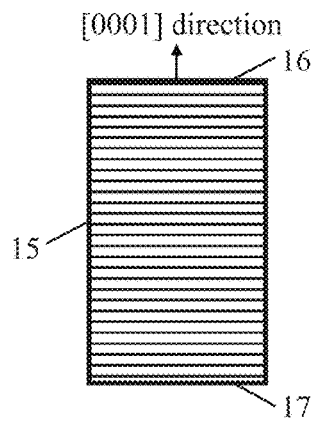
FIG. 6A is a side elevation schematic view of an on-axis ingot of crystalline material.
Figure 6B:
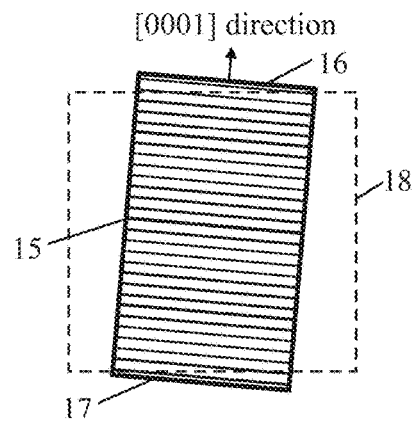
FIG. 6B is a side elevation schematic view of the ingot of FIG. 6A being rotated by 4 degrees, with a superimposed pattern for cutting end portions of the ingot.
Figure 6C:
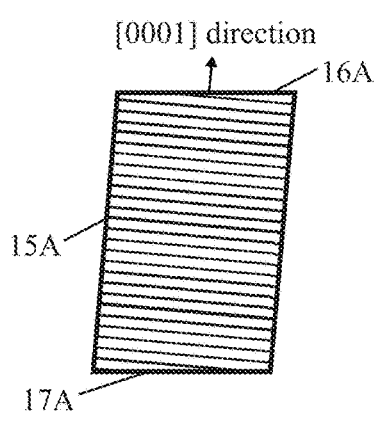
FIG. 6C is a side elevation schematic view of an ingot following removal of end portions to provide end faces that are non-perpendicular to the c-direction.

FIGS. 6A and 6C schematically illustrate on-axis and off-axis crystalline substrates in the form of ingots that may be utilized with methods disclosed herein. FIG. 6A is a side elevation schematic view of an on-axis ingot 15 of crystalline material having first and second end faces 16, 17 that are perpendicular to the c-direction (i.e., [0001] direction for a hexagonal crystal structure material such as 4H—SiC). FIG. 6B is a side elevation schematic view of the ingot 15 of FIG. 6A being rotated by four degrees, with a superimposed pattern 18 (shown in dashed lines) for cutting and removing end portions of the ingot 15 proximate to the end faces 16, 17. FIG. 6C is a side elevation schematic view of an off-axis ingot 15A formed from the ingot 15 of FIG. 6B, following removal of end portions to provide new end faces 16A, 17A that are non-perpendicular to the c-direction. If laser emissions of a first depth are supplied through an end face 16 of the ingot 15 to form subsurface laser damage, a carrier (not shown) is joined to the end face 16, and the ingot 15 is fractured along the subsurface laser damage, then an on-axis wafer may be formed. Conversely, if laser emissions of a first depth are supplied through an end face 16A of the off-axis ingot 15A to form subsurface laser damage, a carrier (not shown) is joined to the end face 16A, and the ingot 15A is fractured along the subsurface laser damage, then an off-axis wafer may be formed.

Although various substrates, carriers, adhesives, and fracturing techniques are disclosed herein, it is to be appreciated that depending on the various permutations of the substrate, carrier, and/or bonding method, the fracturing technique(s) may be used individually, or any combination of fracturing techniques can be used simultaneously and/or sequentially to achieve the desired separation.

Carrier Properties

Carriers are contemplated for use with various carrier-assisted methods for parting crystalline materials along subsurface laser damage regions as disclosed herein. In view of the different methods disclosed herein for parting (i.e., fracturing) crystalline materials, desirable carrier properties may vary differ depending on the specific fracturing method.

Various embodiments refer to a carrier that is rigid in character. In certain embodiments, at least a portion proximal to a crystalline material to be parted, or an entirety of, a rigid carrier comprises a modulus of elasticity (a/k/a Young's modulus) of at least about 20 GPa, at least about 50 GPa, at least about 100 GPa, at least about 200 GPa, or at least about 300 GPa. For example, sapphire has a modulus of elasticity of 345 GPa. The modulus of elasticity is a mechanical property that measures the stiffness of a solid material. It defines the relationship between stress (force per unit area) and strain (proportional deformation) in a material in the linear elasticity regime of a uniaxial deformation.

Without wishing to be bound by any specific theory as to reasons for improved results of separation methods disclosed herein relative to conventional methods (e.g., using low rigidity interfacial materials such as PDMS or silicone and low temperature fracturing), it is believed that when a relatively rigid or stiff (i.e., high modulus of elasticity) carrier is bonded to a crystalline material to be fractured along a subsurface laser damage region, the carrier may reduce wafer bowing and/or breakage while providing repeatable crystalline material separation results. In addition to the mechanical aspects needed for separation (e.g., by mechanical, CTE mismatch, and/or ultrasonic means), a carrier also provides mechanical support during and after separation. This is useful for post separation processes, as the separated crystalline material can be ground, polished, etc. while remaining attached to and supported by the rigid carrier. This avoids the need for bonding a wafer to a rigid carrier after fracturing for conducting one or more post-separation processing steps.

When a rigid carrier is to be bonded to a substrate with an adhesive, in certain embodiments a carrier may be comprise a greater range of materials, including generally semiconductors, inorganic materials, metals, metalloids, non-metals, ceramics, crystalline materials (e.g., single crystal or polycrystalline in character), amorphous materials, polymeric materials, glasses, and composite materials. In certain embodiments, a carrier may comprise two or more material that are bonded or joined together by various conventional means. Other materials may be used, as will be recognized by one skilled in the art.

When a rigid carrier is not limited to being adhesively bound to a substrate with an adhesive, a narrower range of carrier materials may be desired. In certain embodiments, a carrier not necessarily adhesively bound to a rigid carrier may comprise single crystal materials (e.g., single crystal or polycrystalline in character), semiconductor materials, ceramic materials, metalloids, inorganic materials, and composite materials.

In certain embodiments, a rigid carrier may comprise a thickness that exceeds one, two, three, four, or five times a depth of subsurface laser damage of crystalline material bonded to the rigid carrier. In various embodiments, a rigid carrier may comprise a thickness that is less than, equal to, or greater than a thickness of (pre-separation) crystalline material bonded to the rigid carrier. In certain embodiments, a rigid carrier may have a thickness of at least 500 µm, greater than 800 µm, at least 850 µm, at least 900 µm, at least 1 mm, at least 1.5 mm, at least 2 mm, or at least 3 mm, with the preceding ranges optionally bounded by upper limits of 1 mm, 2 mm, 3 mm, 4 mm, or 5 mm as appropriate. In certain embodiment, a rigid carrier may have a thickness in a range of from 0.5 to 5 mm, or 0.5 to 3 mm, or 0.5 to 2 mm, or 0.8 to 5 mm, or 0.8 to 3 mm, or 0.8 to 2 mm, or 0.85 to 5 mm, or 0.9 to 5 mm, or 1 to 4 mm, or 1 to 3 mm, or 1 to 2 mm.

In certain embodiments, a rigid carrier may desirably have a lateral extent (e.g., diameter, or length and width) that is at least as large as, or that exceeds, corresponding dimensions of a substrate bonded thereto. Providing a rigid carrier a diameter at least as large (or larger) than that of a crystalline substrate is believed to facilitate initiation of fracture during various fracturing processes described herein.

In certain embodiments, at least one of a maximum length or maximum width of at least a portion of the rigid carrier exceeds a corresponding maximum length or maximum width of the substrate. In certain embodiments, at least a portion of the at least one edge of the rigid carrier may extends laterally at least about 100 microns, at least about 200 microns, at least about 500 microns, at least about 1 mm, or at least about 2 mm beyond the corresponding at least one edge of the substrate. Such lateral overlap may be particularly desirable in embodiments utilizing mechanical separation, since the overlap may receive at least a portion of a tool suitable for imparting a moment on the rigid carrier to initiate fracture. In certain embodiments, a substrate includes a notch or flat along the at least one edge of the substrate, and at least a portion of an edge (or at least one edge) of the rigid carrier extends laterally beyond the notch or flat.

Embodiments including single and dual carriers are disclosed herein. As substrates to be separated get thinner (e.g., below about 5 mm in thickness), dual carriers become a practical necessity. A carrier arranged proximal to a subsurface laser damage region may be referred to as a frontside carrier, as distinguished from a backside carrier arranged distal from. According to certain embodiments disclosed herein, a frontside carrier is specifically intended to promote separation of crystalline material along or proximate to a subsurface laser damage region. In contrast, a backside carrier is not intended to promote separation of a substrate during a fracturing process. For this reason, when CTE mismatch between a carrier and substrate is used to promote fracture of a substrate along a subsurface damage region, a backside carrier may have a different CTE from the frontside carrier. In certain embodiments, a backside carrier may have less CTE mismatch against the substrate than a frontside carrier. In certain embodiments, a backside carrier may be CTE matched or nearly CTE matched to a substrate.

CTE Properties of Carrier(s) Relative to Crystalline Material

In certain embodiments, a rigid carrier having a first coefficient of thermal expansion or $CTE_1$ is bonded or joined to a surface of a crystalline material having subsurface laser damage and having a second coefficient of thermal expansion or $CTE_2$, wherein $CTE_1 > CTE_2$ at a desired temperature (e.g., at 25° C.) or over a desired temperature range). Thereafter, at least the carrier is cooled, causing the carrier is caused to shrink in size more rapidly than the crystalline material due to the CTE differential. Such differential shrinkage creates stress (e.g., shear stress) in the carrier as well as the crystalline material, and such stress causes the crystalline material to fracture along the subsurface laser damage region. While SiC substrates in combination sapphire carriers have been tested extensively by the inventors, other CTE mismatched material combinations may be readily determined by one skilled in the art with the benefit of the present disclosure.

To impart sufficient stress on a substrate, a CTE mismatched substrate according to various embodiments disclosed herein may be rigid in character, taking into account not only the mechanical properties (e.g., elastic modulus) of the carrier material, but also the carrier thickness. In certain embodiments, a rigid carrier may comprise a thickness of greater than 800 microns, at least 850 microns, at least 900 microns, at least 1 mm, at least 1.5 mm, or another threshold value disclosed herein.

CTE may vary with temperature for various materials. For a rigid carrier having a CTE greater than that of a crystalline material, in certain embodiments the rigid carrier may comprise a material having a CTE that is greater than a CTE of the crystalline material at a desired temperature (e.g., at 25° C., at 100° C., at 200° C., at 300° C., at 0° C., and/or −100° C.), or over a desired temperature range (e.g., a range of −100° C. to 300° C., a range of −100° C. to 200° C., a range of from −100° C. to 100° C., a range of from 0° C. to 200° C., a range of from 50° C. to 150° C., or any other suitable temperature range or subrange disclosed herein).

In certain embodiments, a CTE of a rigid carrier (to be arranged proximate to a subsurface damage region in a crystalline material substrate) is less than 5 times, no more than about 4 times, no more than about 3 times, no more than about 2 times, no more than about 1.5 times greater than the CTE of the crystalline material substrate. In certain embodiments, the CTE of a rigid carrier is greater than the CTE of the crystalline material substrate by a multiplication factor in a range of from about 1.25 to about 4. Some or all of the foregoing CTE mismatch ratios believed to be significantly smaller than CTE mismatch ratios for materials used in conventional nickel- or polymer-based spalling (separation) techniques (such as described in the background portion of the present disclosure). For example, a CTE mismatch ratio between nickel or nickel-containing metals (useable as a carrier) and SiC (useable as a crystalline material) may be at least 5 or more, and a CTE mismatch ratio between polymers and SiC may be on the order of 10 to 100 or more.

Although reference has been made to a rigid carrier having a CTE greater than a CTE of a crystalline material having subsurface damage and joined thereto, in certain embodiments, a crystalline material having subsurface laser damage may be arranged between first and second rigid carriers. In such embodiments, the first rigid carrier is joined to a first surface of the crystalline material proximate to the subsurface laser damage, and the second rigid carrier is joined to a second surface of the crystalline material that opposes the first surface and is distal from the subsurface laser damage. In certain embodiments, the first rigid carrier and the second rigid carrier may both have CTE values that exceed the CTE of the crystalline material. In other embodiments, the first rigid carrier has a CTE greater than a CTE of the crystalline material, while the second rigid carrier has a CTE that is less than or equal to a CTE of the crystalline material. For example, in certain embodiments, a frontside carrier for a SiC substrate may be sapphire, which exhibits significant CTE mismatch relative to SiC, while a backside carrier can be SiC having no mismatch relative to a CTE carrier. Alternatively, a frontside carrier for a SiC wafer may be sapphire (which has a greater CTE than SiC), while a backside carrier may be SiC (having no CTE mismatch to the SiC wafer).

In certain embodiments utilizing CTE mismatch to promote fracture, it may be desirable to provide the minimum amount of CTE mismatch necessary to enable the desired separation, in order to reduce bow of the bonded assembly (i.e., carrier and fractured substrate portion bonded thereto) following separation. When using SiC substrates and sapphire carriers, bowing on the order of 200 microns has been observed for a 150 mm diameter SiC wafer. Such level of bowing is within a range that may be readily addressed via grinding due to both mechanical forces imposed by a vacuum chuck used during grinding and grind forces, which serve to flatten the bonded assembly during processing. In contrast, excessive bowing is a major issue encountered with prior art processes.

Bonding or Joining of Carrier(s) to Crystalline Material

Various methods may be used to bond or join a rigid carrier to a surface of a crystalline material having subsurface damage in order to promote fracture along the subsurface damage. One method includes adhesive bonding, which may involve application of adhesive material to a proximal surface of a rigid carrier, mating the adhesive with a surface of a crystalline material having subsurface laser damage, and curing the adhesive (e.g., by subjecting the carrier/adhesive/crystalline material stack to elevated temperature and pressure).

In certain embodiments, bonding between a rigid carrier and a crystalline material having subsurface laser damage may be temporary in character, such as by using an adhesive material that will maintain adhesion during certain conditions (e.g., room temperature) but will exhibit reduced adhesion during removal conditions (e.g., at temperatures sufficient to cause the adhesive material to flow, and/or in exposure to a chemical agent configured to weaken or dissolve the adhesive material). The use of temporary bonding media permits a crystalline material to be bonded to a carrier to enable fracture according to methods disclosed herein (e.g., thermal-induced fracture at low temperature, fracture induced by application of mechanical force, and/or fracture induced by application of ultrasonic energy), but permits a removed portion of crystalline material adhered to the rigid carrier to be removed thereafter (optionally, after the performance of one or more other processing steps on the crystalline material portion while attached to the rigid carrier). Desirable properties for adhesive materials useable with various embodiments of the present disclosure may depend in part on the method(s) used for inducing fracture of the crystalline material.

Important parameters of temporary bonding material may include (a) cohesive strength, (b) adhesive strength, (c) modulus of elasticity, (d) glass transition temperature, and (e) thickness. A suitable temporary bonding material (e.g., temporary adhesive) should possess a proper combination of the foregoing parameters to effectively transfer separation force between a carrier and crystalline material to effectuate fracture along a subsurface damage region, with such adhesive material still being readily removed, destroyed, or rendered inoperable under specified conditions (e.g., chemical degradation, photonic degradation, thermal degradation, etc.)—preferably without requiring undue effort for residue removal.

With respect to cohesive strength, a desirable adhesive material should have cohesive strength that is sufficiently high for the adhesive material to maintain its integrity and not come apart when subjected to forces required to fracture a crystalline material having subsurface laser damage. Adhesive strength of an adhesive material should be sufficiently high for adhesion to a surrounding material (e.g., carrier or crystalline material) to be maintained when the adhesive material is subjected to forces required to fracture a crystalline material having subsurface laser damage. It is noted that some adhesive materials exhibit reduced adhesion strength and cohesion strength at lower temperatures, so it may be desirable to employ fracturing techniques involving comparatively warmer temperatures.

Regarding modulus of elasticity and thickness of the adhesive material, a desirable adhesive material should serve to properly transfer an appropriate amount of stress from a carrier to a crystalline material, without the adhesive material absorbing an undue amount of stress needed for effectuating fracture of crystalline material. This tends to favor relatively high modulus (i.e., relatively stiff) adhesive materials that are present in relatively thin layers to promote stress transfer while inhibiting absorption of stress by an adhesive material.

With regard to glass transition temperature ($T_g$), the lower the $T_g$ value, the lower temperature to which a carrier must be cooled to effectuate fracture (e.g., spontaneous fracture) of crystalline material along a subsurface laser damage region when relying on CTE mismatch between the carrier and crystalline material. For example, if $T_g$ of an adhesive material is 0° C., and a temperature change of 70° C. is desired for introduction of sufficient stress, then a carrier must be cooled to −70° C. Unfortunately, at very low temperatures, adhesive material characteristics (including stress transfer efficiency) can deteriorate. Accordingly, adhesive materials exhibiting relatively higher $T_g$ values may be preferred for use with embodiments of the present disclosure.

In certain embodiments, an adhesive material may comprise an adhesive that is compatible with elevated temperature thermo-compression adhesive bonding. For high temperature thermo-compression bonding, a lower glass transition temperature ($T_g$) is desirable to avoid very high temperature bond requirements and prevent a separated crystalline material portion/rigid carrier assembly from having excessive bow at room temperature. However, in certain embodiments, $T_g$ of the adhesive material should not be too low, particularly when used in embodiments utilizing cooling in conjunction with a substrate/carrier CTE mismatch to effectuate fracture of crystalline material, since low $T_g$ materials may undesirably absorb too much of the substrate/carrier CTE mismatch stress on cooldown before the $T_g$ is crossed. The glass transition temperature of a polymeric material is the temperature region where the polymer transitions from a hard, glassy material to a soft, rubbery material.

In certain embodiments, an adhesive material may comprise an adhesive that is curable with ultraviolet (UV) light. For such an adhesive, a higher $T_g$ may be used since the adhesive bond may be formed at room temperature (e.g., about 25° C.), thereby minimizing any residual stress in the resulting separated material at room temperature. In certain embodiments, a UV curable adhesive bond may be formed above room temperature, in order to create a desired level of residual stress at room temperature in embodiments utilizing cooling in conjunction with a substrate/carrier CTE mismatch to effectuate fracture of crystalline material. In such an embodiment, this residual stress may be desirable to reduce the temperature differential required to accomplish separation by CTE mismatch between a carrier and a crystalline material portion adhered thereto.

Taking into account different adhesive bonding and/or curing processes, in certain embodiments utilizing cooling and CTE mismatch between a carrier and a crystalline material adhered thereto to effectuate fracture, an adhesive material may have a glass transition temperature ($T_g$) that is about 25° C., or that is greater than 25° C., greater than 50° C., greater than 75° C., greater than 100° C., or greater than 150° C. In certain embodiments, the preceding lower threshold values may be bounded from above (where appropriate) by upper threshold values of less than about 250° C., less than about 200° C., less than about 150° C., less than about 125° C., or less than about 100° C. Further, taking into account different adhesive bonding and/or curing processes, in certain embodiments, an adhesive material may have a melting point of greater than 50° C., greater than 100° C., greater than 150° C., or greater than 200° C.

In certain embodiments, an adhesive material may comprise a thermoplastic adhesive. At least certain thermoplastic adhesives may exhibit desirable mechanical and adhesion properties (relatively high $T_g$, high modulus of elasticity, high cohesive strength, high adhesion strength to desirable carriers and crystalline materials, and hardness at the desired temperature ranges (e.g., proximate to room temperature), while still being easily removable when heated to an elevated temperature and/or exposed to solvents. Examples of adhesive materials that may be suitable for use with methods disclosed herein may include BrewerBOND® 220, WaferBOND® HT-10.10, and BrewerBOND® 305 thermoplastic adhesives commercially available from Brewer Science, Inc. (Rolla, Mo., USA) and Crystalbond™ 509 thermoplastic adhesive commercially available from Aremco Products (Valley Cottage, N.Y., USA). Selected thermal and mechanical property values for these adhesives are tabulated below.

| Adhesive | $T_g$ | Elastic Modulus | Hardness | CTE |
| --- | --- | --- | --- | --- |
| BrewerBOND® 220 | ~50° C. | ~1800 MPa | 70 MPa | |
| WaferBOND® HT-10.10 | ~60° C. | ~2400 MPa | 160 MPa | $93 \times 10^{-6}$/° C. |
| BrewerBOND® 305 | ~75° C. | ~1500 MPa | n/a | |
| Crystalbond™ 509 | ~74° C. | ~9.5 MPa | 73.2 (Shore D) | |

In the preceding table, hardness values for thin films of the first and second adhesives were provided by the manufacturer, with such values typically being established using a nano-indenter method with the values expressed in Pascals (e.g., MPa or GPa), whereas the hardness value for the fourth adhesive is expressed as a durometer determined by the Applicant using the Shore D method. The elastic modulus value for the fourth adhesive was calculated by the Applicant from the Shore D durometer value. While there is no direct theoretical relationship between the scales of Shore and Young's modulus, there are empirically derived mathematical formulas that are useful for converting between them. The formula used by the Applicant (employing Microsoft Excel) was "EXP((Durometer+50)*0.0235−0.6403)" wherein Durometer refers to the Shore D durometer value. The Shore D durometer value of 73.2 for the fourth adhesive material (Crystalbond™ 509) lies between Shore D durometer values for solid truck tires (having a Shore D value of about 50) and for high density polyethylene hard hats (having a Shore D value of about 75). Also, the Shore D durometer value for the fourth adhesive material is significantly higher than measured Shore D durometer values of 50.51 and 54.25 for waxes (i.e., SHIFTWAX 7607 commercially available from NIKKA Seiko, and Galaxy Wax commercially available from Galaxy Technologies, respectively) that were tested by Applicant and determined to be unsuitable for inducing fracture of crystalline material along a subsurface damage region using thermally induced spontaneous separation methods and mechanically induced separation methods described herein. The wax materials were determined to have insufficient cohesive strength to induce fracture, with the wax materials observed to come apart within the wax itself. This is consistent with online descriptions indicating that wax has a very weak intermolecular attractive force (London Forces) such that it does not hold onto other molecules very strongly.

Other adhesives beyond the thermoplastic materials described hereinabove may be used, as will be recognized by one skilled in the art following review of the present disclosure. In certain embodiments, an adhesive material may include a glass transition temperature of greater than 0° C., greater than 5° C., greater than 10° C., greater than 20° C., greater than 25° C., greater than 30° C., greater than 35° C., or any suitable higher threshold. In certain embodiments, the preceding lower threshold values may be bounded from above (where appropriate) by upper threshold values of less than about 250° C., less than about 200° C., less than about 150° C., less than about 125° C., or less than about 100° C. Such adhesive materials may avoid the need for cooling to dramatically low temperatures (e.g., below −75° C. or below −100° C., requiring liquid nitrogen or similar coolants). When going to very low temperatures below negative 100° C. using liquid nitrogen, the inventors have observed catastrophic adhesive failure using thermoplastic adhesive material disclosed previously herein, depending on the time of exposure. Such thermoplastic materials appear to be subject to cracking and crazing at very low temperatures, suggesting that dramatically low temperatures (e.g., negative 100° C. or lower) should be avoided.

One class of adhesive material that requires cooling to dramatically low temperatures is silicones (including PDMS), which has a glass transition temperature ($T_g$) range of −110° C. to −140° C. Silicones may be difficult to readily remove. Silicone exhibits a very low elastic modulus above its glass transition temperature, but such modulus changes by orders of magnitude into the GPa range when the material is cooled below its glass transition temperature. The inventors tested silicone as a bonding material between a SiC ingot and a sapphire carrier in an attempt to induce spontaneous fracture along a subsurface laser damage region due to CTE mismatch by cooling the carrier to a temperature of about −110° C. Fracture was not successfully achieved. It is theorized that the silicone material acted as a stress absorber during cooldown of the sapphire carrier, adhesive material, and SiC ingot, and that the CTE mismatch between the carrier and crystalline material was insufficiently high when the $T_g$ of silicone was reached. Although the CTE mismatch between the sapphire carrier and SiC ingot was significant at room temperature, the CTE mismatch was reduced to a relatively insignificant value at the low temperature of −110° C. That said, even if it were hypothetically assumed that silicone did exhibit effective stress transfer properties, it may still be beneficial to avoid ultra-low temperatures (e.g., liquid nitrogen temperatures) for separating device wafers, since exposure to ultra-low temperatures can impart damage to devices.

In certain embodiments, an adhesive material may comprise a chemically crosslinked adhesive, such as an epoxy. In certain embodiments, a multi-part, reactive catalyst-type bonding agent (e.g., a two part epoxy) may be used to join a rigid carrier and a crystalline material substrate.

Although a layer of adhesive material of any suitable thickness may be used, in certain embodiments, an adhesive layer may be relatively thin (e.g., less than about 100 microns, less than about 50 microns, less than about 40 microns, less than about 30 microns, less than about 20 microns, or less than about 10 microns (with any of the foregoing upper thresholds optionally being limited where appropriate by a lower threshold of at least about 2 microns, at least about 5 microns, or at least about 10 microns). Providing a thin adhesive layer may promote more direct transfer of shear stress between a rigid carrier and a crystalline material during fracture, thereby lessening the force and time required to complete fracture. However, an optimal adhesive thickness may depend on multiple factor such as elastic modulus of the adhesive, bonding method, separation technique, etc.

Considering the existence of different types of adhesives that may be used for joining a rigid carrier and a crystalline material, various adhesive bonding methods may be employed. In certain embodiments, thermocompression (involving application of compressive force at high temperature) may be used. In one example, a force of 1800 to 3000 N may be applied to a 150 mm diameter crystalline material substrate (e.g., 4H SiC) affixed by adhesive to a rigid carrier (e.g., of single crystal sapphire) during exposure to a temperature of 180° C. In certain embodiments, compressive force may be applied during impingement of UV emissions on a UV-curable adhesive material between a rigid carrier and a crystalline material substrate. When liquid or flowable bond media is used, in certain embodiments the bond media may extend partially up sidewalls of a crystalline material substrate (and along a proximal surface of a rigid carrier) upon squeeze-out during bonding to form a peripheral lip around at least a portion (or an entirety) of a perimeter of a crystalline material, wherein such peripheral lip may serve to slightly increase bond strength between the substrate and the carrier.

In certain embodiments, plasma activated anodic bonding or any other suitable anodic bonding process may be used to bond a rigid carrier and a crystalline material substrate. Details concerning anodic bonding between crystalline material substrates and carriers are disclosed in U.S. Patent Application Publication No. 2016/0189954, with the contents of such publication hereby being incorporated by reference herein, for all purposes.

In certain embodiments, to facilitate adhesion, proximal surfaces of a rigid carrier and/or a crystalline material may be roughened, textured, and/or surface activated by any suitable methods prior to bonding (e.g., including adhesive bonding). Examples of surface treatments that may be performed include, but are not limited to, micropatterning, mechanical abrasion, chemical etching, reactive ion etching, and plasma treatment. In certain embodiments, a rigid carrier may include single crystal sapphire having a micropatterned surface.

In certain embodiments, a rigid carrier may include one or more features configured to facilitate de-bonding when it is desired to remove a (previously parted) portion of crystalline adhered to the carrier. Examples of such features may include perforations and/or micropatterned surfaces to provide holes or cavities arranged proximate to, and/or permitting fluid communication with, a proximal surface of a rigid carrier.

Various processes may be used to promote de-bonding between a (previously parted) portion of crystalline material and a rigid carrier. In certain embodiments, thermal, mechanical, chemical, and/or photonic de-bonding may be employed. In certain embodiments, de-bonding may be performed by thermal slide-off, which involves heating of an adhesively bound assembly to a temperature sufficient to cause adhesive material to soften and/or flow, while the rigid carrier is fixed in place (e.g., held by a vacuum chuck) and external shear stress may be applied to the portion of crystalline material to cause the portion to slide laterally away from the rigid carrier. In certain embodiments, an adhesive may contain a UV-absorbing material, whereby impingement of UV emissions on the adhesive after parting may be used to cause degradation (e.g., by heating) of adhesive between a crystalline material portion and a carrier, permitting the crystalline material portion to be removed. Chemical removal of adhesive may utilize any suitable chemical agent(s) sufficient to reduce adhesion and/or dissolve an adhesive material. If chemical de-bonding is used, then one or more access openings (e.g., perforations) may be provided in the carrier to enable the chemical(s) to contact the adhesive material.

Subsurface Laser Damage Formation

Tools for forming laser subsurface damage in crystalline materials are known in the art and commercially available from various providers, such as Disco Corporation (Tokyo, Japan). Such tools permit laser emissions to be focused within an interior of a crystalline material substrate, and enable lateral movement of a laser relative to the substrate. Typical laser damage patterns include formation of parallel lines that are laterally spaced relative to one another at a depth within a crystalline material substrate. Parameters such as focusing depth, laser power, translation speed, and subsurface damage line spacing may be adjusted to impart laser damage, but adjustment of certain factors involves tradeoffs. Increasing laser power tends to impart greater subsurface damage that may increase ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices). Reducing lateral spacing between subsurface laser damage lines may also increase ease of fracturing, but a reduction in spacing between laser damage lines increases the number of translational passes between a substrate and a laser, thereby reducing tool throughput.

Figure 7:
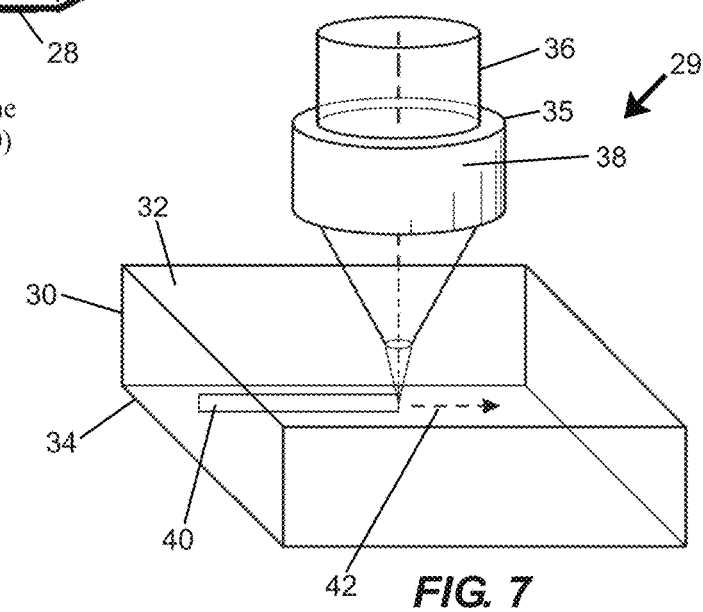
FIG. 7 is a perspective view schematic of a moveable laser tool configured to focus laser emissions within an interior of a crystalline material to form subsurface damage.

FIG. 7 is a perspective view schematic of one example of a laser tool 29 configured to focus laser emissions within an interior of a crystalline material 30 to form subsurface damage 40. The crystalline material 30 includes an upper surface 32 and an opposing lower surface 34, and the subsurface damage 40 is formed in the interior of the crystalline material 30 between the upper and lower surfaces 32, 34. If the crystalline material comprises SiC, the upper surface 32 through which laser emissions are directed may be a C-terminated surface. Laser emissions 36 are focused with a lens assembly 35 to yield a focused beam 38, with a focal point thereof being in the interior of the crystalline material 30. Such laser emissions 36 may be pulsed at any suitable frequency (typically in the nanosecond, picosecond, or femtosecond range) and beam intensity, with a wavelength below the bandgap of the crystalline material 30 to permit the laser emissions 36 to be focused at a targeted depth below a surface thereof. At the focal point, the beam size and short pulse width results in an energy density high enough to result in very localized absorption that forms subsurface damage. One or more properties of the lens assembly 35 may be altered to adjust a focal point of the focused beam 38 to a desired depth within the crystalline material 30. Relative lateral motion (e.g., lateral translation) between the lens assembly 35 and the crystalline material 30 may be effected to propagate the subsurface damage 40 in a desired direction, as schematically illustrated by dashed line 42. Such lateral movement may be repeated in various patterns, such as illustrated in FIGS. 8A-8D.

Figure 8D:
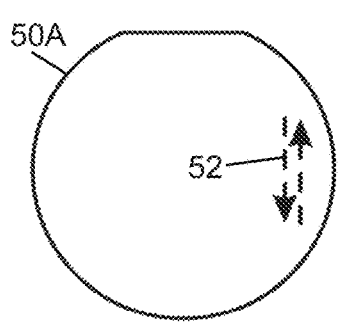
Figure 8D:
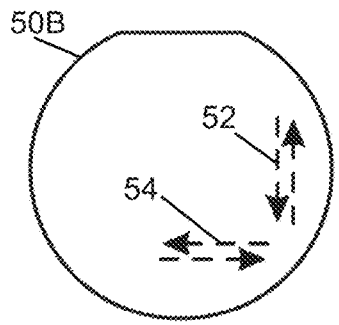
Figure 8D:
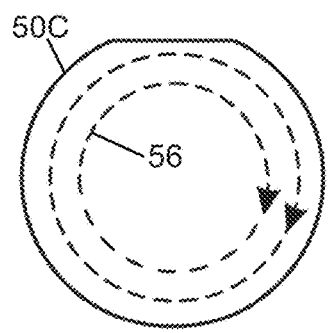
Figure 8D:
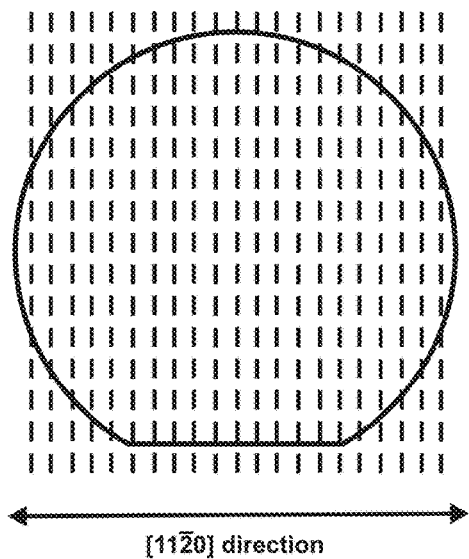

FIGS. 8A-8D provide exemplary laser tool travel paths relative to a crystalline material for formation of subsurface damage within the crystalline material. In certain embodiments, a laser tool portion (e.g., including a lens assembly) may be configured to move while a crystalline material is stationary; in other embodiments, a laser tool portion may be held stationary while a crystalline material is moved relative to the tool portion. FIG. 8A shows y-direction linear scanning movement 52 suitable for forming subsurface damage in a pattern of laterally spaced parallel lines within a first crystalline material 50A. FIG. 8B shows y-direction and x-direction linear scanning movements 52, 54 suitable for forming subsurface damage in a pattern of a first group of laterally spaced parallel lines that intersect with a second group of laterally spaced parallel lines within a second crystalline material 50B. FIG. 8C shows circular movements 56 suitable for forming subsurface damage in concentric circular patterns within a third crystalline material 50C. FIG. 8D shows y-direction linear scanning movement 56 over (and beyond) an entire surface of a crystalline material 50D, sufficient to form parallel subsurface laser damage lines distributed through the crystalline material 50D, with the damage lines being perpendicular a [11$\overline{2}$0] direction of a hexagonal crystal structure of the crystalline material 50D. If desired, other subsurface damage patterns (e.g., spiral, honeycomb, herringbone, etc.) may be formed.

In certain embodiments, a crystalline material processing method as disclosed herein may include some or all of the following items and/or steps. A second carrier wafer may be attached to a bottom side of a crystalline material substrate (e.g., ingot). Thereafter, a top side of the crystalline material substrate is ground or polished, such as to provide an average surface roughness $R_a$ of less than about 5 nanometers to prepare the surface for transmitting laser energy. Laser damage may then be imparted at a desired depth or depths within the crystalline material substrate, with spacing and direction of laser damage traces optionally being dependent on crystal orientation of the crystalline material substrate. A first carrier is bonded to the top side of the crystalline material substrate. An identification code or other information linked to the first carrier is associated with a wafer to be derived from the crystalline material substrate. Alternatively, laser marking may be applied to the wafer (not the carrier) prior to separation to facilitate traceability of the wafer during and after fabrication. The crystalline material substrate is then fractured (using one or more methods disclosed herein) along a subsurface laser damage region to provide a portion of the crystalline material substrate bound to the first carrier, and a remainder of the crystalline material substrate being bound to the second carrier. Both the removed portion of the crystalline material substrate and the remainder of the crystalline material substrate are ground smooth and cleaned as necessary to remove residual subsurface laser damage. The removed portion of the crystalline material substrate may be separated from the carrier. Thereafter, the process may be repeated using the remainder of the crystalline material substrate.

Whereas wire sawing of SiC wafers typically entails kerf losses of at least about 250 microns per wafer, laser- and carrier-assisted separation methods disclosed herein and applied to SiC may achieve kerf losses in a range of from 80 to 140 microns per wafer.

Figure 9:
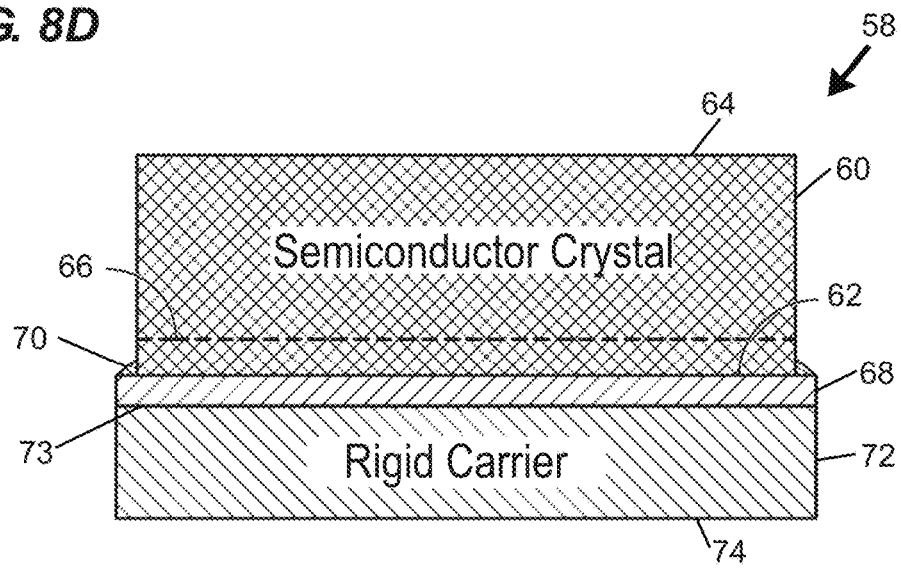
FIG. 9 is a side cross-sectional schematic view of an assembly including a crystalline material substrate having subsurface laser damage and joined to a rigid carrier with an intermediately arranged adhesive material, and including an exposed adhesive lip around at least a portion of the perimeter of the crystalline material along the interface with the rigid carrier.

FIG. 9 is a side cross-sectional schematic view of an assembly 58 including a crystalline material substrate 60 having subsurface laser damage 66 and joined to a rigid carrier 72 with an intermediately arranged layer of adhesive material 68. The assembly 58 is suited to promote removal of a portion of the crystalline material substrate 60 along the subsurface laser damage 66 by fracturing the crystalline material substrate 60 along the subsurface laser damage 66 utilizing any or more methods disclosed herein. The crystalline material substrate 60 includes a first surface 62 proximate to the adhesive material 68, and includes an opposing second surface 64, with the subsurface laser damage 66 being closer to the first surface 62 than to the second surface 64. The rigid carrier 72 also includes a first surface 73 proximate to the adhesive material 68 and a second surface 74 that opposes the first surface 73. The adhesive material 68 extends between the first surface 62 of the crystalline substrate 60 and the first surface 73 of the rigid carrier 72. As shown, an exposed adhesive lip 70 is provided around at least a portion of (or, optionally, an entirety of) the perimeter of the crystalline material substrate 60 proximate to the first surface 62 of the crystalline material substrate 60. In certain embodiments, the rigid carrier 72 comprises a material having a greater CTE than a CTE of the crystalline material substrate 60 over a desired temperature range, and fracturing of the crystalline material 60 may be initiated by cooling at least the rigid carrier 72 (or the carrier and the substrate 60) by exposure to a low temperature medium (e.g., a cooling liquid) or condition.

Fracturing by Cooling Rigid Carrier with Carrier/Substrate CTE Mismatch

Figure 10A:
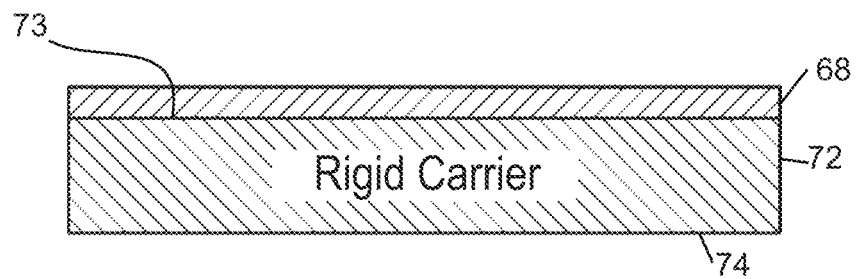
FIG. 10A is a side cross-sectional schematic view of a rigid carrier having adhesive material joined to a surface thereof.

FIGS. 10A-10F illustrate steps of a semiconductor processing method according to one embodiment of the present disclosure, utilizing a CTE mismatched rigid carrier joined to a crystalline material. FIG. 10A is side cross-sectional schematic view of a rigid carrier 72 having a layer of adhesive material 68 joined to a first surface 73 of the rigid carrier 72, and having a second surface 74 that opposes the first surface 73. To promote better adhesion to the first surface 73, such surface may be etched (e.g., by reactive ion etching) prior to application of the adhesive material 68. The adhesive material 68 may be applied by any suitable methods, such as spin-coating, spraying, dipping, rolling, or the like.

Figure 10B:
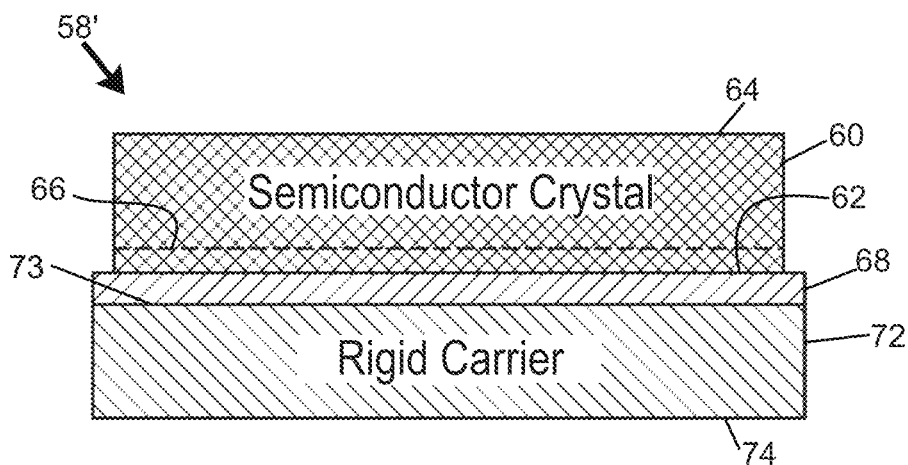
FIG. 10B is a cross-sectional schematic view of an assembly including the rigid carrier and adhesive material of FIG. 10A joined to a crystalline material substrate having a subsurface laser damage region proximate to the adhesive material, with the assembly being similar to that shown in FIG. 9 but lacking an exposed adhesive lip.

FIG. 10B is a cross-sectional schematic view of an assembly 58' including the rigid carrier 72 and adhesive material 68 of FIG. 10A joined to a crystalline material substrate 60 having a subsurface laser damage region 66 therein. As shown, the rigid carrier 72 has a greater diameter or lateral extent than the crystalline material substrate 60. The assembly 58' of FIG. 10B is similar to that shown in FIG. 9, but lacks an exposed adhesive lip shown in FIG. 9. With continued reference to FIG. 10B, the crystalline material substrate 60 includes a first surface 62 proximate to the adhesive material 68, and includes an opposing second surface 64, with the subsurface laser damage 66 being closer to the first surface 62 than to the second surface 64 of the substrate 60. The rigid carrier 72 also includes a first surface 73 proximate to the adhesive material 68, such that the adhesive material 68 extends between the first surface 62 of the crystalline substrate 60 and the first surface 73 of the rigid carrier 72. The adhesive material 68 may be cured according to the requirements of a selected bonding method (e.g., high temperature thermo-compression adhesive bonding, compression-aided UV bonding, chemically reactive bonding, etc.). Although the second surface of the crystalline material substrate 60 is illustrated as being bare, in certain embodiments, a second carrier (not shown) may be bonded (either temporarily or permanently) to the second surface 64 of the substrate 60, with the second carrier optionally being no wider than the substrate 60 and/or being CTE matched with the substrate 60.

Figure 10C:
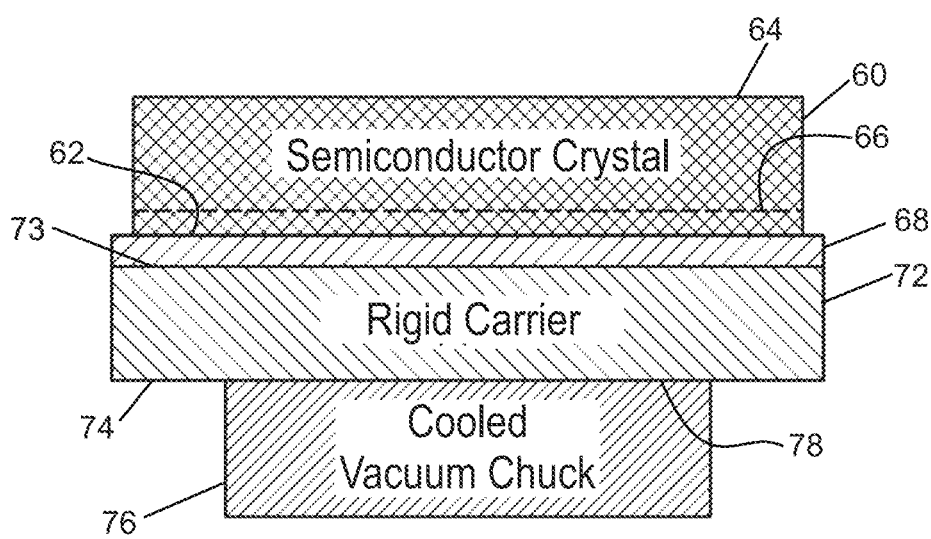
FIG. 10C is a cross-sectional schematic view of the assembly of FIG. 10B, with a surface of the rigid carrier being positioned on a cooling apparatus in the form of a liquid-cooled chuck.

FIG. 10C is a cross-sectional schematic view of the assembly of FIG. 10B, following positioning of the second surface 74 of the rigid carrier 72 on a support surface 78 of cooling apparatus in the form of a cooled chuck 76 configured to receive a cooling liquid. Contact between the rigid carrier 72 and the cooled chuck 76 causes heat to be transferred from the rigid carrier 72 to the cooled chuck 76 such that the rigid carrier 72 is cooled rapidly. During such cooling process, the rigid carrier 72 will laterally contract to a greater extent than the crystalline material substrate 60, thereby exerting shear stress on the crystalline material substrate 60. Due to the presence of subsurface laser damage 66 near the adhesive layer 68 that joins the rigid carrier 72 to the crystalline material substrate 60, the exertion of shear stress on the substrate 60 causes the crystalline material to fracture along or proximate to the subsurface laser damage region 66.

In certain embodiments, the cooled chuck 76 has a smaller diameter than a diameter of the rigid carrier 72. It has been found that cooling of the assembly of FIG. 10C is only required from the second surface 74 of the rigid carrier 72 and may only be required over a central portion of the rigid carrier 72, to create a temperature differential both laterally (i.e., from center to edge) and vertically (i.e., from the crystalline material substrate 60 to the rigid carrier 72). Although the cooled chuck 76 may be supplied with a cooling liquid, it is not necessary for the rigid carrier 72 to reach the liquid nitrogen temperature (−160° C.) to successfully complete thermal-induced fracture of the crystalline material substrate 60. Favorable separation results have been obtained for fracturing single SiC material supported by a crystalline sapphire substrate using a cooled chuck maintained at −70° C. Such temperature can be maintained using various cooling liquids, such as liquid methanol (which remains flowable above its freezing point at −97° C.) received from a two-phase pumped evaporative cooling system. Favorable separation results have also been obtained by cooling a carrier, adhesive, and a substrate in a freezer maintained at −20° C., wherein such temperature may be maintained using a single phase evaporative cooling system. The ability to use a single phase evaporative cooling system or a two-phase pumped evaporative cooling system rather than liquid nitrogen significantly reduces operating costs.

Figure 10D:
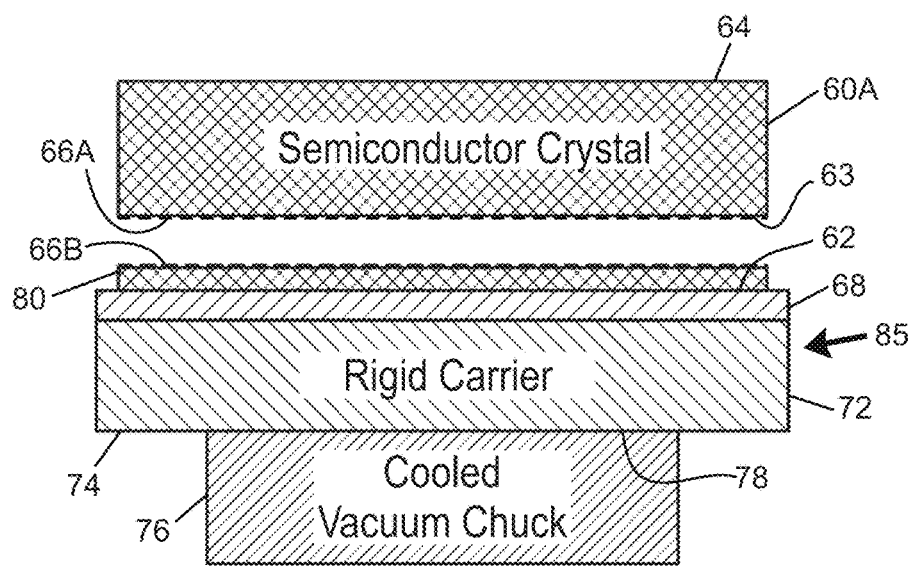
FIG. 10D is a cross-sectional schematic view of a majority of the crystalline material substrate separated from a bonded assembly (atop the liquid-cooled chuck) including the rigid carrier and a portion of the crystalline material removed from the substrate, following fracture of the crystalline material along the subsurface laser damage region.

FIG. 10D is a cross-sectional schematic view of a remainder of the crystalline material substrate 60A separated from a bonded assembly (atop the liquid-cooled chuck 76) that includes the rigid carrier 72, adhesive material 68, and a portion of the crystalline material 80 removed from the remainder of the substrate 60A, following fracture of the crystalline material along the subsurface laser damage region. The remainder of the crystalline material substrate 60A is bounded by a new first surface 63 (having residual laser damage 66A) that opposes the second surface 64. Correspondingly, the removed portion of crystalline material 80 is bounded by a new second surface 82 (having residual laser damage 66B) that opposes the first surface 62. Thereafter, the bonded assembly 85 including the rigid carrier 72, the adhesive material 68, and the removed portion of crystalline material 80 may be withdrawn from the cooled chuck 76.

Figure 10E:
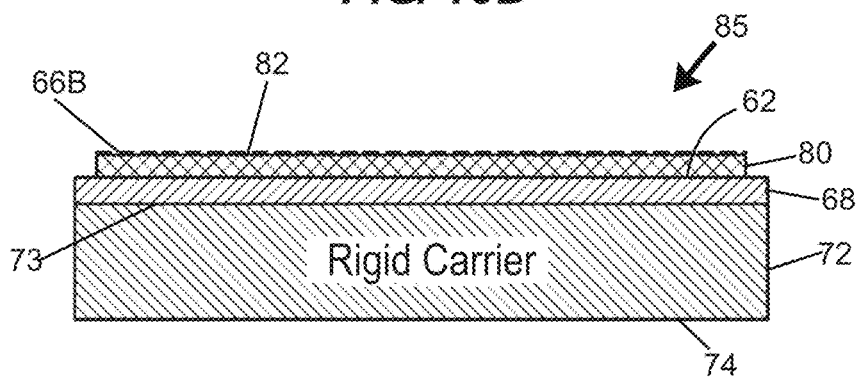
FIG. 10E is a cross-sectional schematic view of the bonded assembly of FIG. 10D following removal from the liquid-cooled chuck, with residual laser damage along an upward facing surface.

FIG. 10E is a cross-sectional schematic view of the bonded assembly 85 of FIG. 10D, following withdrawal from the liquid-cooled chuck 76. Maintaining the removed portion of crystalline material 80 attached to the rigid carrier 72 beneficially provides mechanical support for the removed portion of crystalline material 80 to permit one or more surface processing steps (e.g., grinding, polishing, etc.) to be performed on the new surface 82, to remove the residual laser damage 66B and achieve a desirable thickness of the crystalline material 80 (e.g., via grinding, optionally followed by chemical mechanical planarization (CMP) and/or various polishing steps). In certain embodiments, laser damage removal and thinning may include sequential grinding/polishing operations with a 2000 grit polishing pad and a 7000 grit polishing pad, and any suitable polishing and cleaning steps to prepare the new surface 82 for subsequent operations (e.g., surface implantation, laser marking (e.g., proximate to a wafer flat), formation of epitaxial layers, metallization, etc.).

Figure 10F:
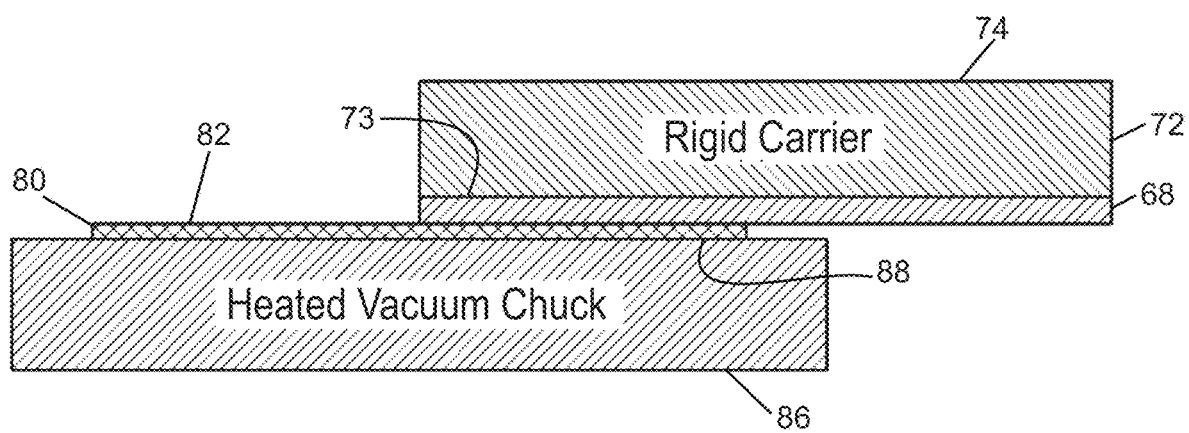
FIG. 10F is a cross-sectional schematic view of the portion of the crystalline material supported by a heated vacuum chuck, with the rigid carrier and adhesive material being laterally translated away from the crystalline material portion following thermal softening and release of the adhesive material.

FIG. 10F is a cross-sectional schematic view of the removed portion of the crystalline material 80 supported by an upper surface 88 of a heated vacuum chuck 86, with the rigid carrier 72 and adhesive material 68 being laterally translated away from the removed portion of crystalline material 82 portion following elevated temperature softening and release of the adhesive material 68. That is, the heated vacuum chuck 86 may heat the adhesive material 68 to a sufficient temperature to soften and/or flow, such that upon application of an external shear stress to the second surface 74 of the rigid carrier 72, the rigid carrier 72 is permitted to laterally translate away from the removed portion of crystalline material 82 that is temporarily held in place by the heated vacuum chuck 86. Thereafter, the heated vacuum chuck 86 may be deactivated, and the removed portion of crystalline material 82 embodies a free-standing material. If desired, any residue from the adhesive 68 may be removed and cleaned from the first surface 73 of the rigid carrier 72, and the rigid carrier 72 optionally may be re-used for another fracturing operation. The removed crystalline material can then be used as a growth substrate for deposition of one or more epitaxial layers and conducting metal layers to from a device wafer then singulated to form discrete semiconductor devices.

In certain embodiments, a cooled chuck may be placed within a coolant bath (e.g., a bath of liquid nitrogen or other coolant liquid, such as methanol received from a pumped evaporative cooling system) to effectuate thermal-induced fracturing of a crystalline material substrate supported by an appropriate CTE mismatched rigid carrier.

Figure 11:
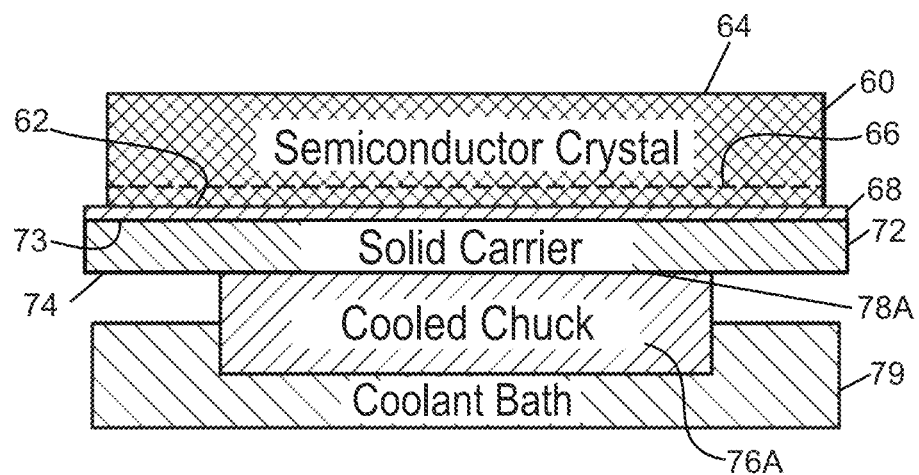
FIG. 11 is a cross-sectional schematic view of an assembly according to FIG. 10C on a cooling apparatus in the form of a liquid-cooled chuck arranged in a bath of liquid coolant.

FIG. 11 is a cross-sectional schematic view of an assembly according to FIG. 10C on a cooling apparatus in the form of a cooled chuck 76A arranged in a bath of cooling liquid 79 (e.g., methanol received from a pumped evaporative cooling system, or liquid nitrogen). Adhesive material 68 is arranged between a rigid carrier 72 and a crystalline material substrate 60 having a subsurface laser damage region 66 that is closer to a first surface 62 than an opposing second surface 64 of the substrate 60, with the first surface 62 contacting the adhesive material 68. The rigid carrier 72 includes a first surface 73 contacting the adhesive material 68, and an opposing second surface 74 arranged in contact with a support surface 78A of a cooled chuck 76A. The cooled chuck 76A has a smaller diameter than a diameter of the rigid carrier 72. The cooled chuck 76A is arranged in a coolant bath (e.g., a liquid nitrogen bath) sufficient to lower the temperature of the cooled chuck 76A to at or near the coolant temperature. In certain embodiments, the cooled chuck 76A and the coolant bath 79 may be arranged in a closeable insulating vessel (not shown), whereby the vessel may be selectively opened to permit a rigid carrier 72 with attached adhesive material 68 and crystalline material substrate 60 with subsurface laser damage 66 to be placed in contact with the cooled chuck 76A for rapid fracture of the single crystalline material substrate 60 along the subsurface laser damage region 66.

Figure 12:
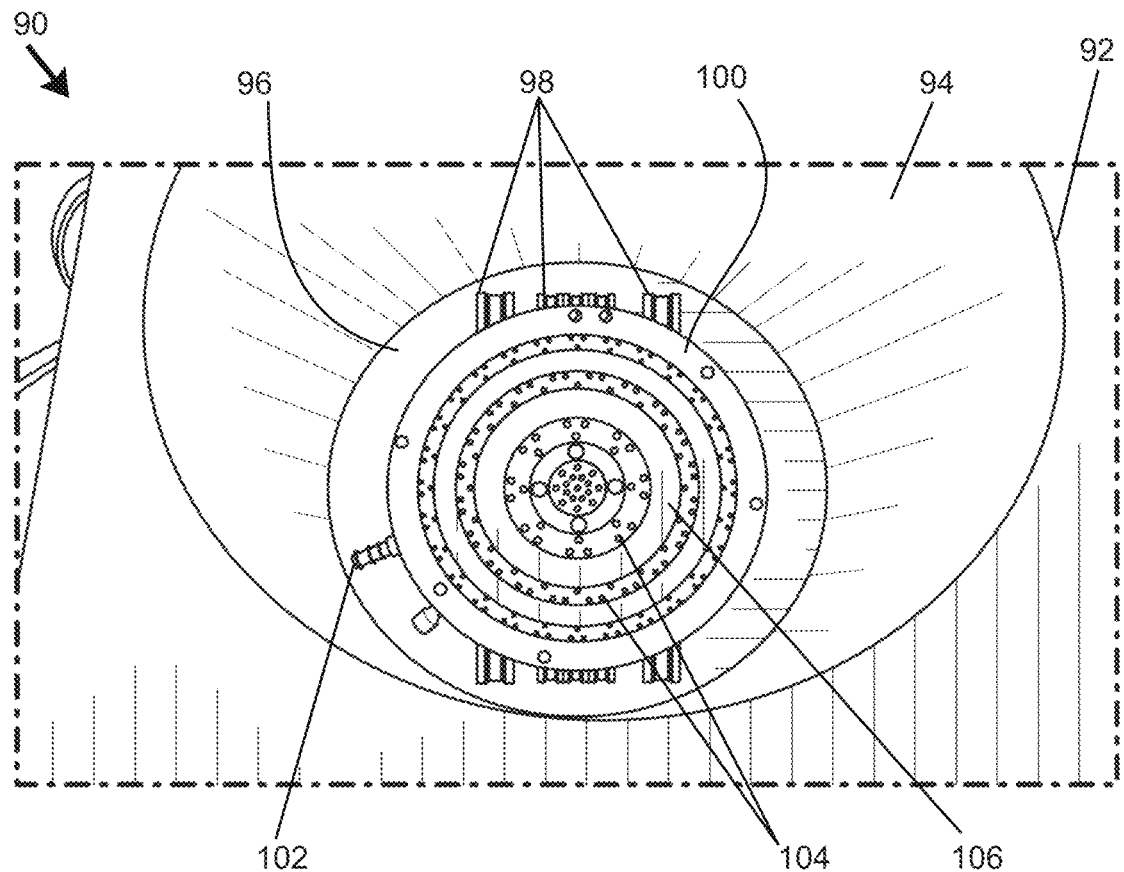
FIG. 12 is a perspective view illustration of a cooling apparatus including a vacuum chuck arranged proximate to a bottom wall of a vessel arranged to receive a liquid coolant (e.g., methanol received from an evaporative cooling system, liquid nitrogen, or the like).

FIG. 12 is a perspective view illustration of a cooling apparatus 90 including a vessel 92 having a cylindrical sidewall 94 bounded by a bottom wall 96, with a chuck 100 supported above the bottom wall 96 by thermally conductive spacers 98 (e.g., aluminum rails). Although the chuck 100 is of a type sufficient for applying suction to a workpiece, the vacuum suction functionality (provided by suction port 102 configured to be connected to a vacuum source, and perforations 104 arranged along a chuck upper surface 106) need not be provided during a cooling operation. In use, a cooling liquid may be supplied to the vessel 92 to contact the spacers 98 but not necessarily an entire width of the chuck 100 itself. Heat may be transferred from the chuck 100 through the thermally conductive spacers 98 to the cooling liquid. In experiments, a vacuum chuck 100 according to the illustrated design has been maintained at a temperature around −70° C. The carrier side of an assembly 58' as shown in FIG. 10B may be placed on the chuck upper surface 106 to cause the rigid carrier to be rapidly cooled. Due to CTE mismatch between the carrier and the crystalline material substrate adhered thereto, thermal-induced fracture will be induced along a subsurface laser damage region. Spontaneous separation of 4H—SiC has been observed by the inventors at temperatures up to about −20° C. using thermoplastic adhesives disclosed herein, without mechanical intervention.

Carrier Shape and Positioning Relative to Crystalline Material

As noted previously, rigid carrier(s) may desirably have lateral dimensions (e.g., diameter, or length and width) that are is at least as large as, or that exceed, corresponding dimensions of a substrate bonded thereto when used with methods as disclosed herein. FIGS. 13A-13E are top views of bonded assemblies including carriers of different shapes each joined to a substrate of crystalline material, with FIGS. 13F and 13G providing side cross-sectional views of the bonded assemblies of FIGS. 13D and 13E, respectively. FIG. 13A illustrates a first bonded assembly 110 including a generally circular substrate 112 having a flat 114 and a rounded portion 116 that opposes the flat 114, with the substrate 112 being bonded to a square-shaped carrier 118 that is substantially concentric with the substrate 112. FIG. 13B illustrates a second bonded assembly 120 including a generally circular substrate 122 having a flat 124 and a rounded portion 126 that opposes the flat 124, with the substrate 122 being bonded to a round carrier 128 that is substantially concentric with the substrate 122. Due to presence of the flat 124 that locally reduces diameter of the substrate 122, a larger border portion 129 of the carrier 128 is provided proximate to the flat 124. FIG. 13C illustrates a third bonded assembly 130 including a generally circular substrate 132 having a flat 134 and a rounded portion 136 that opposes the flat 134, with the substrate 132 being bonded to a round carrier 138 that is non-concentric with the substrate 132, such that the rounded portion 136 of the substrate 132 is substantially closer to an edge of the carrier 138 than a remainder of the substrate 132. A larger border portion 139 of the carrier 138 would be present opposite the rounded portion 136 even if the flat 134 were absent, but with the flat 134 being present, the border portion 139 of the carrier 138 is even larger than the border portion 129 shown in FIG. 13B. The presence of a locally increased border at one region and a locally decreased border at one opposing region, such as shown in FIG. 13C, may be advantageous to permit mechanical fracture of the substrate 132 bonded to the carrier 138 in certain embodiments, with the locally increased border accommodating presence of a prying tool (not shown), and the locally decreased border providing limited overhang that might otherwise resist tilting motion of an upper substrate (depending on geometry of a separation apparatus).

FIGS. 13D and 13F illustrate a fourth bonded assembly 140 including a generally circular substrate 142 having a flat 144 and a rounded portion 146 that opposes the flat 144, with the substrate 142 being bonded to a predominantly round carrier 148 that is substantially concentric with the substrate 142, but with the carrier 148 including a single laterally protruding tab portion 149 that provides a locally increased border proximate to the flat 144 of the substrate 142. The laterally protruding tab portion 149 of the carrier 148 may be registered with the flat 144 to permit a localized mechanical force to be applied in such a manner as to impart a bending moment tending to initiate fracture in a direction perpendicular to the flat 144. As shown in FIG. 13F, a second carrier 148' of the same or different shape may be provided under the substrate 142, with the subsurface laser damage region 143 being closer to the upper carrier 148. Presence of the protruding tab portion 149 permits a single prying tool (not shown) to be inserted between the carriers 148, 148'.

FIGS. 13E and 13G illustrate a fourth bonded assembly 150 including a generally circular substrate 152 having a flat 154 and a rounded portion 156 that opposes the flat 154, with the substrate 152 being bonded to a predominantly round carrier 158 that is substantially concentric with the substrate 152, but with the carrier 158 including opposing first and second laterally protruding tab portions 159A, 159B that provide a locally increased border areas, with one locally increased border area being proximate to the flat 154 of the substrate 152. The laterally protruding tab portions 159A, 159B of the carrier 158 may be registered with the flat 154 to permit localized mechanical forces to be applied in such a manner as to impart bending moments tending to initiate fracture in directions perpendicular to the flat 154. As shown in FIG. 13G, a second carrier 158' of the same or different shape may be provided under the substrate 152, with the subsurface laser damage region 153 being closer to the upper carrier 158. Presence of the laterally protruding tab portions 159A, 159B permit tools (not shown) to be inserted between the carriers 158, 158' for imposition of mechanical force. Additional details regarding application of mechanical force to initiate fracture of a crystalline material along a subsurface laser damage region are discussed hereinafter in connection with FIGS. 15A-15D and 16A-16B.

Although FIGS. 13F and 13G show upper and lower carriers 148, 148', 158, 158' having lateral dimensions that exceed those of a substrate 142, 152, it is to be appreciated that the lower carriers 148', 158' do not be larger than the corresponding substrates 142, 152 in certain embodiments (e.g., if the substrates 142, 152 are held by vacuum chucks or other means, to provide a basis for resisting mechanical forces applied to the upper carriers 148, 158.

Fracturing Induced by Ultrasonic Energy

Another method for effectuating fracture along a laser-induced subsurface damage zone of a crystalline material bonded to a rigid carrier involves application of ultrasonic energy to the crystalline material while in the bonded state. FIG. 14 is a cross-sectional schematic view of an assembly 58A including a crystalline material 60A having subsurface laser damage 66A' and bonded to a rigid carrier 72A using an intervening adhesive material 68A, with assembly 58A arranged in a liquid bath 165 of an ultrasonic generator apparatus 160. The apparatus further includes a vessel 162 arranged in contact with an ultrasonic generating element 164, with the vessel 162 containing the liquid bath 165. Presence of the rigid carrier 72A may reduce or eliminate breakage of the crystalline material 60A when subjected to ultrasonic energy, particularly if residual stress remains between the rigid carrier 72A and the crystalline material 60A prior to separation (e.g., due to a CTE mismatch). Such residual stress may reduce the amount of ultrasonic energy required to initiate fracture of crystalline material, thereby reducing the likelihood of material breakage. In this regard, it is noted that it is specifically contemplated to combine two or more fracturing techniques (e.g., CTE mismatch and ultrasonic induced fracturing; or CTE mismatch and mechanical induced fracturing; or ultrasonic induced and mechanical induced fracturing). In certain embodiments, liquid of an ultrasonic bath may be cooled either before or during application of ultrasonic energy.

Fracturing Induced by Mechanical Force

In certain embodiments, fracturing of a crystalline material bonded to a rigid carrier may be promoted by application of a mechanical force (e.g., optionally localized at one or more points) proximate to at least one edge of the carrier. Such force may impart a bending moment in at least a portion of the carrier, with such bending moment being transmitted to the subsurface laser damage region to initiate fracture.

As noted previously herein, multiple fracturing techniques may be used simultaneously or sequentially. Certain embodiments may utilize CTE mismatch in combination with mechanical force. If a significant CTE mismatch between a substrate and carrier is present and temperature is appropriately lowered, then less (or zero) mechanical force may be required to promote separation. Conversely, if a low (or zero) degree of CTE mismatch is present between a substrate and carrier, then more mechanical force may be required to complete separation.

Exemplary embodiments promoting fracture of crystalline material having subsurface damage and bonded to a rigid carrier by application of a mechanical force are shown in FIGS. 15A-15D and 16A-16B.

Figure 15A:
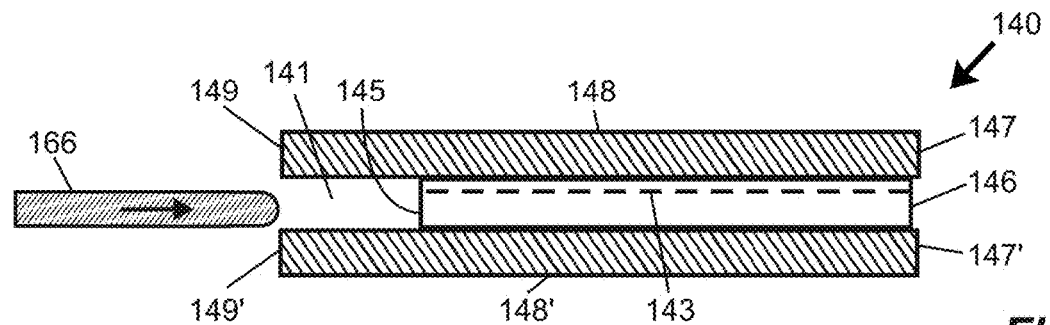
FIGS. 15A-15D are cross-sectional schematic views illustrating steps for fracturing a crystalline material having subsurface laser damage including application of a mechanical force proximate to one edge of a carrier to impart a bending moment in at least a portion of the carrier.
Figure 15B:
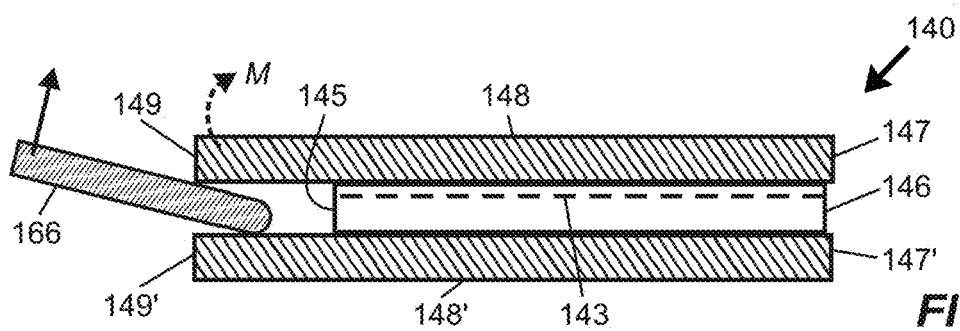
Figure 15C:
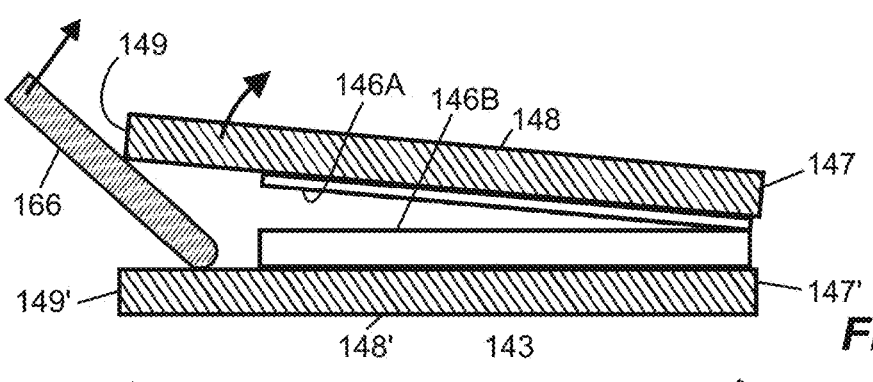
Figure 15D:
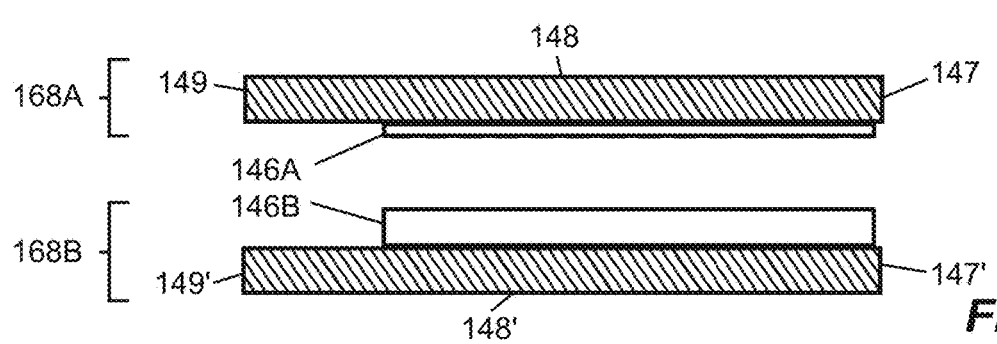

FIGS. 15A-15D are cross-sectional schematic views illustrating steps for fracturing a crystalline material substrate 142 having subsurface laser damage 143 by application of a mechanical force proximate to one edge of a carrier 148 to which the substrate 142 is bonded. Such figures utilize the same bonded assembly 140 shown in FIGS. 13D and 13F. The bonded assembly includes a crystalline material substrate 142 having a subsurface laser damage region 143 being bonded (according to any bonding method disclosed herein) between rigid carriers 148, 148'. Each rigid carrier 148, 148' includes a laterally protruding tab portion 149, 149' registered with a flat 145 of the substrate 142, providing a local increased border region that defines a recess 141 into which a tool 166 may be inserted. FIG. 15A illustrates a state prior to insertion of the tool 166 into the recess 141. FIG. 15B illustrates a state following insertion of the tool 166 into the recess, when the tool 166 is tilted upward, thereby exerting a prying force in a direction tending to promote separation between the rigid carriers 148, 148', thereby exerting a bending moment M on at least one carrier 148. In certain embodiments, the substrate 142 comprises a material (e.g., 4H—SiC) having hexagonal crystal structure and the bending moment M is oriented within ±5 degrees of perpendicular to a [11$\bar{2}$0] direction (or, equivalently, within ±5 degrees of parallel to a [1-100] direction) of the hexagonal crystal structure. Such orientation of the bending moment M is particularly desirable if the substrate 142 comprises off-axis (vicinal) material; this orientation may be less critical if the substrate 142 comprises on-axis material. FIG. 15C illustrates a state following initial fracture of the crystalline material substrate 142 along the subsurface laser damage region 143, whereby an upper portion 142A of the crystalline material remains bonded to the upper carrier 148, and a lower portion 142B of the crystalline material remains bonded to the lower carrier 148', and the upper carrier 148 is tilted upward relative to the lower carrier 148'. FIG. 15D illustrates a state after fracture is complete and the tool 166 is removed, yielding a first bonded assembly 168A (including the upper carrier 148 and the upper portion 142A of the crystalline material) separated from a second bonded assembly 168B (including the lower carrier 148' and the lower portion 142B of the crystalline material).

Figure 16A:
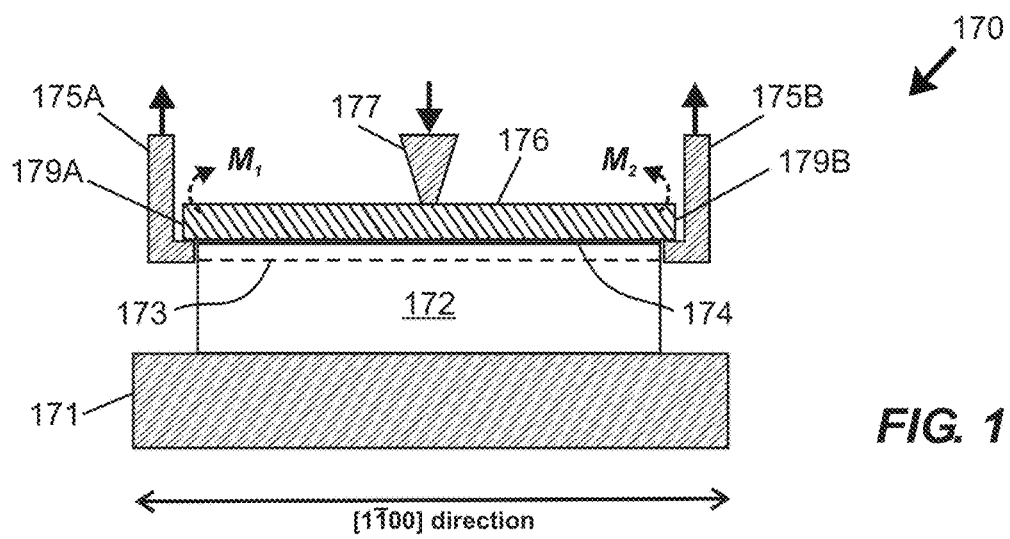
FIG. 16A is a cross-sectional schematic view of an apparatus for fracturing a crystalline material having subsurface laser damage with a carrier bonded thereto by applying mechanical force along opposing edges of a carrier to impart bending moments in portions of the carrier.
Figure 16B:
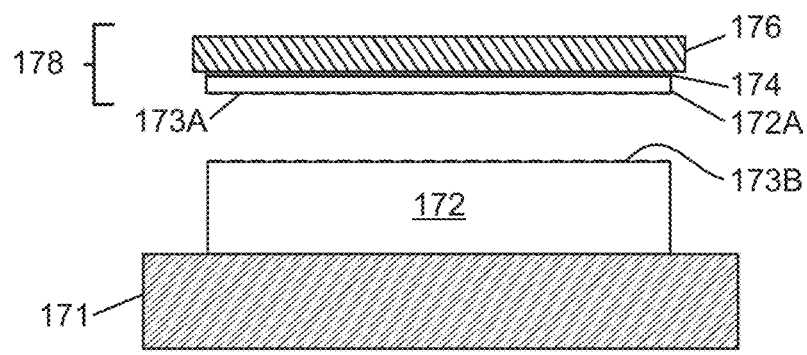
FIG. 16B is a cross-sectional schematic view of a bonded assembly including a rigid carrier and a substrate separated from a bulk crystalline material using the apparatus of FIG. 16A.

In certain embodiments, mechanical force may be applied proximate to opposing edges of a rigid carrier to which a substrate is bonded to promote fracture of a crystalline material having subsurface laser damage that is bonded to the carrier. FIG. 16A is a cross-sectional schematic view of an apparatus 170 for fracturing a crystalline material substrate 172 along a subsurface laser damage region 173 by applying mechanical force along opposing edges of a rigid carrier 176 (bonded to the substrate 172 with adhesive material 174) to impart bending moments $M_1$, $M_2$ in portions of the carrier 174. A restraining element 171 (e.g., a vacuum chuck, lower substrate, or other support) may be provided below the substrate 172. A lateral extent (e.g., diameter, or length and width) of the carrier 176 is greater than the substrate 172, with the carrier 176 forming opposing laterally protruding lips 179A, 179A that may be received by lifting members 175A, 175B. A central portion of the carrier 176 is restrained from being lifted (e.g., depressed downward) by a restraining member 177. When a vertical lifting force is applied to the laterally protruding lips 179A, 179B by the lifting members 175A, 175B, and the central portion of the carrier 176 is prevented from moving upward by the restraining member 177, opposing bending moments $M_1$, $M_2$ are exerted on the carrier 176, and such bending moments $M_1$, $M_2$ are transmitted to the substrate 172 by the adhesive material 174 to initiate fracture of the substrate 172 along the subsurface laser damage region 173. Thereafter, the restraining member 177 and lifting members 175A, 175B may be released, and fracture may be completed. FIG. 16B shows a state in which fracture is complete, producing a bonded assembly 178 including the rigid carrier 176, adhesive material 174, and a crystalline material substrate portion 172A separated from a remainder of the crystalline material 172. Exposed surfaces 173A, 173B of the crystalline material substrate portion 172A and the remainder of the crystalline material 172 may exhibit surface irregularities that may be reduced by conventional surface processing steps (e.g., grinding, CMP, and/or polishing). In certain embodiments, such surface processing steps may be performed on the crystalline material substrate portion 172A while such portion remains bonded to the rigid carrier 176.

Although FIGS. 15A-15D and 16A-16B provide examples of specific apparatuses to promote mechanical fracturing of substrates along subsurface laser damage regions, it is to be appreciated that other apparatuses may be used to practice methods disclosed herein, as will be recognized by one of ordinary skill in the art.

Subsurface Laser Damage Formation Before or After Carrier Bonding

Figure 17A:
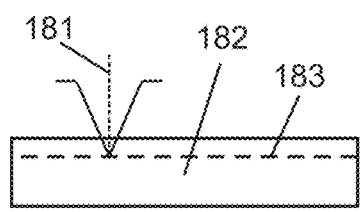
FIGS. 17A-17D are cross-sectional schematic views of formation of subsurface laser damage in a substrate of crystalline material by focusing laser emissions into a bare substrate, through a surface of a substrate supported by a carrier, through a carrier and an adhesive layer into a substrate, and through a carrier into a substrate, respectively.
Figure 17B:
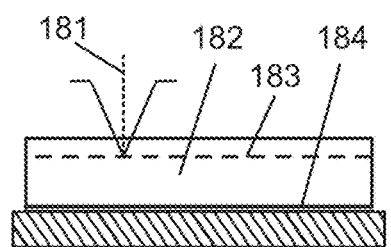
Figure 17C:
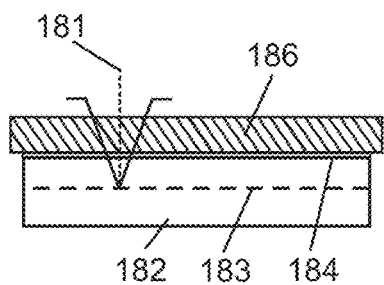
Figure 17D:
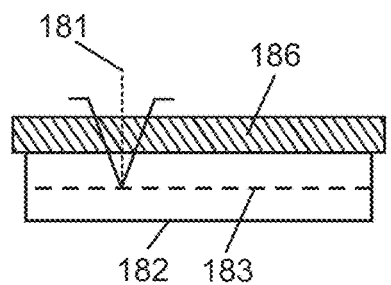

Although formation of laser subsurface damage in a crystalline material substrate prior to bonding to a rigid carrier has been previously described herein, in certain embodiments, a rigid carrier that is transparent to laser emissions of a desired wavelength may be bonded to a crystalline material substrate prior to subsurface laser damage formation. In such an embodiment, laser emissions may be transmitted through a rigid carrier and into an interior of the crystalline material substrate. Different carrier-substrate subsurface laser formation configurations are shown in FIGS. 17A-17C. FIG. 17A is a schematic view of laser emissions 181 being focused through a surface of a bare substrate 182 to form subsurface laser damage 183 within the substrate 182, whereby a rigid carrier may be affixed to the substrate 182 following formation of the subsurface laser damage. FIG. 17B is a schematic view of laser emissions 181 being focused through a surface of a substrate 182 form subsurface laser damage 183 within the substrate 182, with the substrate 182 having previously been bonded using adhesive material 184 to a rigid carrier 186. FIG. 17C is a schematic view of laser emissions 181 being focused through a rigid carrier 186 and adhesive 184 to form subsurface laser damage 183 within a substrate 182 previously bonded to the rigid carrier 186. In certain embodiments, a surface of the substrate 182 distal from the carrier 186 may include one or more epitaxial layers and/or metallization layers, with the substrate 182 embodying an operative electrical device prior to formation of the subsurface laser damage 183. FIG. 17D is a schematic view of laser emissions 181 being focused through a rigid carrier 186 into a substrate 182 (without an intervening adhesive layer) to form subsurface laser damage 183 within the substrate 182 previously bonded (e.g., via anodic bonding or other adhesiveless means) to the rigid carrier 186.

Device Wafer Splitting Process

In certain embodiments, a laser- and carrier-assisted separation method may be applied to a crystalline material after formation of at least one epitaxial layer thereon (and optionally at least one metal layer) as part of an operative semiconductor-based device. Such a device wafer splitting process is particularly advantageous for the ability to increase yield (and reduce waste) of crystalline material by significantly reducing the need for grinding away substrate material following device formation.

Figure 18A:
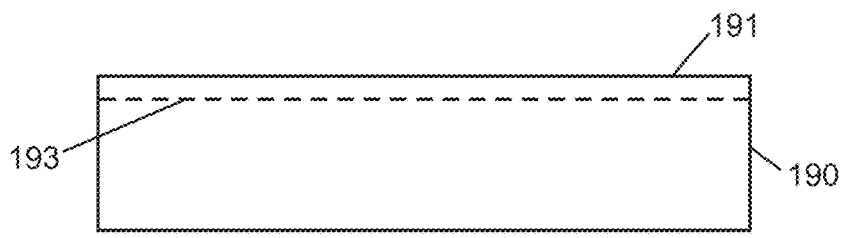
FIGS. 18A-18O are cross-sectional schematic views illustrating steps of a device wafer splitting process, according to which a thick wafer is fractured from a crystalline material, at least one epitaxial layer is grown on the thick wafer, and the thick wafer is fractured to form a first and second bonded assemblies each including a carrier and a thin wafer divided from the thick wafer, with the first bonded assembly including the at least one epitaxial layer as part of an operative semiconductor-based device.
Figure 18B:
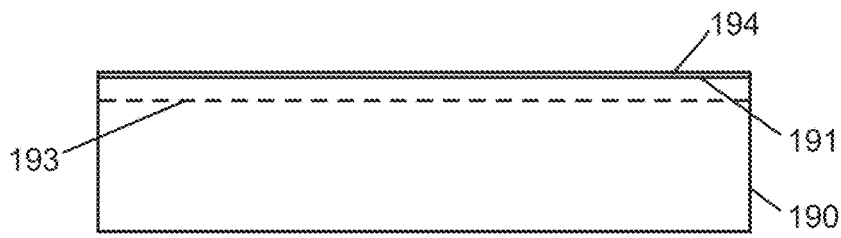
Figure 18C:
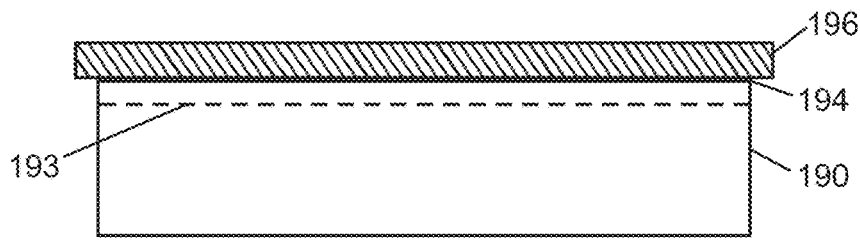
Figure 18D:
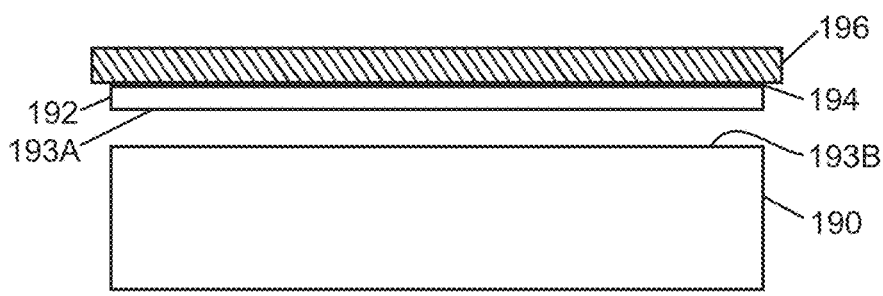
Figure 18E:
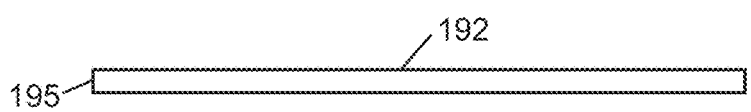
Figure 18F:
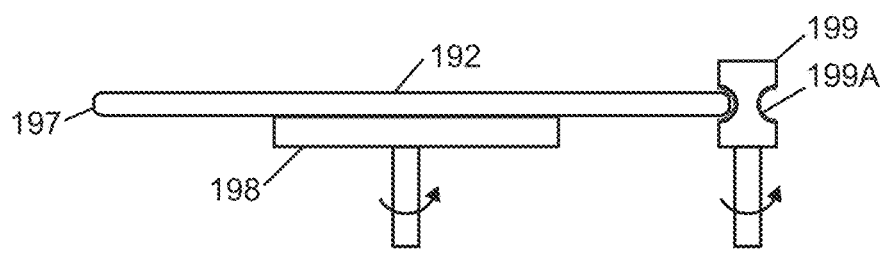
Figure 18G:
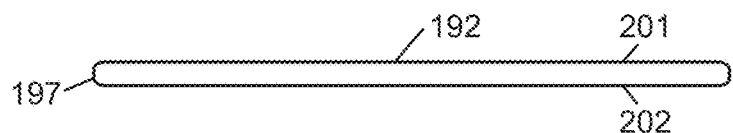
Figure 18H:
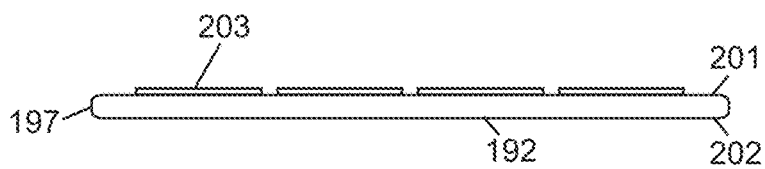
Figure 18I:
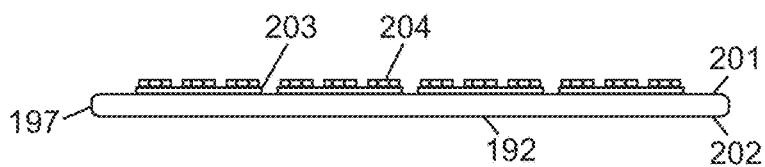
Figure 18J:
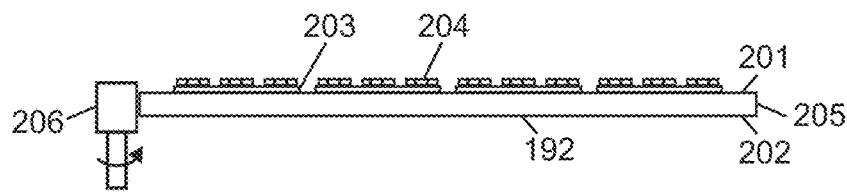
Figure 18K:
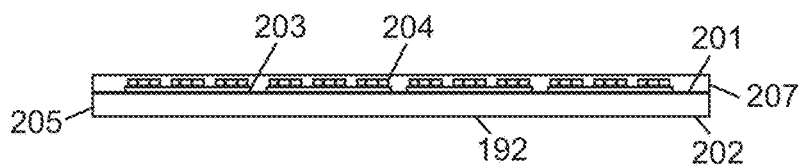
Figure 18L:
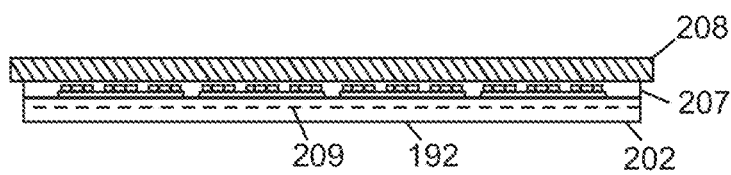
Figure 18M:
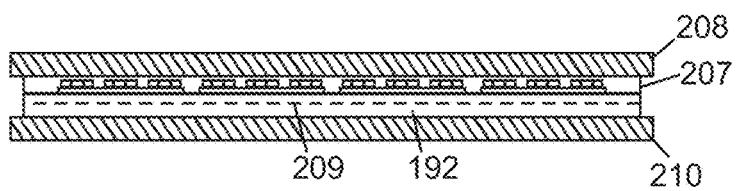
Figure 18N:
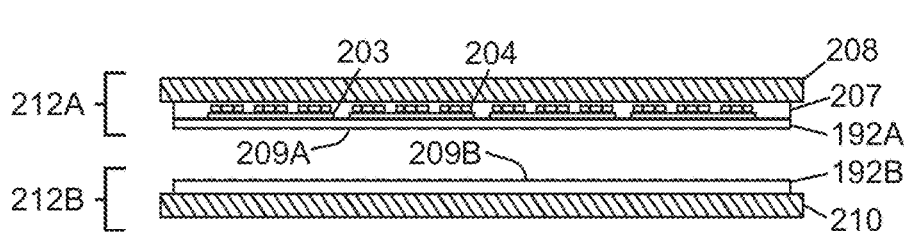
Figure 18O:
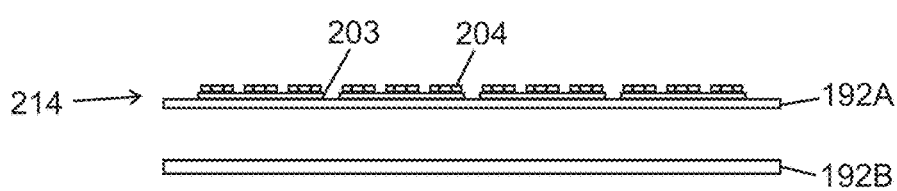

FIGS. 18A-18O are cross-sectional schematic views illustrating steps of a device wafer splitting process, according to which a thick wafer is fractured from a crystalline material, at least one epitaxial layer is grown on the thick wafer, and the thick wafer is fractured to form a first and second bonded assemblies each including a carrier and a thin wafer divided from the thick wafer, with the first bonded assembly including the at least one epitaxial layer as part of an operative semiconductor-based device.

FIG. 18A illustrates a crystalline material substrate 190 having a first surface 191 and subsurface laser damage 193 arranged at a predetermined depth relative to the first surface. FIG. 18B illustrates the substrate 190 of FIG. 18A following addition of adhesive material 194 over the first surface 191. FIG. 18C illustrates the items depicted in FIG. 18B following bonding of a rigid carrier 196 to the substrate 190 using the adhesive material 194. FIG. 18D illustrates the items of FIG. 18D following fracturing of the substrate 190 along the subsurface laser damage 193 (e.g., using one or more methods disclosed herein), yielding a remainder of the substrate 190 that is separated from a bonded assembly that includes the carrier 196, the adhesive material 194, and a crystalline material portion (e.g., a thick wafer) 192 removed from the substrate 190. In certain embodiments, the thick wafer 192 may have a thickness in a range of roughly 350 to 750 microns. Exposed surfaces 193A, 193B of the thick wafer 192 and the remainder of the substrate 190, respectively may exhibit surface irregularities that may be reduced by surface processing steps such as grinding, CMP, polishing, etc. FIG. 18E shows the thick wafer 192 following de-bonding and removal from the carrier 196, with the thick wafer 192 including a perpendicular edge profile. Perpendicular edges of wafers fracture readily, producing unacceptable edge chips and particles during wafer handling. To reduce the risk of breakage, a wafer edge may be edge ground to produce a non-perpendicular wafer edge having a beveled or rounded edge. FIG. 18F shows the thick wafer 192 being supported by a turntable 198 proximate to a rotary profile grinding tool 199 having a concave cutting surface 199A (e.g., impregnated with diamond particles) configured to impart a rounded edge profile 197 to the thick wafer 192. FIG. 18G shows the thick wafer 192 after edge grinding (also known as edge profiling), with the thick wafer including a rounded edge 197 providing a boundary between first and second wafer surfaces 201, 202.

FIG. 18H shows the items of FIG. 18G following deposition of one or more epitaxial layers 203 on or over the first surface 201 of the thick wafer 201. Due to the incompatibility of adhesives with the high temperatures inherent to epitaxy, carrier shown in FIG. 18D is not present. FIG. 18I shows the structure FIG. 18H, following formation of conductive (e.g., metal) contacts 204 over the epitaxial layers 203 to form at least one operative semiconductor device, with the thick wafer 192 still having a rounded edge 197. Conventionally, grinding would be performed on the second surface 202 to thin the thick wafer 192 to an appropriate thickness for the resulting device (e.g., 100 to 200 microns for a Schottky diode or MOSFET). The approach disclosed herein reduced the need for wafer grinding, and instead utilizes laser- and carrier-assisted separation to remove a portion of the thick wafer so that it can be surface finished and used to fabricated another operative semiconductor device.

The inventors have found that presence of the rounded edge 197 on the thick wafer 192 inhibits controlled formation of subsurface laser damage proximate to the edge 197, since the rounded profile negatively affects laser focus and depth control. To address this issue, the rounded edge 197 of the thick wafer 192 may be removed prior to further laser processing. FIG. 18J shows the structure of FIG. 18I being subjected to grinding with an edge grinder 206 to grind away the rounded edge 197 and impart a substantially perpendicular edge 205 extending between the first and second surfaces 201, 202 of the thick wafer 192, with the epitaxial layers 203 and contacts 204 arranged over the first surface 201.

FIG. 18K shows the structure of FIG. 18J following addition of temporary adhesive material 207 over the first surface 201 of the thick wafer 192, the epitaxial layers 203, and the contacts 204, in preparation for receiving and adhering a first carrier. FIG. 18L shows the structure of FIG. 18K following addition of a first carrier 208 over the temporary adhesive material 207, and following formation of subsurface laser damage 209 within the thick wafer 192 by impingement of focused laser emissions through the second surface 202 of the thick wafer 192. FIG. 18M shows the structure of FIG. 18L following bonding of a rigid second carrier 210 to the second surface 202 of the thick wafer 192 proximate to the subsurface laser damage 209. For purposes of separation, the rigid second carrier 210 will serve as a frontside carrier intended to remove a portion (i.e., a layer) of the thick wafer 192.

FIG. 18N shows the items of FIG. 18M following application of at least one fracturing process as disclosed herein to fracture the thick wafer 192 along the subsurface laser damage 209 to yield first and second bonded subassemblies 212A, 212B. The first bonded subassembly 212A includes a first thin wafer portion 192A (separated from the thick wafer 192 of FIG. 18M), the epitaxial layers 203, the contacts 204, the temporary adhesive material, and the first carrier 208. The second bonded subassembly 212B includes a second thin wafer portion 192B (separated from the thick wafer 192 of FIG. 18M) and the second carrier 210. Exposed surfaces 209A, 209B of the thin wafer portions 192A, 192B may exhibit surface irregularities due to laser damage and/or fracturing that may be reduced by conventional surface processing steps (e.g., grinding, CMP, and/or polishing). FIG. 18O shows an operative semiconductor device 214 derived from the first bonded subassembly 212A by removal of the temporary adhesive 207 and the first carrier 208. Such figure also the second thin wafer portion 192B following removal of the second carrier 210, to prepare the second thin wafer portion 192B for further processing (e.g., epitaxial growth).

Exemplary Method Including Re-Use of Carrier Wafers

Figure 19:
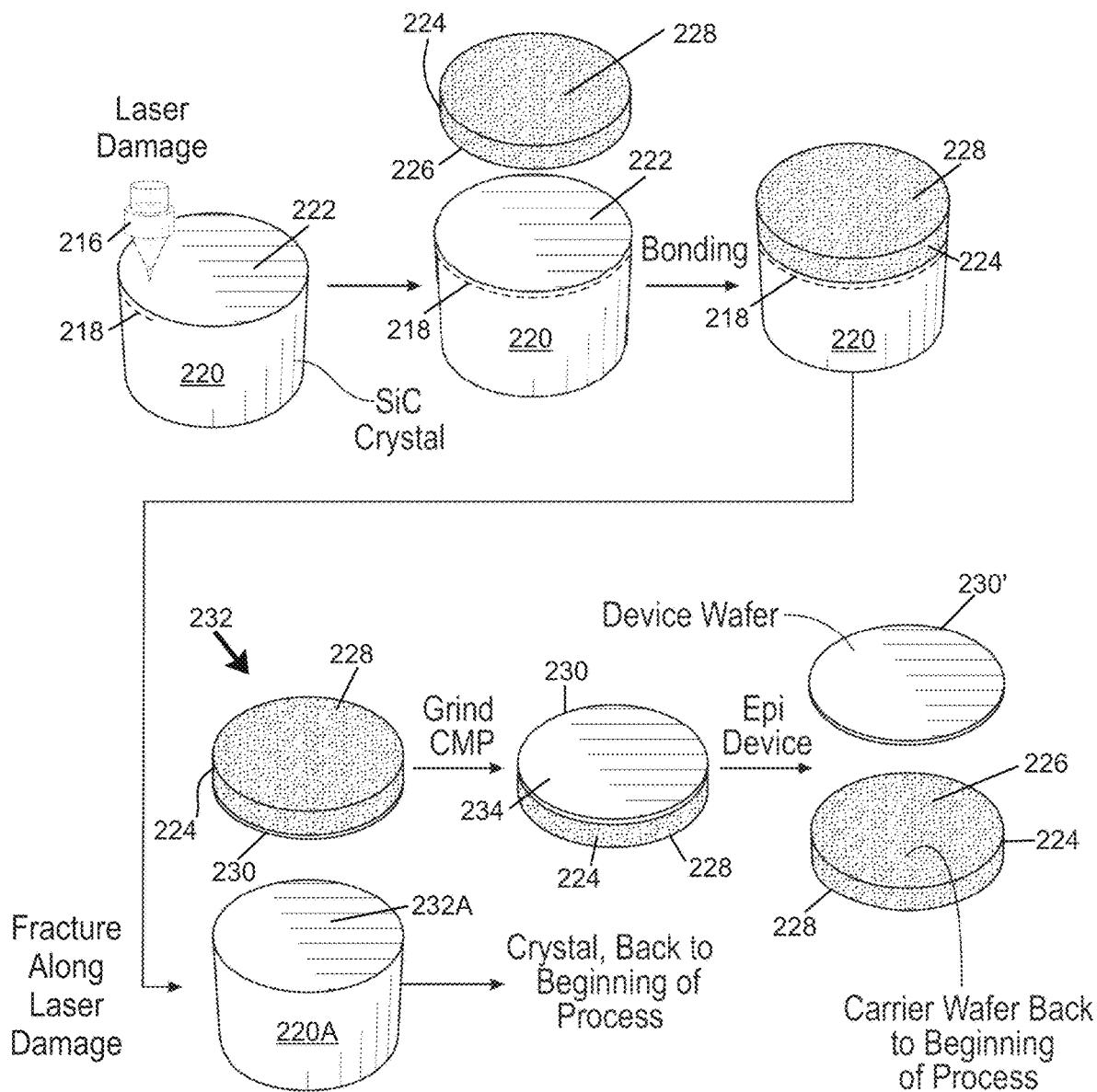
FIG. 19 is a flowchart schematically illustrating steps for producing subsurface laser damage and bonding a rigid carrier to a crystalline (e.g., SiC) material ingot, followed by laser parting of a bonded assembly including the carrier and a portion of the crystalline material, followed by further processing of the bonded assembly and formation of epitaxial layers on a device wafer, with return of the ingot and the rigid carrier to a beginning of the process.

FIG. 19 is a flowchart schematically illustrating steps of a method according to the present disclosure. Starting at upper left, a laser 216 may focus laser emissions below a first surface 222 of a thick crystalline material substrate 220 (e.g., a SiC ingot) to produce a subsurface laser damage region 218. If the substrate 220 is SiC material, then the laser emissions may be impinged through a C-terminated face of the SiC substrate 220. Thereafter, a carrier wafer 224 may be bonded to the first surface 222 of the crystalline material substrate 220, with the carrier wafer 224 including a first surface 226 (proximal to the first surface 222 of the substrate 220) and a second surface 228 that opposes the first surface 226 of the carrier wafer 224. Such bonding between the carrier wafer 224 and the crystalline material substrate 220 may be performed by any method disclosed herein, such as adhesive bonding or anodic bonding. Thereafter, a fracturing process as disclosed herein (e.g., cooling a CTE mismatched carrier, application of ultrasonic energy, and/or application of mechanical force) is applied to fracture the crystalline material 220 along the subsurface laser damage region 218, causing a crystalline material portion 230 bound to the carrier wafer 224 to be separated from a remainder of the crystalline material substrate 220A. A newly exposed surface 232A of the remainder of the crystalline material substrate 220A having residual laser damage is ground smooth and cleaned, and returned to the beginning of the process (at upper left in FIG. 19). Also, a newly exposed surface 234 of the removed crystalline material 230 is ground smooth while attached to the carrier 224. Thereafter, the carrier wafer 224 may be separated from the removed portion of the crystalline material 230, and the crystalline material 230 may be subject to epitaxial growth of one or more layers to form an epitaxial device 230', while the carrier wafer 224 is cleaned and returned to the beginning of the process (at upper left in FIG. 19) to effectuate removal of another relatively thin section of the crystalline material substrate 220.

Figure 20:
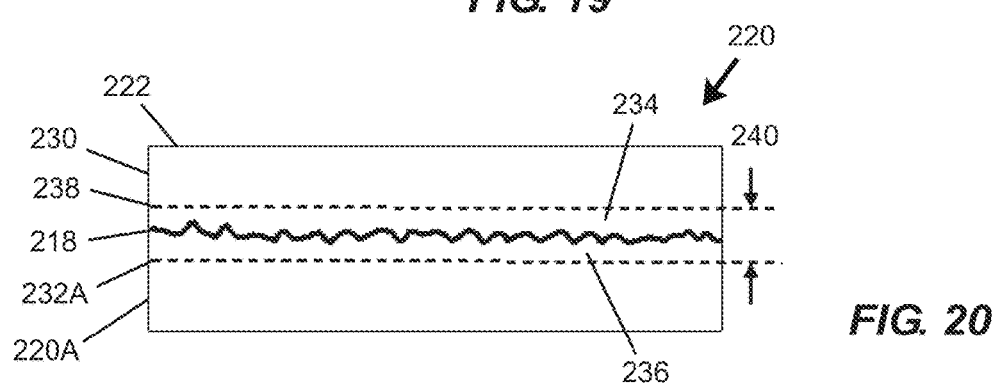
FIG. 20 is a cross-sectional schematic view of a portion of the crystalline material substrate of FIG. 19 showing subsurface laser damage with superimposed dashed lines identifying an anticipated kerf loss material region attributable to laser damage and subsequent surface processing (e.g., grinding and polishing).

FIG. 20 is a cross-sectional schematic view of a portion of the crystalline material substrate (e.g., SiC ingot) 220 of FIG. 19 showing subsurface laser damage 218 with superimposed dashed lines identifying an anticipated kerf loss material region 240. The anticipated kerf loss material region 240 includes laser damage 218, plus material 234 to be mechanically removed (e.g., by grinding and polishing) from a lower face 238 (e.g., Si-terminated face) of the crystalline material portion 230 (e.g., SiC wafer) to be separated from the substrate 220, plus material 236 to be mechanically removed (e.g., by grinding and polishing) from an upper face 232A (e.g., C-terminated) face of the remainder 220A of the substrate 220. The lower face 238 of the crystalline material portion 230 opposes an upper face 222 thereof. In certain embodiments, the entire kerf loss material region may have a thickness in a range of from 80-120 microns for SiC to provide a substrate upper face 232A and a wafer lower face 238 sufficient for further processing.

Material Processing with Multiple Grinding Stations/Steps

In certain embodiments, crystalline material subjected to laser processing and fracturing may be further processed with multiple surface grinding steps to remove subsurface damage and edge grinding to impart a beveled or rounded edge profile, wherein an order of grinding steps is selected and/or a protective surface coating is employed to reduce the likelihood of imparting additional surface damage and to render a crystalline material wafer ready for chemical mechanical planarization. Such steps may be performed, for example, using material processing apparatuses according to embodiments disclosed herein, wherein an exemplary apparatus includes a laser processing station, a fracturing station, multiple coarse grinding stations arranged in parallel downstream of the fracturing station, and at least one fine grinding station arranged downstream of the coarse grinding stations. When processing wafers cut by wire sawing, it is commonplace to perform edge grinding prior to surface grinding or polishing to remove wire-sawing surface damage. However, it has been found by the inventors that edge grinding of substrate portions (e.g., wafers) having laser damage in combination with fracture damage, the likelihood of cracking a substrate portion is increased. While not wishing to be bound by any specific theory as to the reason for this phenomenon, it is believed that exposed cleave planes resulting from surface fracturing renders the surfaces susceptible to cracking if edge grinding is performed prior to at least some surface processing (grinding and/or polishing). For this reason, it has been found to be beneficial to perform at least some surface processing (e.g., grinding and/or polishing) prior to edge grinding.

It has been found that coarse grinding steps (i.e., to remove laser damage and fracture damage along fractured surfaces of a substrate portion and a bulk substrate) tend to require significantly longer to complete than the preceding steps of laser processing and fracturing, and significantly longer than subsequent steps of fine grinding. For that reason, multiple coarse grinding stations are provided in parallel to remove a bottleneck in fabrication of multiple wafers from a bulk crystalline material (e.g., an ingot). In certain embodiments, robotic handlers may be arranged upstream and downstream of the multiple coarse grinding stations to control loading and unloading of substrate portions. In certain embodiments, a carrier bonding station may be provided between a laser processing station and a fracturing station, and a carrier removal station may be provided upstream (either directly or indirectly) of an edge grinding station. A carrier may desirably remain bonded to a substrate portion during at least some surface grinding steps to reduce the potential for breakage, particularly for thin substrate portions (e.g., wafers); however, the carrier is preferably removed prior to edge grinding (or prior to coating wafer with a protective coating preceding edge grinding).

In certain embodiments, a carrier bonding station may use carriers pre-coated with temporary bonding media, align and press the carrier to a substrate surface, and subject the bonding media with the necessary conditions (e.g., heat and pressure) to effectuate bonding between the carrier and the substrate. Alternatively, a carrier bonding station may include a coating station that may be used to coat the carriers or substrates on demand.

Figure 21:
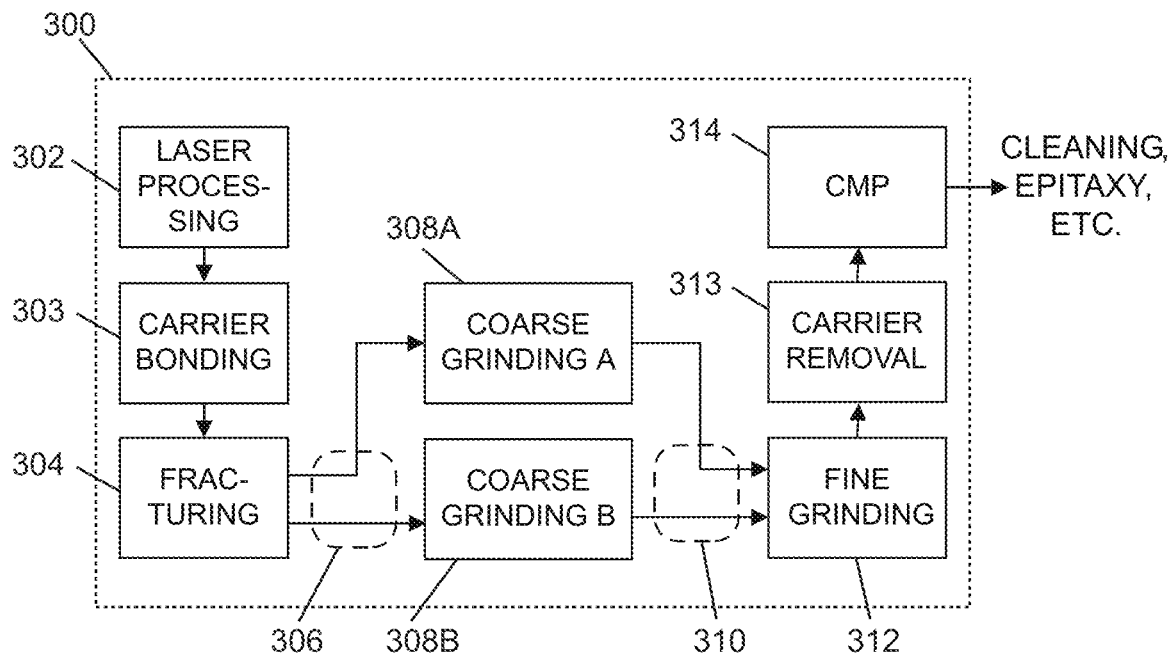
FIG. 21 is a schematic illustration of a material processing apparatus according to one embodiment, including a laser processing station, a material fracturing station, multiple coarse grinding stations arranged in parallel, a fine grinding station, and a CMP station.

FIG. 21 is a schematic illustration of a material processing apparatus 300 according to one embodiment, including a laser processing station 302, a carrier bonding station 303, a material fracturing station 304, multiple coarse grinding stations 308A, 308B arranged in parallel, a fine grinding station 312, a carrier removal station 313, and a CMP station 314. The laser processing station 302 includes at least one laser, and a holder for at least one substrate arranged to receive at least one laser beam for formation of subsurface laser damage in a crystalline material (e.g., an ingot). The carrier bonding station 303 is configured to bond the crystalline material (having subsurface laser damage therein) to at least one rigid carrier. The fracturing station 304 is arranged to receive one or more assemblies (each including a substrate bonded to a rigid carrier) from the carrier bonding station 303, and to fracture the at least one substrate along a subsurface laser damage region to remove a substrate portion (which may resemble a wafer bonded to a carrier). First and second coarse grinding stations 308A, 308B are arranged in parallel downstream of the fracturing station 304, with a first robotic handler 306 provided to alternately deliver substrate portions (as part of bonded assemblies) received from the fracturing station 304 to either the first coarse grinding station 308A or the second coarse grinding station 3048B. Downstream of the first and second coarse grinding stations 308A, 308B, a second robotic handler 310 is provide to deliver coarse ground substrate portions (as part of bonded assemblies) to a fine grinding station 312. A carrier removal station 313 is provided downstream of the fine grinding station 312, and serves to separate ground substrate portions from carriers. A chemical mechanical planarization (CMP) station 314 is arranged downstream of the carrier removal station 313 to prepare substrate portions for further processing, such as cleaning and epitaxial growth. The CMP station 314 functions to remove damage remaining after fine grinding, which itself removes damage remaining after coarse grinding. In certain embodiments, each coarse grinding station 308A, 308B comprises at least one grinding wheel having a grinding surface of less than 5000 grit, and the fine grinding station 312 comprises at least one grinding wheel having a grinding surface of at least 5000 grit. In certain embodiments, each coarse grinding station 308A, 308B is configured to remove a thickness of 20 microns to 100 microns of crystalline material from a crystalline material portion (e.g., wafer), and the fine grinding station 312 is configured to remove a thickness of 3 to 15 microns of crystalline material. In certain embodiments, each coarse grinding station 308A, 308B and/or fine grinding station 312 may include multiple grinding substations, in which different substations comprise grinding wheels of different grits.

An apparatus according to that of FIG. 21 may be modified to accommodate edge grinding to impart a rounded or beveled edge profile of a crystalline substrate portion, such as a wafer. Such an edge profile will reduce the risk of breakage of a wafer edge. The edge grinding may not be performed when a substrate portion is bonded to a carrier; accordingly, a carrier removal station may be arranged upstream (either directly or indirectly) of an edge grinding station.

Figure 22:
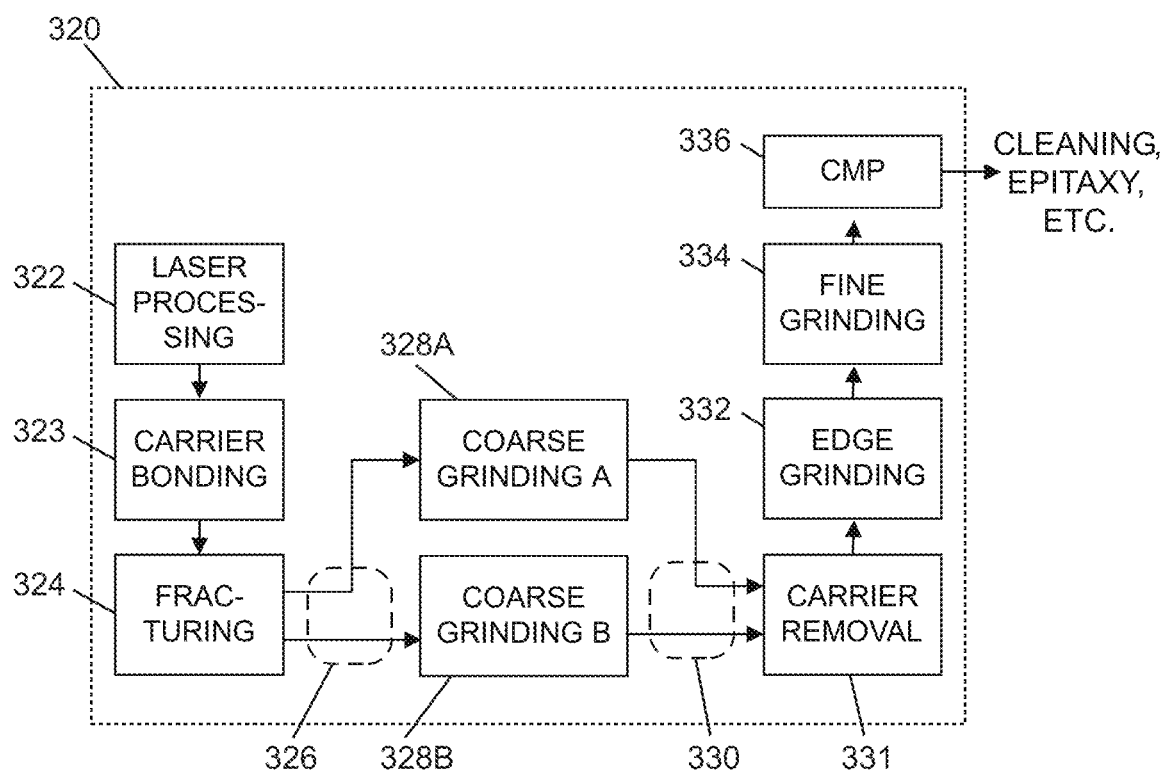
FIG. 22 is a schematic illustration of a material processing apparatus according to one embodiment similar to that of FIG. 21, but with an edge grinding station arranged between the fine grinding station and the coarse grinding stations.

FIG. 22 illustrates a material processing apparatus 320 according to one embodiment similar to that of FIG. 21, but incorporating an edge grinding station 332. The material processing apparatus 320 includes a laser processing station 322, a carrier bonding station 323, a material fracturing station 324, a first robotic handler 326, multiple coarse grinding stations 328A, 328B arranged in parallel, a second robotic handler 328, a carrier removal station 331, an edge grinding station 332, a fine grinding station 334, and a CMP station 336. An exemplary edge grinding station 332 may be arranged to grip a wafer between upper and lower gripping portions of a turntable arranged proximate to a rotary grinding tool having a concave during surface (e.g., such as illustrated in FIG. 18F). Gripping of a wafer in this manner may undesirably impart damage to a wafer surface (e.g., a Si-terminated surface of a SiC wafer). For this reason, the edge grinding station 332 shown in FIG. 22 is arranged upstream of the fine grinding station 334, to permit any surface damage imparted by the edge grinding station 332 to be removed in the fine grinding station 334. Although the fine grinding station 334 may remove a small degree of thickness of a wafer, thereby altering a rounded or beveled edge profile produced by the edge grinding station 332, a sufficient degree of a rounded or beveled edge profile will remain to inhibit fracture of a wafer edge.

The apparatus 320 according to FIG. 22 may be used to perform a method for processing a crystalline material wafer comprising a first surface having surface damage thereon, with the first surface being bounded by an edge. The method comprises grinding the first surface with at least one first grinding apparatus to remove a first part of the surface damage; following the grinding of the first surface with the at least one first grinding apparatus, edge grinding the edge to form a beveled or rounded edge profile; and following the edge grinding, grinding the first surface with at least one second grinding apparatus to remove a second part of the surface damage sufficient to render the first surface suitable for further processing by chemical mechanical planarization. In certain embodiments, the first grinding apparatus may be embodied in the coarse grinding stations 328A, 328B, the edge grinding may be performed by the edge grinding station 332, and the second grinding apparatus may be embodied in the find grinding station 312. In certain embodiments, a carrier removal step may be performed following the grinding of the first surface with the at least one first grinding apparatus, and prior to edge grinding the edge to form the beveled or rounded edge profile.

In certain embodiments, a protective surface coating may be employed to reduce the likelihood of imparting additional surface damage during edge grinding and to render a crystalline material wafer ready for chemical mechanical planarization. Such a surface coating may include photoresist or any other suitable coating material, may be applied prior to edge grinding, and may be removed after edge grinding.

FIG. 23 is a schematic illustration of a material processing apparatus 340 according to one embodiment similar to that of FIG. 21, but incorporating a surface coating station 354 between a fine grinding station 352 and an edge grinding station 356, and incorporating a coating removal station 358 between the edge grinding station 356 and a CMP station 360. The material processing apparatus 340 further includes a laser processing station 342, a material fracturing station 344, a first robotic handler 346, multiple coarse grinding stations 348A, 348B arranged in parallel, and a second robotic handler 348 upstream of the fine grinding station 352. The coating station 354 may be configured to apply a protective coating (e.g., photoresist) by a method such as spin coating, dip coating, spray coating, or the like. The protective coating should be of sufficient thickness and robustness to absorb any damage that may be imparted by the edge grinding station 365. For a SiC wafer, the Si-terminated surface may be coated with the protective coating, since the Si-terminated surface is typically the surface on which epitaxial growth is performed. The coating removal station 358 may be configured to strip the coating by chemical, thermal, and/or mechanical means.

The apparatus 340 according to FIG. 23 may be used to perform a method for processing a crystalline material wafer comprising a first surface having surface damage thereon, with the first surface being bounded by an edge. The method comprises grinding the first surface with at least one first grinding apparatus (e.g., the coarse grinding stations 348A, 348B) to remove a first part of the surface damage; thereafter grinding the first surface with at least one second grinding apparatus (e.g., the fine grinding station 352) to remove a second part of the surface damage sufficient to render the first surface suitable for further processing by chemical mechanical planarization; thereafter forming a protective coating on the first surface (e.g., using the surface coating station 354); thereafter edge grinding the edge to form a beveled or rounded edge profile (e.g., using the edge grinding station 356); and thereafter removing the protective coating from the first surface (e.g., using the coating removal station). The first surface may thereafter be processed by chemical mechanical planarization (e.g., by the CMP station 360), thereby rendering the first surface (e.g., a Si terminated surface of the wafer) ready for subsequent processing, such as surface cleaning and epitaxial growth.

In certain embodiments, a gripping apparatus may be configured for holding an ingot having end faces that are non-perpendicular to a sidewall thereof to permit an end face to be processed with a laser for formation of subsurface damage. In certain embodiments, gripping effectors may conform to a sloped sidewall having a round cross-section when viewed from above. In certain embodiments, gripping effectors may include joints to permit gripping effectors to conform to the sloped sidewall.

FIG. 24A is a schematic side cross-sectional view of a first gripping apparatus 362 for holding an ingot 364 having end faces 366, 368 that are non-perpendicular to a sidewall 370 thereof, according to one embodiment. The upper end face 366 is horizontally arranged to receive a laser beam 376. The lower end face 368 may have a carrier 372 attached thereto, with a chuck 374 (e.g., a vacuum chuck) retaining the carrier 372. Gripping effectors 378 having non-vertical faces are provided to grip sidewalls 370 of the ingot 364, wherein the gripping effectors 378 are arranged at non-perpendicular angles A1, A2 relative to horizontal actuating rods 380. Holding the ingot 364 as shown (e.g., proximate to a bottom portion thereof) using the gripping apparatus 362 leaves the upper end face 366 and upper portions of the sidewall 370 available for processing using methods disclosed herein.

FIG. 24B is a schematic side cross-sectional view of a second gripping apparatus 362' for holding an ingot 364' having end faces 366', 368' that are non-perpendicular to a sidewall 370' thereof, according to one embodiment. The upper end face 366' is horizontally arranged to receive a laser beam 376, whereas the lower end face 368' may have a carrier 372' attached thereto, with the carrier 372' retained by a chuck 374'. Gripping effectors 378' having non-vertical faces are provided to grip sidewalls 370' of the ingot 364', wherein the gripping effectors 378' are arranged at non-perpendicular angles A1, A2 relative to horizontal actuating rods 380'. Pivotable joints 382' are provided between the actuating rods 380' and the gripping effectors 378', thereby facilitating automatic alignment between the gripping effectors 378' and sidewalls 370' of the ingot 364'.

Figure 26:
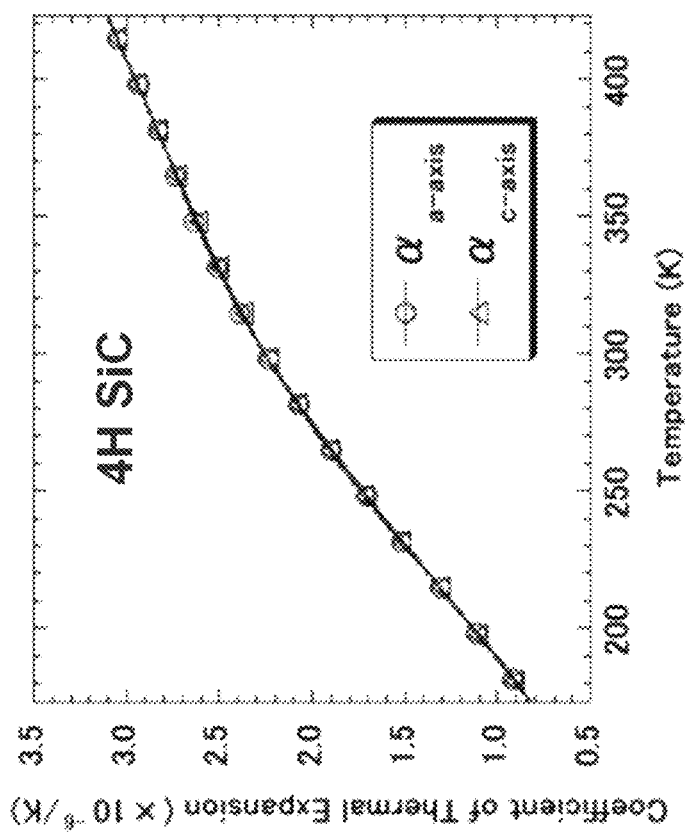
FIG. 26 is a line chart plotting coefficient of linear thermal expansion as a function of temperature for SiC.
Figure 25:
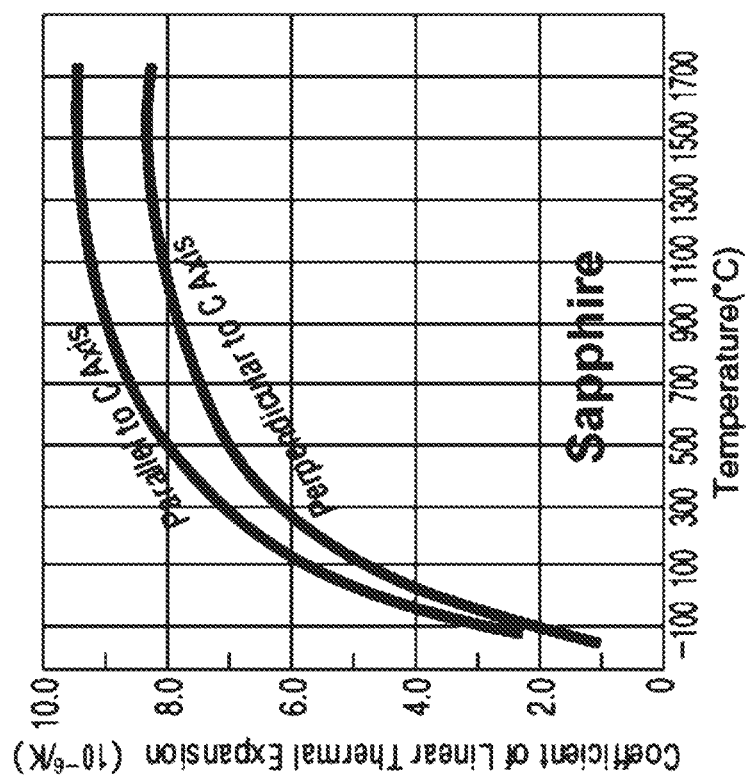
FIG. 25 is a line chart plotting coefficient of linear thermal expansion as a function of temperature for sapphire.

FIG. 25 is a line chart plotting coefficient of linear thermal expansion as a function of temperature for sapphire, with superimposed plots for CTE parallel to the sapphire C-axis and for CTE perpendicular to the sapphire C-axis. FIG. 26 is a line chart plotting coefficient of linear thermal expansion as a function of temperature for SiC, with superimposed plots for CTE along the SiC c-axis and the SiC a-axis. Comparing FIGS. 25 and 26, sapphire (in FIG. 25) exhibits more variation in CTE between axes than SiC. It can also be seen that sapphire has a larger CTE than SiC over a wide range of temperature.

Figure 27:
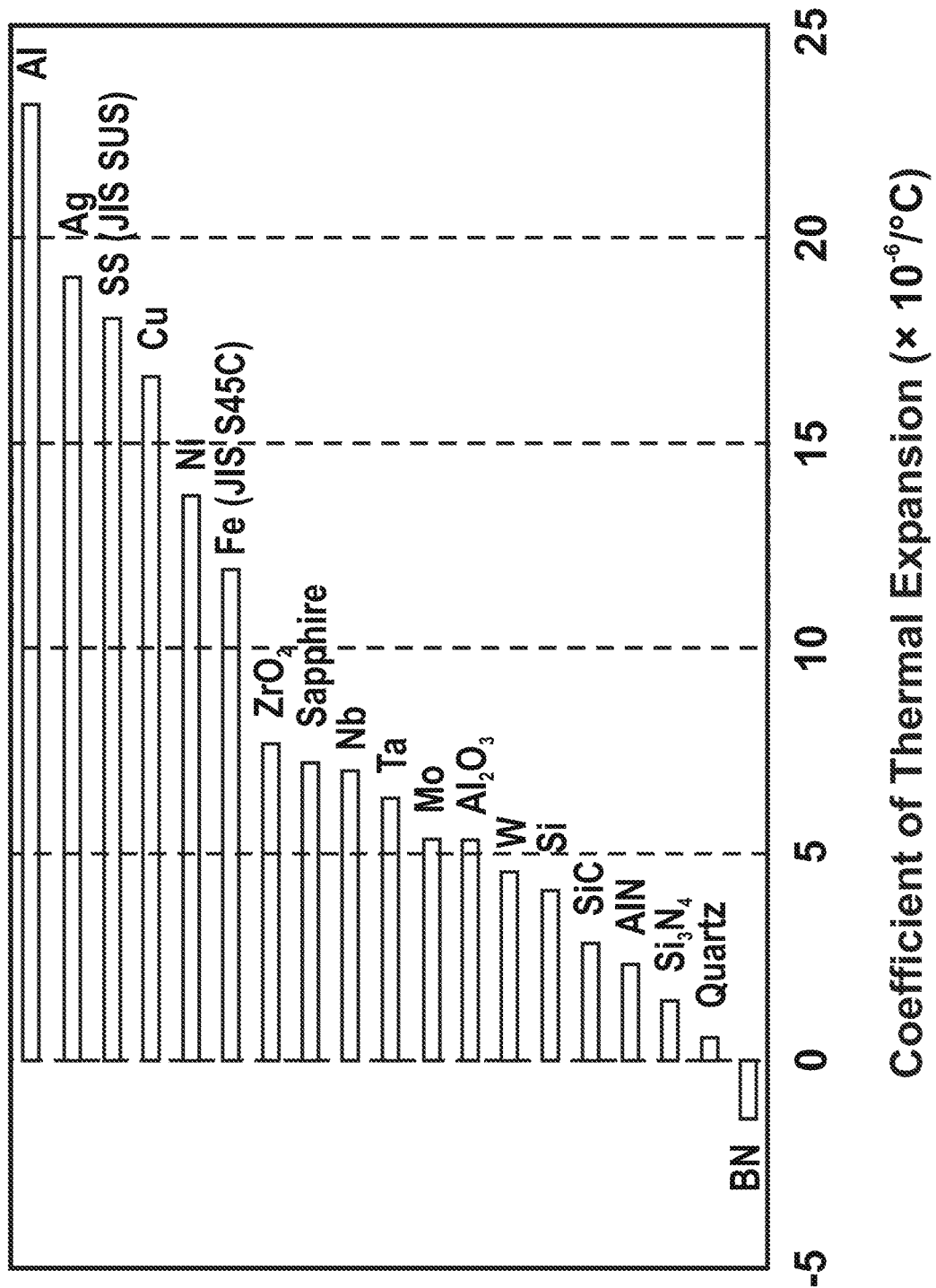
FIG. 27 is a bar chart providing a comparison of coefficients of linear thermal expansion for various crystalline materials and metals.

FIG. 27 is a bar chart providing a comparison of coefficients of linear thermal expansion for various crystalline materials and metals, believed to be established at 25° C. It can be seen that SiC has a CTE of about 3, whereas sapphire has a CTE of about 7 (about 2.3 times greater). Although not shown in FIG. 27, it has been separately established that the CTE of PDMS polymer is $3.0 \times 10^{-4}$/C over a temperature range of from −55 to 150° C. Such value is two orders of magnitude greater than the roughly $7.0 \times 10^{-6}$/C CTE value for sapphire shown in FIG. 27.

Figure 28:
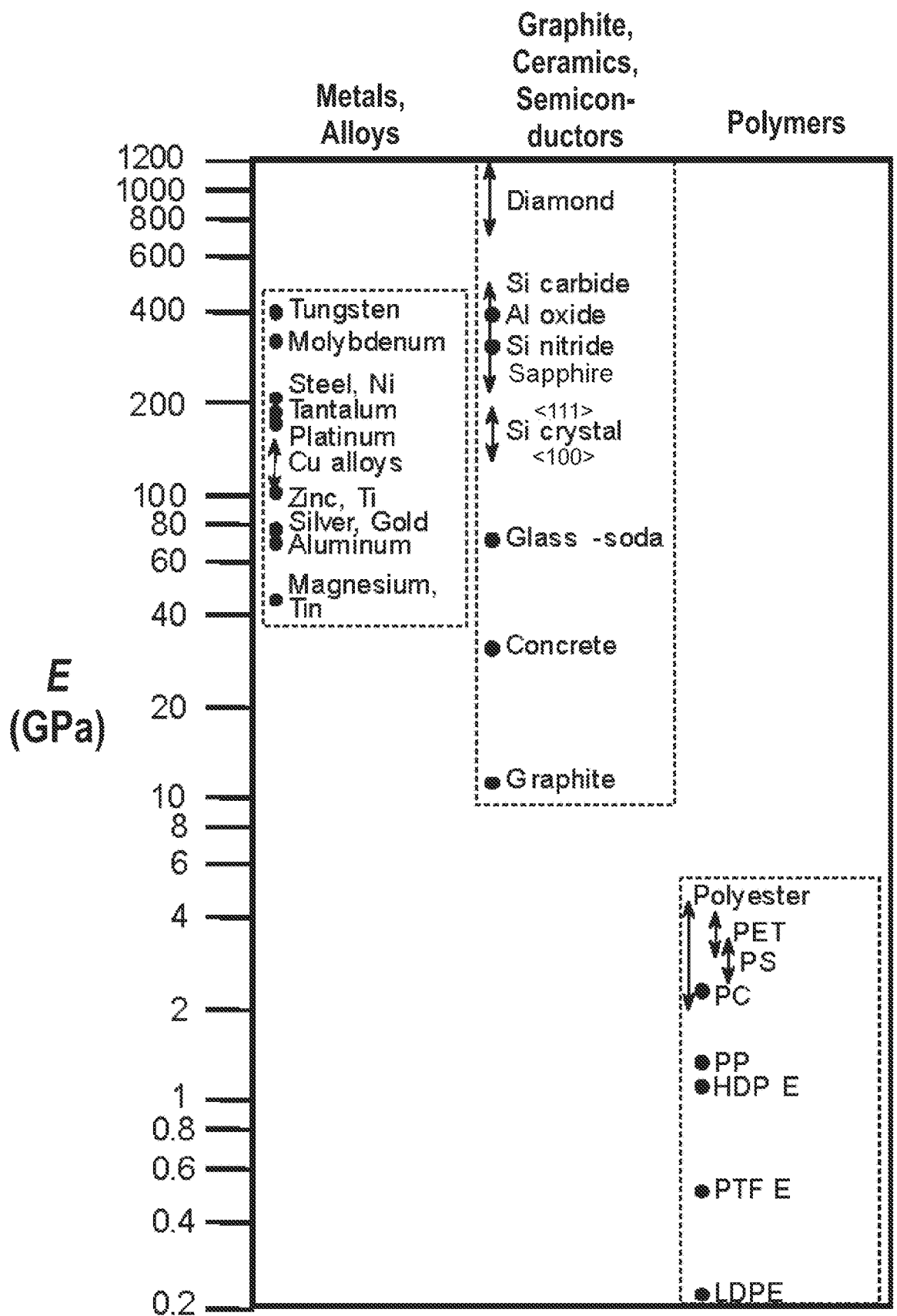
FIG. 28 is a diagram plotting modulus of elasticity (Young's modulus) values for various materials segregated into three groups: (1) metals and alloys; (2) graphite, ceramics, and semiconductors; and (3) polymers.

FIG. 28 is a diagram plotting modulus of elasticity (Young's modulus) values for various materials segregated into three groups: (1) metals and alloys; (2) graphite, ceramics, and semiconductors; and (3) polymers. The modulus of elasticity is a mechanical property that measures the stiffness of a solid material, defining the relationship between stress and strain of a material in the linear elasticity regime of a uniaxial deformation. As can be seen in FIG. 28, metals and semiconductors exhibit modulus of elasticity values of at least one order of magnitude greater than such values for polymers. Although exact values are not displayed in FIG. 28, it has been separately established that the modulus of elasticity of sapphire is 345 GPa, whereas the nickel has an elastic modules of 190 GPa. In contrast, the polymer PDMS has an elastic modulus range of between 0.57 MPa and 3.7 MPa, with such variation being linearly dependent on the amount of crosslinker present in the polymer.

The following examples disclose further non-limiting embodiments of the disclosure.

Example 1

A 640 μm thickness, 150 mm diameter single crystal SiC substrate is used as a starting material. A 10 μm thickness SiC epitaxial layer is grown on a first face of the SiC substrate, providing a 650 μm SiC structure. Laser emissions are focused to a depth of 240 μm from the SiC surface to yield a plurality of substantially parallel subsurface laser damage lines at that depth. A single crystal sapphire carrier is adhered to an opposing second face of the SiC substrate using WaferBOND® HT-10.10 thermoplastic adhesive (Brewer Science, Inc., Rolla, Mo., USA) and a thermocompression process (involving application of 1800 N force and maintenance of 180° C.) is applied until adhesive curing is complete. Thermal-induced fracture is performed by contacting the sapphire carrier with a liquid nitrogen cooled vacuum chuck maintained at −70° C. The fracture yields a 240 μm thickness portion of SiC bound to the sapphire carrier (forming a bonded assembly), separate from a 410 μm thickness portion of SiC. Residual laser damage on the 410 μm thickness portion of SiC is removed by lapping and CMP to a yield a 350 μm thickness SiC wafer that is ready for epitaxy. Separately, the bonded assembly that includes 240 μm thickness SiC is also subjected to lapping and CMP, whereby the SiC is reduced to 180 μm thickness. The bonded assembly is thereafter subjected to carrier removal, including contacting the carrier with a heated vacuum chuck to cause the adhesive to soften while lateral force is applied to the SiC according to a thermal slide-off process. The obtained 180 μm thickness SiC wafer already having a SiC epitaxial layer is suitable for MOSFET fabrication. The result of the process is formation of a 350 μm thickness SiC wafer that is ready for epitaxy, as well as a 180 μm thickness SiC wafer already having a SiC epitaxial layer thereon, from a 640 micron thickness SiC substrate used as a starting material.

Example 2

A 570 μm thickness, 150 mm diameter single crystal SiC substrate is used as a starting material. A 2 μm thickness SiC epitaxial layer is grown on a first face of the SiC substrate, providing a 572 μm SiC structure. Laser emissions are focused to a depth of 160 μm from the SiC surface to yield a plurality of substantially parallel subsurface laser damage lines at that depth. A single crystal sapphire carrier is adhered to an opposing second face of the SiC substrate using the same adhesive process as in Example 1. Thermal-induced fracture is performed by contacting the sapphire carrier with a liquid nitrogen cooled vacuum chuck maintained at −70° C. The fracture yields a 160 μm thickness portion of SiC bound to the sapphire carrier (forming a bonded assembly), separate from a 412 μm thickness portion of SiC. Residual laser damage on the 412 μm thickness portion of SiC is removed by lapping and CMP to a yield a 350 μm thickness SiC wafer that is ready for epitaxy. Separately, the bonded assembly that includes 160 μm thickness SiC is also subjected to lapping and CMP, whereby the SiC is reduced to 100 μm thickness. The bonded assembly is thereafter subjected to carrier removal, including contacting the carrier with a heated vacuum chuck to cause the adhesive to soften while lateral force is applied to the SiC according to a thermal slide-off process. The obtained 100 μm thickness SiC wafer already having a SiC epitaxial layer is suitable for RF device fabrication. The result of the process is formation of a 350 μm thickness SiC wafer that is ready for epitaxy, as well as a 100 μm thickness SiC wafer already having a SiC epitaxial layer thereon, from a 570 micron thickness SiC substrate used as a starting material.

Example 3

A 150 mm diameter single crystal SiC substrate (ingot) having a thickness of more than 10 mm is used as a starting material for production of a SiC wafer having a thickness of 355 microns. Laser emissions are impinged through a C-terminated upper face of the SiC substrate to form subsurface laser damage. A sapphire carrier is bonded to the upper face of the SiC substrate using a thermoplastic adhesive material disclosed herein, and thermal-induced fracture is performed to separate an upper (wafer) portion of SiC from a remainder of the ingot. Both the Si-terminated face of the separated wafer portion and the C-terminated face of the ingot remainder are coarse ground using a 2000 grit grind wheel (e.g., a metal, vitreous, or resin bond-type grinding wheel) to removal all visible laser and fracture damage. Thereafter, both the Si-terminated face of the separated wafer portion and the C-terminated face of the ingot remainder are fine ground (e.g., using a vitreous grinding surface) with a 7000 or higher grit (e.g., up to 30,000 grit or higher) to yield smoother surfaces, preferably less than 4 nm average roughness ($R_a$), more preferably in a range of 1-2 nm $R_a$. On the ingot remainder, a smooth surface is required to avoid any impact on the subsequent laser processing. The wafer is to be CMP ready and of sufficient smoothness to minimize required CMP removal amounts, since CMP is typically a higher cost process. Typical material removal during fine grind processing may be in a thickness range of 5 to 10 microns to remove all residual subsurface damage from the coarse grind and any remaining laser damage (both visible and non-visible to the naked eye). Thereafter, the ingot remainder is returned to a laser for further processing, and the wafer is edge ground and subjected to chemical mechanical planarization (CMP) to be ready for epitaxial growth. Edge grinding may be performed between coarse and fine surface grinding to avoid any risk of scratching the fine ground Si face. Material removal during CMP may be in a thickness range of about 2 microns. Total material consumed from the substrate (ingot) may be less than 475 microns. Given the 355 micron final wafer thickness, the kerf loss is less than 120 microns.

Technical benefits that may be obtained by one or more embodiments of the disclosure may include: reduced crystalline material kerf losses compared to wire sawing; reduced processing time and increased throughput of crystalline material wafers and resulting devices compared to wire sawing; reduced bowing of resulting semiconductor wafers compared to conventional post-laser fracturing methods; reduced need for consumable liquid nitrogen compared to conventional post-laser fracturing methods; and enhanced ability to derive thin layers of crystalline with reduced need for thinning by abrasive material removal (e.g., grinding).

Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A crystalline material processing method comprising:
temporarily bonding a rigid carrier having a thickness of greater than 800 microns to a first surface of a crystalline material comprising a semiconductor with an intervening adhesive material, wherein the crystalline material comprises a substrate having a subsurface laser damage region at a depth relative to the first surface, the rigid carrier has a modulus of elasticity of at least 20 GPa, and the adhesive material has a glass transition temperature $T_g$ of greater than 25° C.; and
fracturing the crystalline material along or proximate to the subsurface laser damage region to yield a bonded assembly comprising the rigid carrier, the adhesive material, and a portion of the crystalline material removed from the substrate, wherein in the bonded assembly, the portion of the crystalline material removed from the substrate comprises a thickness of at least 160 µm.

2. The crystalline material processing method of claim 1, wherein the adhesive material comprises a thermoplastic material.

3. The crystalline material processing method of claim 1, wherein the adhesive material has a glass transition temperature $T_g$ of at least 35° C.

4. The crystalline material processing method of claim 1, wherein the adhesive material has a Shore D durometer value of at least 70 when the adhesive material is at 25° C.

5. The crystalline material processing method of claim 1, wherein the adhesive material has a modulus of elasticity of at least 7 MPa when the adhesive material is at 25° C.

6. The crystalline material processing method of claim 1, wherein the adhesive material has a thickness of less than 50 microns.

7. The crystalline material processing method of claim 1, wherein:
the rigid carrier comprises a first face and a second face that opposes the first face;
the adhesive material is arranged in contact with the first face; and
the second face is devoid of any adhesive material and devoid of any stress-producing material.

8. The crystalline material processing method of claim 1, wherein the rigid carrier comprises a crystalline material.

9. The crystalline material processing method of claim 1, wherein a coefficient of thermal expansion (CTE) of the rigid carrier is greater than a CTE of the substrate at 25° C., and wherein the fracturing comprises cooling at least the rigid carrier to promote fracture of the crystalline material along or proximate to the subsurface laser damage region.

10. The crystalline material processing method of claim 1, wherein the fracturing comprises application of ultrasonic energy to at least one of the rigid carrier or the substrate.

11. The crystalline material processing method of claim 1, wherein at least one of a maximum length or maximum width of at least a portion of the rigid carrier exceeds a corresponding maximum length or maximum width of the substrate, the fracturing comprises applying a mechanical force proximate to at least one edge of the rigid carrier, and the mechanical force is configured to impart a bending moment in at least a portion of the rigid carrier.

12. The crystalline material processing method of claim 1, further comprising performing at least one additional processing step on the portion of the crystalline material while the portion of the crystalline material remains part of the bonded assembly.

13. The crystalline material processing method of claim 1, further comprising bonding an additional rigid carrier having a modulus of elasticity of at least 20 GPa to a second surface of the crystalline material that opposes the first surface, prior to said fracturing.

14. The crystalline material processing method of claim 1, wherein the crystalline material comprises SiC.

15. The crystalline material processing method of claim 1, further comprising roughening, texturing, and/or etching at least one of (i) the first surface of the crystalline material or (ii) an adjacent surface of the rigid carrier prior to the temporarily bonding of the rigid carrier to the first surface of a crystalline material with the adhesive material.

16. The crystalline material processing method of claim 1, wherein the portion of the crystalline material removed from the substrate comprises a free-standing wafer configured for growth of at least one epitaxial layer thereon.

17. The crystalline material processing method of claim 1, wherein the portion of the crystalline material removed from the substrate comprises a device wafer including at least one epitaxial layer grown thereon.

18. A crystalline material processing method comprising:
bonding a first crystalline carrier to a first surface of a crystalline material comprising a semiconductor, wherein the crystalline material comprises a substrate having a subsurface laser damage region at a depth relative to a first surface of the substrate;
bonding a second crystalline carrier to a second surface of the crystalline material; and
following the bonding steps, fracturing the crystalline material along or proximate to the subsurface laser damage region to yield a bonded assembly comprising the first crystalline carrier and a portion of the crystalline material removed from the substrate, wherein in the bonded assembly, the portion of the crystalline material removed from the substrate comprises a thickness of at least 160 µm.

19. The crystalline material processing method of claim 18, wherein at least one of the bonding of the first crystalline carrier to the first surface of the crystalline material or the bonding of the second crystalline carrier to the second surface of the crystalline material comprises anodic bonding.

20. The crystalline material processing method of claim 18, wherein at least one of the bonding of the first crystalline carrier to the first surface of the crystalline material or the bonding of the second crystalline carrier to the second surface of the crystalline material comprises adhesive bonding utilizing an adhesive material.

21. The crystalline material processing method of claim 20, wherein:
the first crystalline carrier comprises a first face and a second face that opposes the first face;
the adhesive material is arranged in contact with the first face; and
the second face is devoid of any adhesive material and devoid of any stress-producing material.

22. The crystalline material processing method of claim 20, wherein the adhesive material comprises at least one of the following characteristics (a) to (c): (a) the adhesive material comprises a thermoplastic material; (b) the adhesive material has a Shore D durometer value of at least 70 when the adhesive material is at 25° C., or (c) the adhesive material has a modulus of elasticity of at least 7 MPa when the adhesive material is at 25° C.

23. A crystalline material processing method comprising:
bonding a rigid carrier to a first surface of a crystalline material comprising a semiconductor, wherein the crystalline material comprises a substrate having a subsurface laser damage region at a depth relative to the first surface, the rigid carrier comprises a thickness of greater than 850 microns and has a modulus of elasticity of at least 20 GPa, and the rigid carrier comprises a crystalline carrier; and
fracturing the crystalline material along or proximate to the subsurface laser damage region to yield a bonded assembly comprising the rigid carrier and a portion of the crystalline material removed from the substrate, wherein in the bonded assembly, the portion of the crystalline material removed from the substrate comprises a thickness of at least 160 µm.

24. The crystalline material processing method of claim 23, wherein the bonding of the rigid carrier to the crystalline material comprises adhesive bonding utilizing an adhesive material arranged between the rigid carrier and the crystalline material.

25. The crystalline material processing method of claim 24, wherein the adhesive material comprises at least one of the following characteristics (a) to (d): (a) the adhesive material has a glass transition temperature $T_g$ of greater than 25° C.; (b) the adhesive material has a Shore D durometer value of at least 70 when the adhesive material is at 25° C.; (c) the adhesive material has a modulus of elasticity of at least 7 MPa when the adhesive material is at 25° C., or (d) the adhesive material comprises a thermoplastic material.

26. The crystalline material processing method of claim 23, further comprising performing at least one additional processing step on the portion of the crystalline material while the portion of the crystalline material remains part of the bonded assembly.

27. The crystalline material processing method of claim 23, further comprising bonding an additional rigid carrier having a modulus of elasticity of at least 20 GPa to a second surface of the crystalline material that opposes the first surface, prior to said fracturing.

28. A crystalline material processing method comprising:
bonding a rigid carrier to a first surface of a crystalline material comprising a semiconductor, wherein the crystalline material comprises a substrate having a subsurface laser damage region at a depth relative to the first surface, the rigid carrier has a modulus of elasticity of at least 20 GPa, and a coefficient of thermal expansion (CTE) of the rigid carrier is different than the CTE of the substrate at 25° C. to provide a CTE mismatch between the rigid carrier and the substrate; and
fracturing the crystalline material along or proximate to the subsurface laser damage region due to forces created by the CTE mismatch between the rigid carrier and the substrate, to yield a bonded assembly comprising the rigid carrier and a portion of the crystalline material removed from the substrate, wherein in the bonded assembly, the portion of the crystalline material removed from the substrate comprises a thickness of at least 160 µm.

29. The crystalline material processing method of claim 28, wherein:
the rigid carrier comprises a first face and a second face that opposes the first face;
the first face is proximate to the first surface of the crystalline material; and
the second face is devoid of any stress-producing material.

30. The crystalline material processing method of claim 1, wherein in the bonded assembly, the portion of the crystalline material removed from the substrate comprises a thickness of at least 240 µm.

* * * * *